United States Patent
Huber et al.

(10) Patent No.: US 9,905,993 B2
(45) Date of Patent: *Feb. 27, 2018

(54) WAVELENGTH SELECTIVE EXTERNAL RESONATOR AND BEAM COMBINING SYSTEM FOR DENSE WAVELENGTH BEAM COMBINING LASER

(71) Applicant: TRUMPF Laser GmbH, Schramberg (DE)

(72) Inventors: Rudolf Huber, Aldingen-Aixheim (DE); Hagen Zimer, Schramberg-Schoenbronn (DE); Alexander Killi, Trossingen (DE); Christoph Tillkorn, Villingendorf (DE); Steffen Ried, Herrenberg (DE)

(73) Assignee: TRUMPF LASER GMBH, Schramberg (DE)

( * ) Notice: Subject to any disclaimer, the term of this patent is extended or adjusted under 35 U.S.C. 154(b) by 78 days.

This patent is subject to a terminal disclaimer.

(21) Appl. No.: 15/054,164

(22) Filed: Feb. 26, 2016

(65) Prior Publication Data

US 2016/0204570 A1    Jul. 14, 2016

Related U.S. Application Data

(63) Continuation of application No. 14/087,985, filed on Nov. 22, 2013, now Pat. No. 9,306,369.

(51) Int. Cl.
*H01S 5/40* (2006.01)
*H01S 3/13* (2006.01)
(Continued)

(52) U.S. Cl.
CPC ............ *H01S 3/13* (2013.01); *G02B 27/1006* (2013.01); *H01S 5/141* (2013.01); *H01S 5/4012* (2013.01); *H01S 5/4062* (2013.01); *H01S 5/4087* (2013.01)

(58) Field of Classification Search
CPC ...... H01S 3/13; H01S 5/4087; G02B 27/1006
(Continued)

(56) References Cited

U.S. PATENT DOCUMENTS

| 5,052,013 A | 9/1991 | Putnam |
| 5,351,262 A | 9/1994 | Poguntke et al. |

(Continued)

FOREIGN PATENT DOCUMENTS

| JP | 574007 A | 1/1982 |
| WO | WO 2012058683 A2 | 5/2012 |
| WO | WO 2013123256 A1 | 8/2013 |

OTHER PUBLICATIONS

D.J. Binks, D.K. Ko, L.A.W. Gloster, T.A. King, "Pulsed single mode laser oscillation in a new coupled cavity design", Optics Communications 146, Jan. 1, 1998, 173-176, N.H. Elsevier, Manchester, UK.

(Continued)

*Primary Examiner* — Tuan Nguyen
(74) *Attorney, Agent, or Firm* — Leydig, Voit & Mayer, Ltd.

(57) ABSTRACT

Wavelength-selective external resonators can be used to greatly increase the output brightness of dense wavelength beam combining (DWBC) system beams by stabilizing the wavelengths of the beams emitted by the individual emitters of the DWBC laser source. The present invention pertains to external resonant cavities that utilize thin-film filtering elements as wavelength-selective elements in external resonators. The present invention further pertains to particular embodiments that utilize thin-film filtering elements in DWBC systems as both output beam coupling elements and wavelength selective elements. The present invention provides advantages over the prior art that include decreased (Continued)

cost, increased fidelity of wavelength selection, and increased wall plug efficiency.

16 Claims, 36 Drawing Sheets

(51) Int. Cl.
*H01S 5/14* (2006.01)
*G02B 27/10* (2006.01)

(58) Field of Classification Search
USPC .......................................................... 372/82
See application file for complete search history.

(56) References Cited

U.S. PATENT DOCUMENTS

| | | | |
|---|---|---|---|
| 5,949,804 A | 9/1999 | Okazaki | |
| 6,192,062 B1 | 2/2001 | Sanchez-Rubio et al. | |
| 6,208,679 B1 | 3/2001 | Sanchez-Rubio et al. | |
| 6,327,292 B1 | 12/2001 | Sanchez-Rubio et al. | |
| 6,507,597 B1 | 1/2003 | Graindorge et al. | |
| 6,665,471 B1 | 12/2003 | Farmer et al. | |
| 7,065,107 B2 | 6/2006 | Hamilton et al. | |
| 8,049,966 B2 | 11/2011 | Chann et al. | |
| 8,488,245 B1 | 7/2013 | Chann et al. | |
| 8,531,772 B2 | 9/2013 | Chann et al. | |
| 8,553,327 B2 | 10/2013 | Chann et al. | |
| 2003/0174939 A1 | 9/2003 | Moon et al. | |
| 2003/0231688 A1* | 12/2003 | Takabayashi | G02B 6/2746 372/92 |
| 2005/0095009 A1 | 5/2005 | Powell et al. | |
| 2005/0175047 A1 | 8/2005 | Cheng et al. | |
| 2006/0268241 A1 | 11/2006 | Watson et al. | |
| 2006/0280219 A1* | 12/2006 | Shchegrov | G03B 21/204 372/99 |
| 2007/0229939 A1 | 10/2007 | Brown et al. | |
| 2010/0315631 A1 | 12/2010 | Zhou et al. | |
| 2011/0026417 A1 | 2/2011 | Kishiyama et al. | |
| 2011/0216792 A1 | 9/2011 | Chann et al. | |
| 2011/0222574 A1 | 9/2011 | Chann et al. | |
| 2011/0305250 A1 | 12/2011 | Chann et al. | |
| 2011/0305256 A1 | 12/2011 | Chann et al. | |
| 2011/0310921 A1 | 12/2011 | Chann et al. | |
| 2012/0033697 A1 | 2/2012 | Goyal et al. | |
| 2012/0105968 A1 | 5/2012 | Chann et al. | |
| 2013/0208361 A1 | 8/2013 | Chann et al. | |
| 2013/0215517 A1 | 8/2013 | Tayebati et al. | |

OTHER PUBLICATIONS

Gopinath, et al., "High-Brightness Wavelength-Beam-Combined Eyesafe Diode Laser Stacks", OSA 2007. CLEO 2007, May 6, 2007, Massachusetts.

V. Daneu, et al., "Spectral Beam Combining of a Broad-stripe Diode Laser Array in an External Cavity", Optics Letters, vol. 25, No. 6, p. 405-407, Lexington, Massachusetts, Mar. 15, 2000.

Chann, et al., "Efficient, high-brightness wavelength-beam-combined commercial off-the-shelf diode stacks achieved by use of a wavelength-shirped volume Bragg grating", Optics Letters May 1, 2006, vol. 31, No. 9, p. 1253-1255, Massachusetts.

Fan, "Laser Beam Combining for High-Power, High-Radiance Sources", IEEE Journal of selected topics in quantum electronics, vol. 11, No. 3, May/Jun. 2005, p. 567-575, Massachusetts.

Moskalev, et al., "External cavity multiline semiconductor laser for WDM applications", Proceedings of SPIE, vol. 4287, In-Plane Semiconductor Lasers V, p. 128-137, Jun. 2001, Alabama.

Poguntke, et al., "Simultaneous multiple wavelength operation of a multistripe array grating integrated cavity laser", Appl. Phys. Lett. 62 (17), Apr. 26, 1993, p. 2024, New Jersey.

Papen, et al., "Multiple-wavelength operation of a laser-diode array coupled to an external cavity", Optics Letters, vol. 18, No. 17, p. 1441, Sep. 1, 1993, Illinios.

Ian H. White, "A Multichannel Grating Cavity Laser for Wavelength Division Multiplexing Applications", Journal of Lightwave Technology, vol. 9, No. 7. Jul. 1991, p. 893-899.

Zimer H et al: "Thin film filter wavelength-locked laser cavity for spectral beam combining of diode laser arrays", 2014 IEEE Photonics Conference, IEEE, Oct. 12, 2014 (Oct. 12, 2014), pp. 230-231, XP032712890.

Papen et al., "Multiple-wavelength xternal cavity", Optics Letters, vol. 18, No. 17, pp. 1441-1443 (1993).

* cited by examiner

WAVELENGTH SELECTIVE EXTERNAL RESONATOR AND BEAM COMBINING SYSTEM FOR DENSE WAVELENGTH BEAM COMBINING LASER

CROSS-REFERENCE TO PRIOR APPLICATION

This application is a Continuation Application of U.S. patent application Ser. No. 14/087,985 filed on Nov. 22, 2013, the entire disclosure of which is hereby incorporated by reference herein.

FIELD

Dense wavelength beam combining (DWBC) is a technique for producing a single, high-brightness, multi-spectral output beam from a plurality of narrow spectral bandwidth input beams. DWBC techniques, which have also sometimes been referred to as dense wavelength multiplexing (DWM) techniques in some prior art, enable multiple relatively low-power single wavelength input beams to be superimposed to produce a single, high-power, high-brightness output beam. DWBC techniques enable output beam power to be scaled directly with the sum of the power produced by the plurality of input beams and produce output beams of quality commensurable with the quality of the individual input beams.

In DWBC systems, a plurality of narrow spectral bandwidth, or single wavelength, input laser beams are emitted from a laser source that comprises a plurality of individual emitters. The multi-spectral output beam is formed by combining, or spatially and directionally overlapping, the plurality of individual input beams with a beam combining element. Beam combining can be achieved by selecting, for each individual input beam, a wavelength and angle of incidence with respect to the beam combining element such that all of the input beams emerge from an overlap region of the beam combining element with a common direction of propagation. All combinations of wavelength and angle of incidence that will yield such a combined beam define a set of allowed wavelength-angle pairs for the system.

In order to produce a single multi-spectral combined output beam from the plurality of laser beams emitted by the laser source, a wavelength-angle pair from the set of allowed wavelength-angle pairs must be selected for each emitter in the laser source. Angle of incidence selection can be accomplished by fixing the relative position of the laser source and beam combining element and placing a position-to-angle transformation lens at a fixed position in the optical path between the laser source and the beam combining element. The position-to-angle transformation lens selects an angle of incidence for each emitter in the laser source by mapping the spatial position of each emitter to a particular angle of incidence with respect to the beam combining element.

For each individual emitter, wavelength selection can be accomplished by providing feedback to the emitter in the form of electromagnetic radiation having the desired wavelength for the emitter. Providing such electromagnetic radiation to the emitter will excite a resonant mode of the emitter that corresponds to the desired output. Thus, providing feedback to the emitter will stimulate the emission of additional electromagnetic radiation having a wavelength equivalent to the wavelength of the feedback. The resonant feedback will thereby narrow the spectral bandwidth of the laser beam emitted by the emitter and center the wavelength spectrum of the emitted beam about the wavelength at which the spectrum of the resonant feedback is centered. This process of providing feedback to an emitter can be referred to as beam wavelength stabilization, or wavelength locking.

Locking the wavelength of each laser beam maps a single wavelength to each emitter in the laser source and creates a set of fixed wavelength-position pairs for the laser source. The position-to-angle transformation lens maps the wavelength-position pair for each emitter in the laser source to a particular wavelength-angle pair. Selecting appropriate wavelength-position pairs ensures that the beam combining element will produce a spatially and directionally overlapped beam. However, if any other wavelengths simultaneously oscillate within the resonant feedback cavity (and are thus coupled into the emitters), the emitters will produce additional parasitic wavelength-position pairs which will not be directionally overlapped by the beam combining element. One downstream consequence of the production of additional parasitic wavelengths is a deterioration of the beam quality in the wavelength combining direction. Furthermore, such parasitic wavelengths can induce temporal fluctuation in the output power by means of modal competition within the laser gain medium.

SUMMARY

The present disclosure describes a compact dense wavelength beam combining (DWBC) arrangement capable of combining a plurality of individual, low-power beams into a high-power and high-brightness laser beam. The present disclosure further describes cavities utilized in DWBC applications that contain a plurality of multi-wavelength beams emitted by a plurality of emitters. The present disclosure more specifically describes systems and methods for performing beam wavelength stabilization through the use of thin-film filtering elements, e.g. thin-film etalons and thin-film notch-filters, for wavelength-selection and further describes the use of dispersive elements for output beam combining in DWBC systems.

Wavelength-selective systems can be used to greatly increase the brightness of DWBC system output beams. Wavelength-selective systems achieve such enhanced brightness by stabilizing the wavelength of the beams emitted by the emitters of the DWBC laser source. Many prior art systems and methods for beam wavelength stabilization utilize dispersive elements wavelength stabilization. However, utilizing dispersive elements for wavelength stabilization suffers from a primary drawback in that that parasitic wavelengths which can deteriorate the beam quality of the system are not prevented from propagating through the system. Additionally, such parasitic wavelengths can induce temporal fluctuation in the output power by means of modal competition within the laser gain medium. Therefore in many prior art systems, spatial filtering elements are used to eliminate undesired parasitic wavelengths produced by system input beams. However, spatial filtering elements are lossy and therefore spatial filtering can result in a significant loss of beam output power unless only a very small component of the input optical power is directed through the spatial filtering element. In order to address this concern, prior art systems and methods that direct a fraction of the input optical power through the spatial filtering element to produce a resonant feedback component have been developed. Such prior art systems and methods direct a portion of the input optical power through an external resonator containing the lossy spatial filtering element and couple the remaining input optical power into a beam combining apparatus. The resonant feedback component cannot be too small if reliable wavelength stabilization is to be attained. Due to the power losses attributable to the spatial filtering element, a high brightness system that utilizes a spatial filtering element will always have suffer a significant reduction in output beam power as compared to input beam power. Furthermore, heat generation can contribute to a somewhat deteriorated beam quality in such systems. An additional disadvantage is the complexity of such arrangements due to their inherently connected interferometric character.

The external resonator cavities described by the present disclosure provide advantages over the prior art since parasitic wavelengths, which elsewhere need to be filtered from the external resonator cavity, are prevented from propagating through the external resonator cavity. The external resonator cavities of the present disclosure thereby achieve a reduction in the power losses attributable to beam wavelength stabilization and further attain higher efficiency operation at high brightness. The wavelength-selective external resonators of the present disclosure achieve such advantage through the use of innovative cavity configurations and designs that utilize thin-film filtering elements as wavelength selective elements in wavelength selective external resonators.

One challenge of merging an external resonator that utilizes a thin-film filter as a wavelength selective element with a dispersive beam combiner in order to achieve increased brightness in a DWBC system consists of properly matching the angular wavelength spectrum of the resonator cavity to that of the dispersive beam combiner. Generally the spectral-angular dispersion of the resonator cavity does not match that of the dispersive beam combiner. The magnitude of the spectral-angular dispersion mismatch increases as input power is scaled up and the separation distance between the emitters in the arrangement of input beam emitters is decreased. First, a broader spectrum of wavelengths must be utilized in order to include the additional input beam emitters necessary for the production of an output beam of increased power. In essence, as additional beam emitters are added to the system in order to scale up the power of the system, additional wavelengths must be assigned to the additional beam emitters and the overall breadth of the wavelength spectrum produced by the totality of beam emitters is increased. Furthermore, in order to limit the size of the arrangement, the beam combining element must produce a greater degree of dispersion. In order to produce a greater degree of dispersion, the magnitude of the nonlinear terms of the dispersion increases and the non-linear terms become more relevant. The nonlinear dispersion terms introduced by the thin-film filter do not match those introduced by the dispersive combining element, and therefore, as the magnitude of the nonlinear dispersion terms increases, the magnitude of the dispersion mismatch also increases. The dispersion mismatch results in an output beam that is not perfectly combined and may produce a reduction in beam quality and brightness.

Therefore one of the solutions provided by this invention is to overcome the drawbacks created by the spectral-angular dispersion mismatch of the resonator cavity and the dispersive beam combiner. Through overcoming such drawback, the invention is able to provide a compact DWBC system capable of producing an output beam of high power and high beam quality. The present invention proposes a procedure and an apparatus for matching the spectral-angular dispersion produced by the thin-film filter element to the spectral-angular dispersion produced by the dispersive combining element. For a compact system, the beam combining element must be highly dispersive and will introduce both linear and non-linear dispersion components to the beam. The compensation of the nonlinear dispersion produced by the beam combining element is done in the present invention by adjusting the thickness of a spacer in the thin-film filtering element. After selecting a thin-film filtering element with the right thickness for use in the wavelength-stabilizing external resonator, the overall nonlinear dispersion of the DWBC arrangement can be substantially eliminated. Furthermore, the linear components of the dispersion of the combining element and of the thin-film filtering element can be matched by positioning a telescope producing a degree of magnification that properly compensates for the difference in the linear dispersion of the two elements.

Therefore the DWBC arrangements of the present invention provide advantages over the prior art due to their relatively more compact size and their ability to attain high brightness at high power.

One implementation of the present invention provides a beam combining system comprising a laser source having a plurality of emitters that each emit a laser beam, a beam wavelength stabilization system comprising a wavelength filtering element and a reflective element, and a beam combining element arranged outside the beam wavelength stabilization system, wherein each laser beam emitted by the plurality of emitters has a single wavelength, wherein the beam wavelength stabilization system receives a portion of the total optical power emitted by the laser source and directs a portion of the received optical power back into the laser source, and wherein the beam combining element receives a portion of the total optical power emitted by the laser source and generates a combined output beam.

An additional implementation of the present invention provides a beam wavelength stabilizing system comprising a laser source having a plurality of emitters that each emit a laser beam, a wavelength filtering element, and a reflective element, wherein each laser beam emitted by the plurality of emitters has a single wavelength, wherein the wavelength filtering element is disposed between the laser source and the reflective element, wherein the reflective element directs a portion of the optical power emitted by the laser source at the wavelength filtering element and into the laser source as feedback, and wherein the plurality of laser beams emitted by the laser source do not travel through the wavelength stabilization system with a common direction of propagation.

A further implementation of the present invention provides a method for stabilizing the wavelengths of each of a plurality of beams, each beam emitted by a single emitter of a laser source comprising a plurality of emitters, the method comprising: directing, as a feedback component, a portion of each of the plurality of beams through a beam wavelength stabilization system, directing the feedback component at a wavelength filtering element, directing the feedback component at a reflective element, and directing a reflection of the feedback component from the reflective element into the emitter that emitted the beam.

Another implementation of the present invention provides a method for producing a combined output beam formed of components of a plurality of emitted beams, each emitted beam emitted by a single emitter in a laser source having a plurality of beam emitters, the method comprising directing, as a feedback component, a portion of each of the plurality of emitted beams into a wavelength stabilization system, directing, as an output component, a portion of each of the plurality of emitted beams at a beam combining element arranged outside the wavelength stabilization system, directing each feedback component at a wavelength filtering element, directing each feedback component at a reflective element, and directing a reflection of each feedback component into the beam emitter that emitted the emitted beam of which a portion was the particular feedback component.

DETAILED DESCRIPTION OF THE INVENTION

I. Introductory Systems

FIGS. 1-11 illustrate and provide insight into the operation of external resonators that utilize thin-film filters as wavelength selective elements. The embodiments depicted in FIGS. 1 and 10 include laser sources that consist of a plurality of spatially separated individual laser emitters. The individual laser emitters may be diode lasers, fiber lasers, solid-state lasers, or any other type of lasers. The plurality of individual emitters that constitute the laser sources 101 and 1001 may be arranged in a one dimensional array, a two dimensional array, or a variety of other configurations. In some embodiments, the laser sources 101 and 1001 consist of stacks of diode bars, where each bar has a plurality of emitters. Typically, individual diode laser emitters emit beams with an asymmetric beam profile having two perpendicular axes perpendicular to the direction of propagation upon which the beam diverges at disparate rates. The two axes can be identified as a fast axis, along which the beam diverges more rapidly, and a slow axis, upon which the beam diverges comparatively more slowly. Although not depicted in any of FIGS. 1-11, a variety of optical elements may be used to manipulate the beams emitted by the individual diode emitters prior to the beams interacting with the elements depicted in FIGS. 1-11. Such manipulation may be referred to as preprocessing, and a variety of prior art literature discusses techniques for preprocessing beams emitted by diode laser emitters. In the context of DWBC, preprocessing may be performed to ensure production of a high-quality multi-spectral combined output beam. For example, beams may be rotated such that downstream processing is performed along a fast axis rather than along a slow axis.

Figure 1:
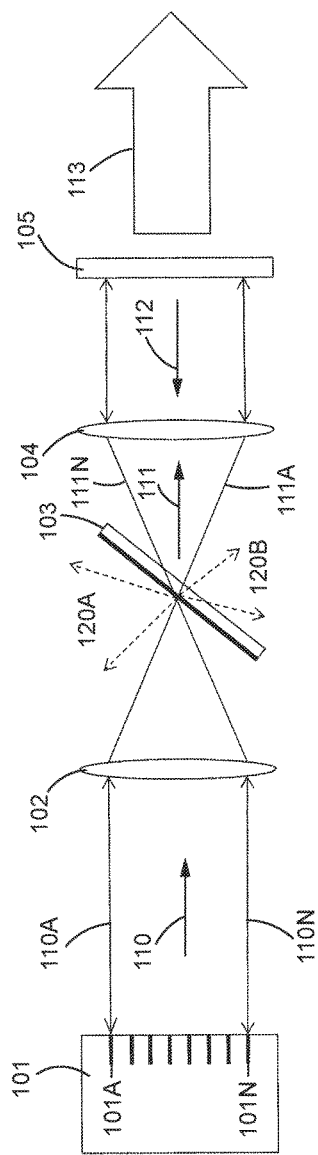
FIG. 1 illustrates a wavelength-selective external resonator that utilizes a thin-film etalon as a wavelength selective element and a partially reflective mirror to direct resonant feedback into a plurality of emitters to facilitate beam wavelength stabilization.

FIG. 1 illustrates a wavelength-selective external resonator that utilizes a thin-film etalon as a wavelength selective element and a partially reflective mirror to direct resonant feedback into a plurality of emitters to facilitate beam wavelength stabilization. The apparatus depicted in FIG. 1 includes a laser source 101 with a plurality of individual emitters (e.g. 101A and 101N), a position-to-angle transformation optic 102, a thin-film filtering element, which as depicted in FIG. 1 is an etalon 103, a collimating optic 104, and a reflective element 105. The wavelength-selective external resonator provides feedback to each of the plurality of individual emitters of the laser source 101 in order to stabilize the wavelength of the beams emitted by the plurality of emitters of the laser source 101. Specifically, the external resonator couples photons of specific wavelengths into specific emitters of the laser source 101 and thereby induces each individual emitter to emit additional photons of a specific, assigned wavelength.

The plurality of emitters of the laser source 101 emit a plurality of beams that together constitute external resonator input 110. External resonator input 110 is therefore composed of a plurality of individual constituent beams, each of which is emitted by a single emitter in the laser source 101. FIG. 1 depicts two particular external resonator input beams, 110A and 110N, emitted by emitters 101A and 101N. The emission spectrum of each individual emitter in the laser source 101 narrows as the external resonator provides feedback to the emitters.

For each constituent beam of the external resonator component 110, a preferred resonant mode component and an alternative resonant mode component can be defined. The preferred resonant mode component of each constituent beam consists of photons having a wavelength that corresponds to a preferred resonant mode of an emitter of the laser source 101. The alternative resonant mode component of each constituent beam consists of photons having wavelengths that do not correspond to the preferred resonant mode of an emitter of the laser source.

Each emitter in the laser source 101 has a particular location with respect to the first position-to-angle transformation optic 102. Thus, upon exiting the laser source, the unfiltered laser source output 110 has a position spectrum that corresponds to the spatial distribution of the emitters in the laser source 101. For example, the position of constituent beam 110A of the unfiltered laser source output 110 corresponds to the position of individual emitter 101A while the position of the constituent beam 110N of the unfiltered laser source output 110 corresponds to the position of the individual emitter 101N.

The first position-to-angle transformation optic 102 is disposed between the laser source 101 and the etalon 103. In the embodiment depicted in FIG. 1, the first position-to-angle transformation optic 102 is a Fourier lens. However, in alternative embodiments, the position-to-angle transformation optic 102 may be one of a group including but not limited to a Fresnel lens, a mirror arrangement, and a diffraction grating. The first position-to-angle transformation optic 102 imparts upon each constituent beam of the unfiltered laser source output 110 an angle of incidence with respect to the etalon 103. The angles of incidence imparted upon the constituent beams of the unfiltered laser source output 110 by the first position-to-angle transformation optic 102 are determined by the spatial position of the constituent beams and thus the spatial position of the emitters of the laser source 101. For example, the first position-to-angle transformation optic 102 imparts upon the constituent beam 110A an angle of incidence that is determined by the spatial position of the individual emitter 101A. Therefore, after emerging from the first position-to-angle transformation optic 102, the unfiltered laser source output 110 possesses an angular spectrum that corresponds to the spatial distribution of the individual emitters of the laser source 101.

The etalon 103 is positioned at the focal point of the first position-to-angle transformation optic 102 such that the constituent beams of the unfiltered laser source output 110 are focused at a point in space that lies on the front surface of the etalon. The etalon 103 includes two parallel plates having highly reflective, inward-facing surfaces separated by a separation distance that defines the thickness of the etalon. The etalon 103 exhibits a transmission spectrum that is dependent upon both the wavelength of incident beams and upon the angle at which the incident beams strike the etalon. Specifically, for a given angle of incidence, the etalon will only transmit photons having wavelengths that correspond to a resonant mode of the etalon 103. Resonant modes of the etalon occur where the optical path length through the etalon is an integer multiple of the wavelength of the incident photons.

The transmittance properties of the etalon 103 enable the combination of the etalon 103 and the first position-to-angle transformation optic 102 to select a preferred resonant mode for each emitter of the laser source 101. Specifically, the position-to-angle transformation optic 102 imparts a particular angle of incidence upon the photons emitted by each individual emitter of the laser source 101. That is, the first position-to-angle transformation optic assigns a particular angle of incidence to each emitter of the laser source. Thereafter, for each angle of incidence (and thus for each emitter) the etalon 103 selects photons of a particular wavelength for transmission. Photons of wavelengths that do not correspond to a particular resonant mode of the etalon will be reflected by the etalon prior to reaching the space between the parallel reflecting surfaces of the etalon 103. Photons not corresponding to a particular resonant mode of the etalon are thereby removed from the wavelength-selective external resonator. As a result of the transmission properties of the etalon 103, the photons emerging from the etalon 103 all have wavelengths that correspond to the preferred resonant mode of the emitter from which they were generated. The beams emerging from the etalon 103 are composed of filtered laser source output 111. A portion of the filtered laser source output 111 is subsequently reflected by the reflective element 105 and returned to the laser source 101 as beam wavelength stabilizing feedback. In the embodiment depicted in FIG. 1, the reflective element 105 is a partially-reflective mirror.

Returning to the apparatus depicted in FIG. 1, the filtered laser source output 111 retains an angular spectrum related to the angular spectrum possessed by the unfiltered laser source output 110 upon emerging from the interaction with the etalon 103. The filtered laser source output 111 consists of a plurality of single-wavelength constituent beams, e.g. constituent beam 111A and constituent beam 111N, each of which has an angle of transmission with respect to the etalon 103. Additionally, each constituent beam of the laser source output 111 also has an angle of incidence with respect to the collimating optic 104.

The collimating optic 104 is disposed between the etalon 103 and the reflective element 105. The collimating optic 104 transforms the angular spectrum of the filtered laser source output 111 into a position spectrum and directs the constituent beams of the laser source output 111 at the reflective element 105. Specifically, the collimating optic 104 maps the angle of incidence of each constituent beam of the laser source output 111 to a position at the reflective element 105. Thus, the collimating optic 104 projects an image onto the reflective element 105 that corresponds to an image of the beams leaving the laser source 101. In the embodiment depicted in FIG. 1, the collimating optic 104 is a Fourier lens. However, in alternative embodiments, a variety of optical elements may be utilized as a collimating optic. For example, Fresnel lenses, mirror arrangements, and diffraction gratings may all be used as collimating optics in alternative embodiments.

Upon emerging from the collimating optic 104, the filtered laser source output 111 propagates towards and interacts with the reflective element 105. The reflective element 105 reflects a portion of the filtered laser source output 111 as resonant feedback 112 and transmits a portion of the filtered laser source output 111 as resonator output 113. Both the resonant feedback 112 and the resonator output 113 are composed of a plurality of collimated, single wavelength (i.e. narrow spectral bandwidth) beams. The portion of the filtered laser source output 111 which is transmitted by the reflective element 105 and the portion which is reflected may be adjusted in order to optimize the amount of feedback provided to the laser source 101. In general, a substantial majority of the electromagnetic radiation transmitted by the etalon is also transmitted by the reflective element 105 as resonator output 113. Preferably, the reflective element 105 generally transmits at least eighty percent of the incident electromagnetic radiation as system output 113 and generally reflects no more than twenty percent of the incident electromagnetic radiation as resonant feedback 112.

After emerging from the reflective element 105, the resonant feedback 112 propagates through the collimating optic 104 and the etalon 103 towards the laser source 101 in a direction of propagation that is opposite that of the unfiltered laser source output 110. The collimating optic 104 imparts an angular spectrum upon the resonant feedback 112 by imparting an angle of incidence with respect to the etalon 103 upon each constituent beam of the resonant feedback 112. The angle of incidence imparted upon each constituent beams of the resonant feedback corresponds to the angle of transmission of the corresponding constituent beam of the filtered laser source output 111 and therefore to the angle of incidence of the corresponding constituent beam of the unfiltered laser source output 110. Therefore, each constituent beam of the resonant feedback 112 will have an angle of incidence and a wavelength that corresponds to a transmission peak of the etalon 103. Thus, the etalon 103 will be transparent to the resonant feedback 112.

After passing through the etalon 103, the first position-to-angle transformation optic 102 transforms the angular spectrum of the resonant feedback 112 into a position spectrum that corresponds to the spatial distribution of the plurality of emitters in the laser source 101. Thus, the first position-to-angle transformation optic 102 directs each constituent beam of the resonant feedback 112 into a single emitter of the laser source 101 thereby stimulating emission of electromagnetic radiation corresponding to the preferred resonant mode, as selected by the etalon, of each emitter of the laser source 101. While the feedback causes each emitter to emit at a single wavelength, the configuration does not preclude the possibility that multiple emitters in the laser source 101 will each emit beams of the same wavelength. For example, in situations where the laser source 101 is a stack of diode bars, it may be possible that individual emitters from different diode bars emit beams of the same wavelength.

Figure 2:
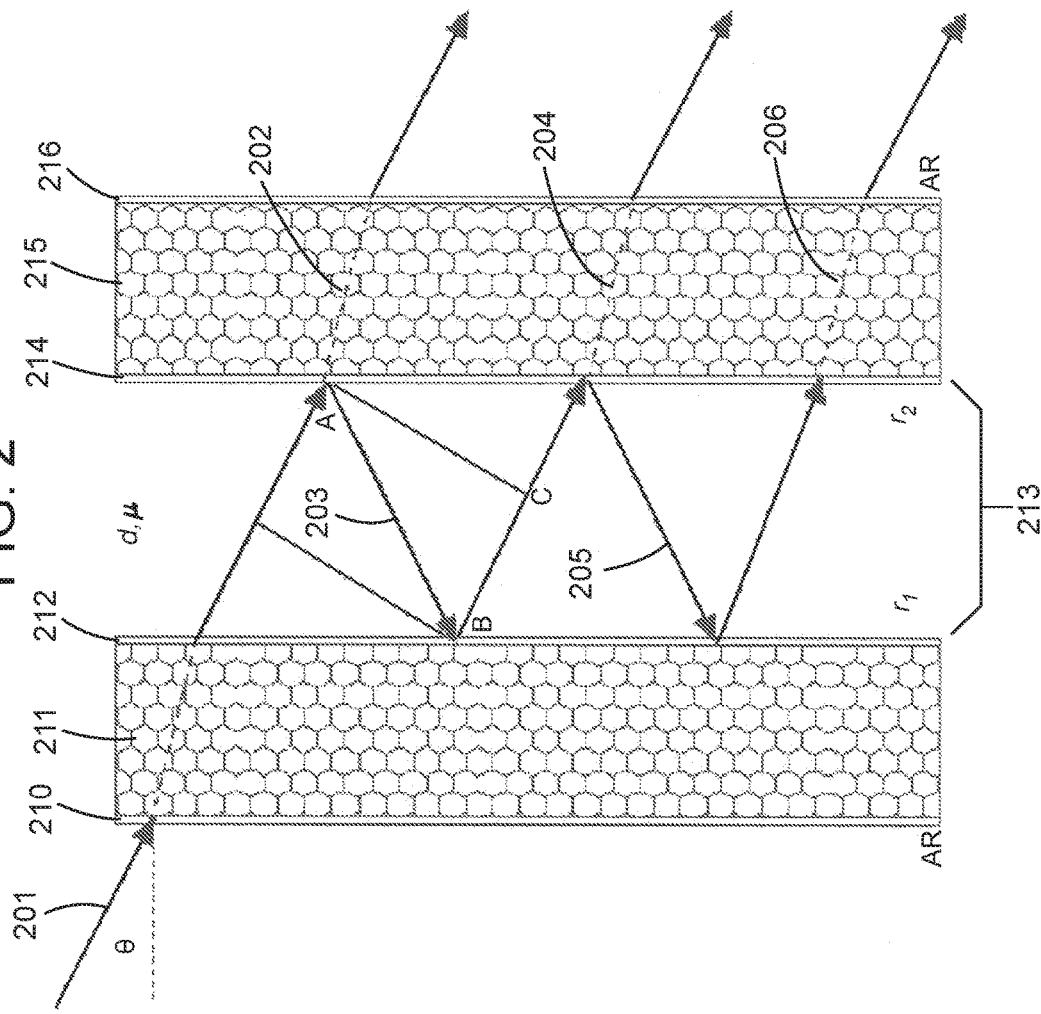
FIG. 2 illustrates an etalon and the optical path of an incident beam as the beam interacts with the etalon.

FIG. 2 illustrates an etalon that functions in an analogous fashion to the etalon utilized as the thin-film filtering element 103 of FIG. 1 and outlines the interference phenomena responsible for producing the transmission spectrum of an etalon. FIG. 2 traces the optical path of an incident beam as it interacts with the etalon. Incident beam 201 strikes the etalon at a first antireflective coating 210 on the outside edge of the etalon at an incident angle θ. Thereafter, the incident beam propagates through substrate 211, through a first inward facing highly reflective surface 212, and into the interior of the etalon 213. After the incident beam 201 propagates across the interior of the etalon 213 and reaches a second inward facing highly reflective surface 214, the second inward facing highly reflective surface splits the incident beam 201 into multiple components. A first component of the incident beam 201 is transmitted into a second substrate 215 as a first transmitted beam 202. A second component of the incident beam is reflected by the second inward facing highly reflective surface 214 as a first reflected beam 203.

The first transmitted beam 202 propagates through the second substrate 215 and across an antireflective coating 216 and departs the etalon at an angle of transmission θ equal to the angle of incidence θ of the incident beam. Meanwhile, the first reflected beam 203 propagates across the etalon interior 213 until it reaches the first inward facing highly reflective surface 212. Upon reaching the first inward facing highly reflective surface 212, the first reflected beam 203 is reflected back across the etalon interior 213 at an angle of reflection θ. After first reflected beam 203 propagates across the interior of the etalon 213 and reaches the second inward facing highly reflective surface 214, the second inward facing highly reflective surface splits first reflected beam 203 into a second transmitted beam 204 and a second reflected beam 205. The second reflected beam thereafter bounces back across the etalon interior 213 and thereafter produces a third transmitted beam 206. Each of the transmitted beams emerge from the etalon with an angle of transmission equal to θ.

Constructive and destructive interference effects of the beams propagating through and across the etalon give rise to transmission maxima and minima, respectively. Constructive maxima occur when transmitted beams, e.g. 202, 204, and 206, are in phase. The phase relationship between transmitted beams is a function of the wavelength of the beams, the refractive index of the materials from which the etalon structure is constructed, the thickness of the etalon (i.e. the distance separating the two parallel highly reflecting surfaces), and the angle of incidence of the beam. Transmission maxima occur where $$m\lambda = 2nd \cos\frac{\theta}{n},$$

where d is the spatial distance between the two parallel highly reflecting surfaces, m is an odd integer, n is the index of refraction within the etalon interior 113, θ is the angle of incidence of the incident beam 101, and λ, is the wavelength of the incident beam. The transmission spectrum of the etalon is provided by the equation $$A(\varphi, R) = \left(1 + \frac{4R}{(1+R)^2}\left(\sin\frac{\varphi}{2}\right)^2\right) \text{ where } \varphi = \left(\frac{4\pi}{\lambda}\right)nd \cos \arcsin\left(\frac{\sin\theta}{n}\right)$$

is the optical phase, d is the spatial distance between the two parallel highly reflecting surfaces, n is the index of refraction within the etalon interior 213, θ is the angle of incidence of the incident beam 201, and λ, is the wavelength of the incident beam.

Figure 3:
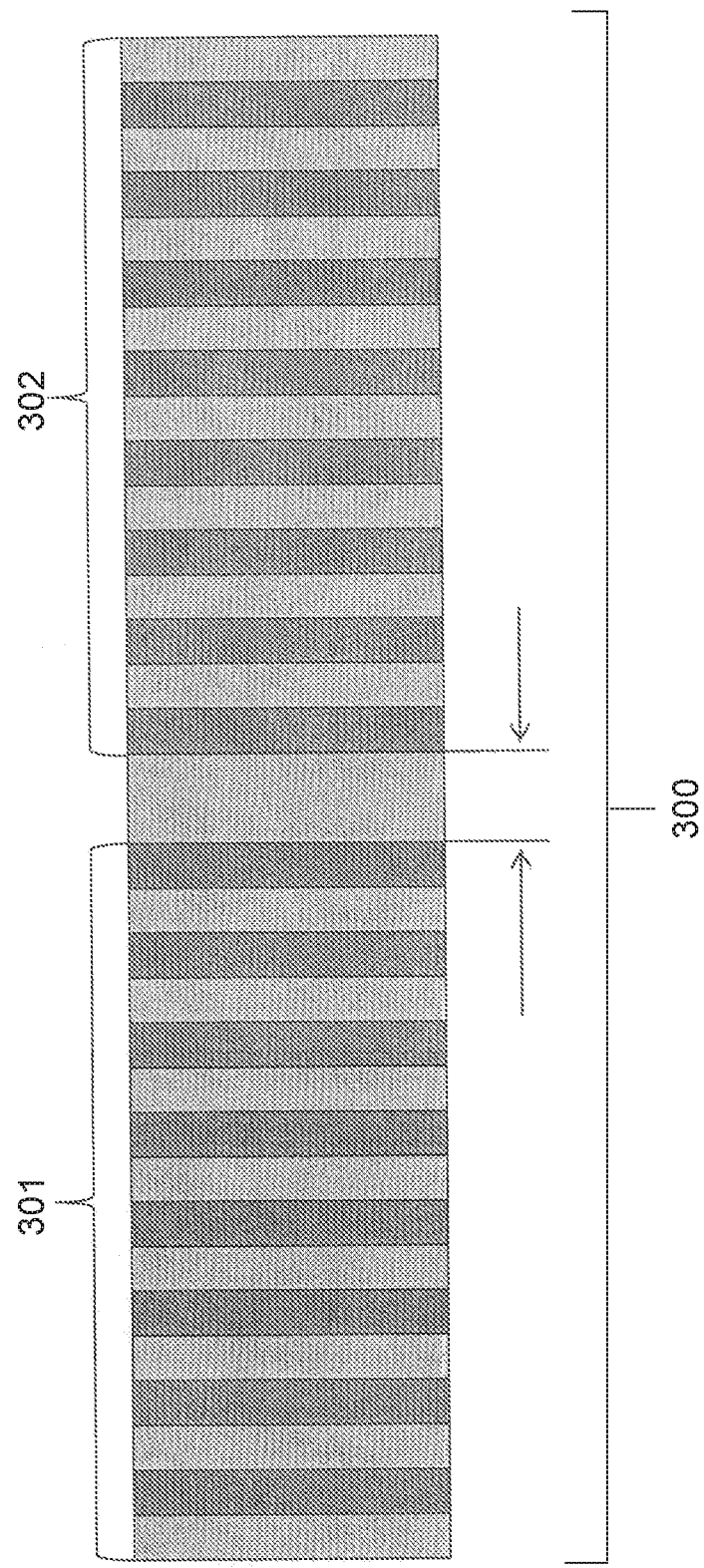
FIG. 3 illustrates a thin-film etalon capable of use in a wavelength-selective external resonator of a DWBC apparatus.

FIG. 3 illustrates a thin-film etalon 300 for use in a wavelength-selective external resonator. The thin-film etalon includes parallel thin-film reflective surfaces 301 and 302, which are sequentially deposited on a substrate (not shown). In the embodiment depicted by FIG. 3, the parallel thin-film reflective surfaces 301 and 302 are dielectric highly reflective mirrors. The thickness d of the etalon is defined as the separation distance between the two inwardly facing parallel reflective surfaces 301 and 302. When utilized in DWBC applications, the thickness d of the etalon is selected to be roughly on the order of a single half wavelength of the natural resonant mode of the emitters of the laser source in order to limit the number of resonant modes of the etalon.

Figure 4:
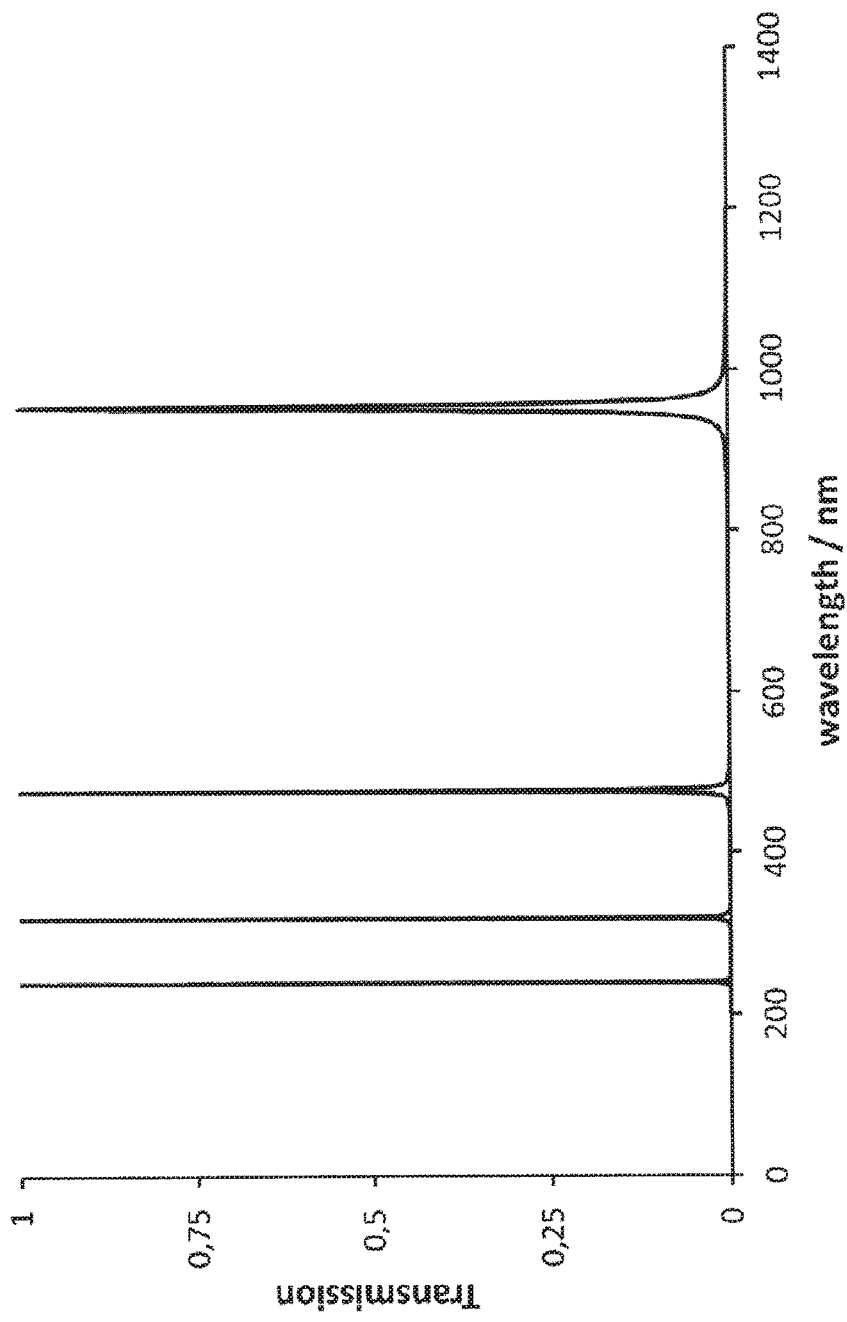
FIG. 4 illustrates the transmission spectrum of an etalon as a function of wavelength.

FIG. 4 is a graph illustrating the transmission spectrum of an exemplary etalon capable of use in a wavelength-selective external resonator. The graph of FIG. 4 plots transmission of the etalon as a function of wavelength for photons striking the etalon at a particular angle of incidence. The transmission spectrum depicted in FIG. 4 includes four transmission peaks that correspond to resonant modes of the etalon. Resonant modes of the etalon occur where the optical path length through the etalon is an integer multiple of the wavelength. The wavelength separation between adjacent peaks defines the free spectral range (FSR) of the etalon. The FSR Δλ of the etalon is related to the full-width half-maximum $\delta\lambda_{1/2}$ of any transmission band of the etalon by a quantity known as the reflective finesse $N_r$ of the etalon. The reflective finesse $N_r$ of the etalon is also related to the reflectivity R of the parallel reflective surfaces of the etalon by the equation $$N_r = \frac{\Delta\lambda}{\delta\lambda_{1/2}} = \frac{\pi\sqrt{R}}{(1-R)}.$$

Therefore, the transmission spectrum depicted by FIG. 4 is provided by the equation $$A(\varphi, N_r) = \left[1 + \left(\frac{2N_r}{\pi}\right)^2 \cdot \sin\frac{\varphi}{2}\right]^{-1}.$$

Figure 5:
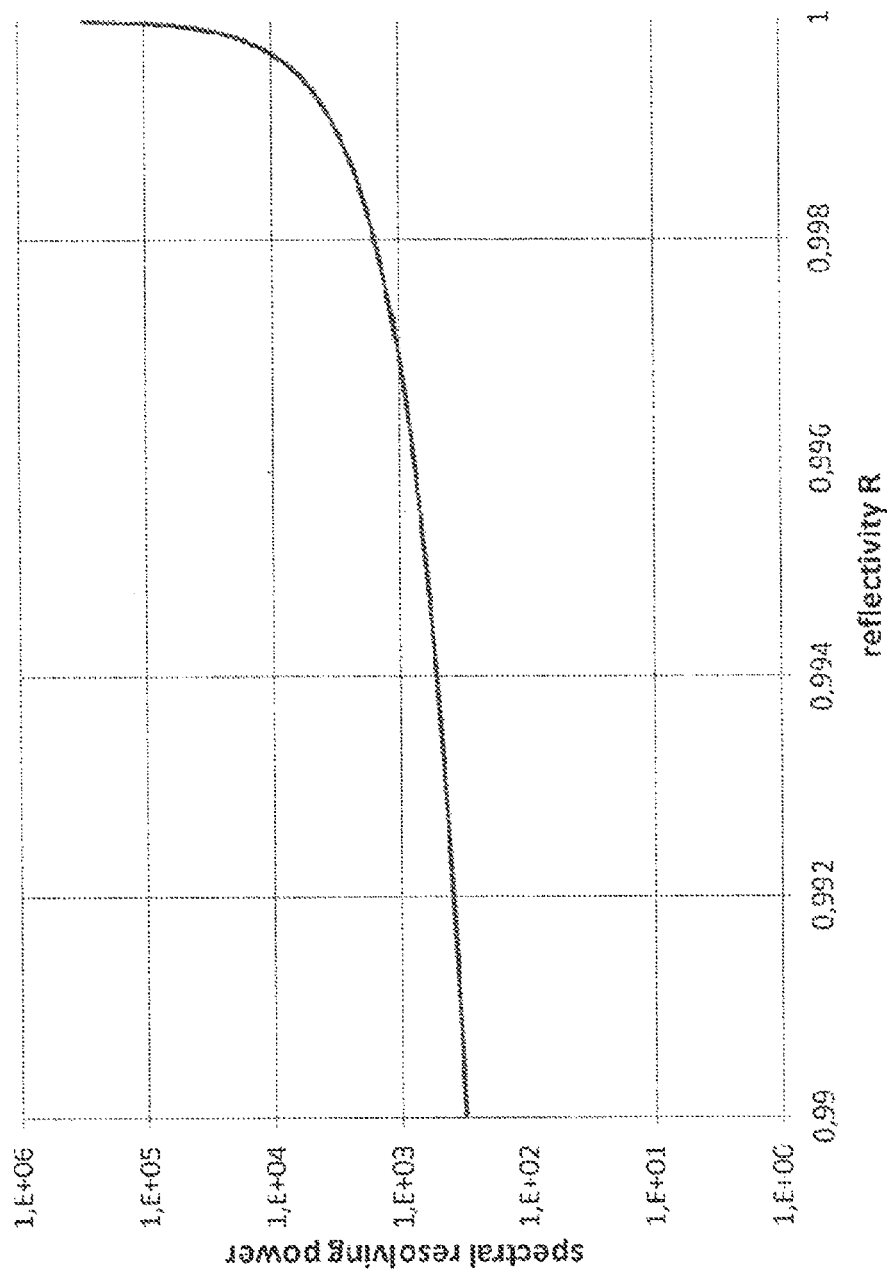
FIG. 5 is a graph depicting the spectral resolving power of an etalon as a function of the reflectivity of the parallel mirrors of the etalon.

FIG. 5 illustrates the spectral resolving power, or finesse, of an etalon as a function of the reflectivity of the parallel mirrors of the etalon. As can be seen from the graph depicted in FIG. 6, as the reflectivity of the parallel reflective surfaces of the etalon increases, the finesse of the etalon, and therefore its spectral resolving power, increases. As the reflectivity approaches 1.00 (absolute reflectance), the spectral resolving power increases dramatically. The transmission spectrum of a high finesse etalon exhibits considerably sharper peaks and considerably lower transmission minima relative to an etalon of low finesse. Therefore, a wavelength-selective external resonator utilizing a high finesse etalon can provide feedback beams of very narrow spectral bandwidth for beam wavelength stabilization.

Figure 6:
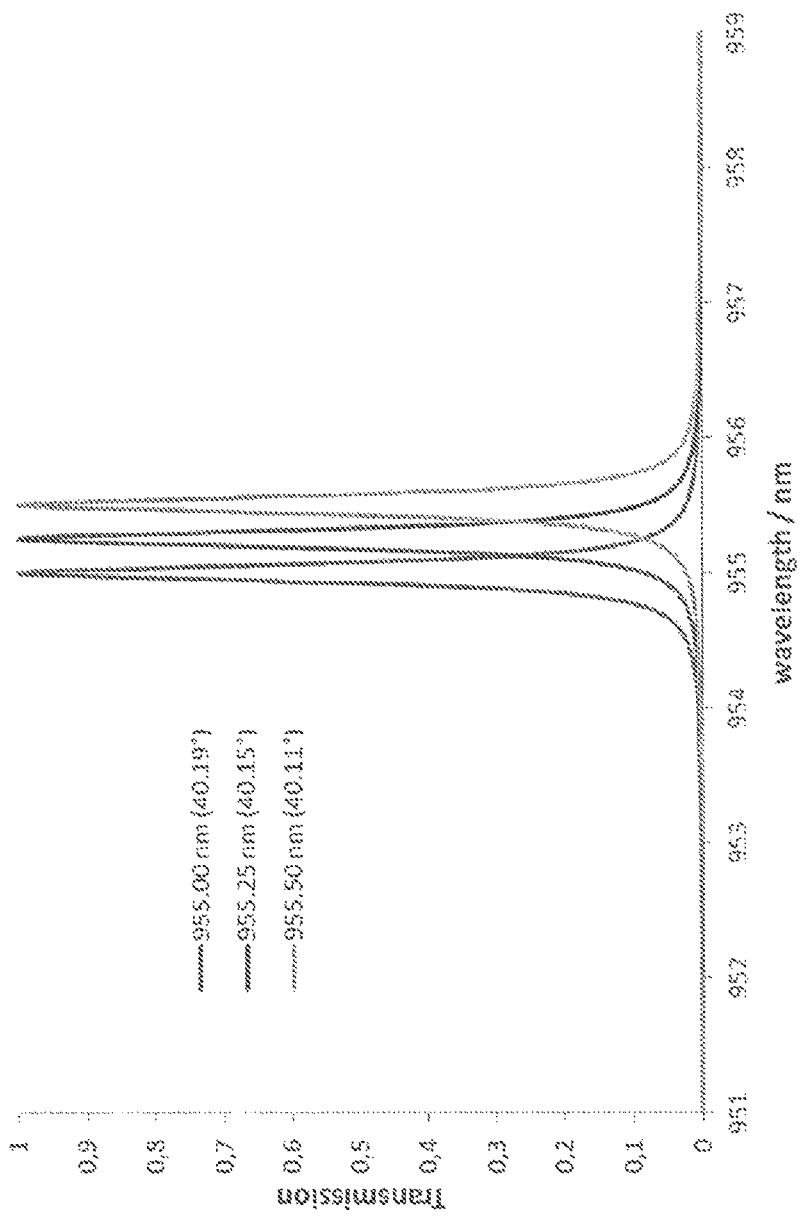
FIG. 6 is a graph depicting the transmission spectrum of a thin-film etalon as a function of wavelength for three different angles of incidence.

FIG. 6 is a graph depicting the transmission spectrum of a thin-film etalon as a function of wavelength for three different angles of incidence. The thin-film etalon for which the transmission spectrum is provided in FIG. 6 has parallel reflecting surfaces with reflectivity R=0.9995. With respect to the first angle of incidence (40.19°), the thin-film etalon exhibits a transmission peak at a wavelength of λ=955.00 nm. With respect to the second (40.15°) and third (40.11°) angles of incidence, the thin-film etalon exhibits transmission peaks at wavelengths of λ=955.25 nm and λ=955.50 nm, respectively.

The transmission spectrum of the thin-film etalon depicted in FIG. 6 is representative of a subset of a transmission spectrum of the thin-film etalon of FIG. 1. Specifically, the transmission spectrum of the thin-film etalon depicted by FIG. 6 exhibits a single narrow transmission peak for each angle of incidence. The angles of incidence correspond to positions of individual emitters in the laser source 101. Specifically, the first position-to-angle transformation optic 102 maps the position of three emitters of the laser source 101 to angles of incidence of 40.11°, 40.15°, and 40.19°. As demonstrated by the transmission spectrum of FIG. 6, for each angle of incidence, the etalon 103 is essentially transparent with respect to photons of an extremely narrow band of wavelengths and essentially opaque with respect to photons of all other wavelengths. Specifically, for photons striking the etalon at an angle of incidence of 40.11°, the etalon transmits only those with wavelengths within an extremely narrow band centered at 955.50 nm. In that manner, the etalon only allows optical power corresponding to wavelengths within an extremely narrow band centered at 955.50 nm to be transmitted into the emitter corresponding to an angle of incidence of 40.11° as feedback. Similarly, the etalon only allows resonant feedback with wavelengths within extremely narrow bands centered at 955.25 nm and 955.00 nm to be transmitted into the emitters corresponding to angles of incidence of 40.15° and 40.19°, respectively.

Figure 7:
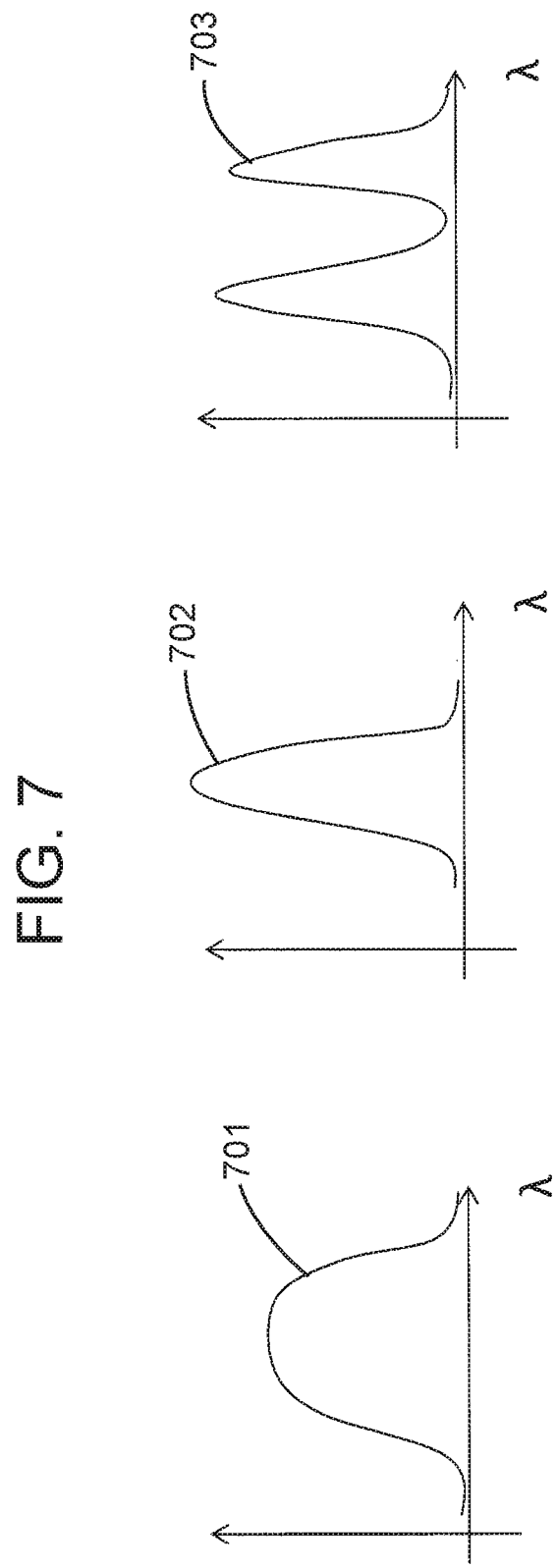
FIG. 7 is a graph depicting the bandwidth of the emission spectrum of an individual emitter in the laser source of FIG. 1, the bandwidth of the transmission spectrum of the etalon of FIG. 1 at the angle of incidence and wavelength corresponding to the individual emitter, and the spectrum of the loss channels corresponding to the individual emitter.

FIG. 7 is a graph depicting the bandwidth of the emission spectrum of an individual emitter in the laser source of FIG. 1, the bandwidth of the transmission spectrum of the etalon of FIG. 1 at the angle of incidence and wavelength corresponding to the individual emitter, and the spectrum of the loss channels corresponding to the individual emitter. The emission spectrum, transmission spectrum, and spectrum of the loss channels depicted in FIG. 7 all pertain to a single emitter in the laser source 101 of FIG. 1. The curve 701 represents an emission spectrum of an individual emitter in the laser source of FIG. 1. As can be seen, the individual emitter emits optical power at a relatively narrow range of wavelengths. The emission spectrum represented by 701 corresponds to an individual emitter in the laser source 101 that has begun to receive feedback. Therefore, the beam corresponding to the emission spectrum represented by 701 is of a sufficiently narrow spectral bandwidth such that it will not detract from the output beam quality of a DWBC system were it to be combined with other beams of similarly narrow spectral bandwidth.

The curve 702 represents a transmission spectrum of the etalon of FIG. 1 at an angle of incidence corresponding to the individual emitter in the laser source 101 whose emission spectrum is represented by the curve 701. As can be seen, the transmission spectrum of the etalon is of a substantially narrower spectral bandwidth than is the emission spectrum represented by the curve 701. A comparison of the curves 701 and 702 underscores the fact that an emission spectrum of an individual diode emitter in the laser source 101 can not be made infinitely narrow through providing substantially narrower feedback. Instead, spectral broadening effects such as spectral and spatial hole burning limit the degree to which the bandwidth of the emission spectrum of an individual diode emitter can be narrowed.

The curve 703 represents the spectrum of the loss channels 120A and 120B of FIG. 1. The spectrum of the loss channels represented by the curve 703 is a product of the emission spectrum of the individual emitter represented by the curve 701 and the transmission spectrum of the etalon represented by the curve 702. The spectrum of the loss channels represented by the curve 703 demonstrates that a considerable amount of optical power produced by the individual diode emitter is ejected from the system and precluded from contributing to the power of the output beam. Although a DWBC system that eliminates substantial amounts of input optical power in favor of highly selective wavelength transmission may be useful for some applications, the poor wall-plug efficiency resulting from the arrangement depicted in FIG. 1 as demonstrated by the curve 703 will preclude such a system from being ideal for a number of applications that require considerable beam output power.

Figure 8:
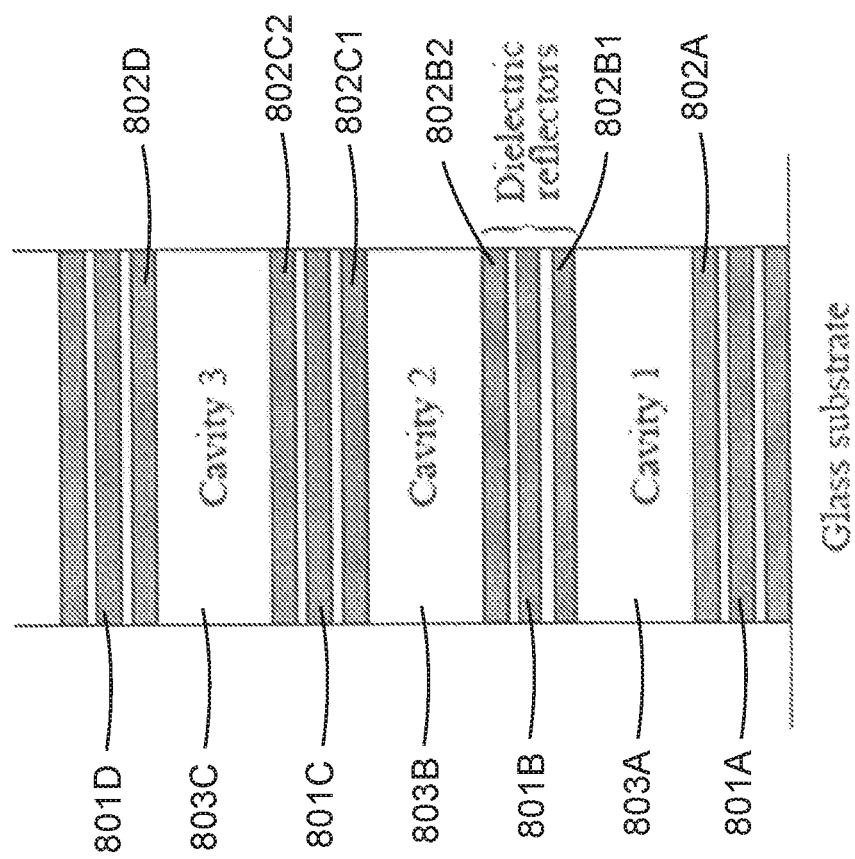
FIG. 8 is a schematic diagram of a multi-cavity thin-film etalon capable of use in a wavelength-selective external resonator of a DWBC apparatus.

FIG. 8 illustrates a multi-cavity thin-film filtering element capable of use in a wavelength-selective external resonator of a dense wavelength multiplexing apparatus. The thin-film filtering element 800 includes a series of cavities (803A, 803B, 803C) defined by sets of two parallel, highly reflective, inward-facing surfaces (802A, 802B1, 802B2, 802C1, 802C2, 802D) mounted on a substrate (801A, 801B, 801C, 801D). Thus, the thin-film filtering element 800 is a triple cavity thin-film filtering element. In the embodiment depicted by FIG. 8, the highly reflective surfaces are dielectric high-reflective mirrors separated by a cavity thickness d. In DWBC applications, the cavity thickness d is selected to be roughly on the order of a single half wavelength of the preferred resonant mode of the emitters of the laser source in order to limit the number of resonant modes of the thin-film filtering element. The thin-film etalon 300 of FIG. 3 is an example of a single cavity thin-film filtering element.

Figure 9:
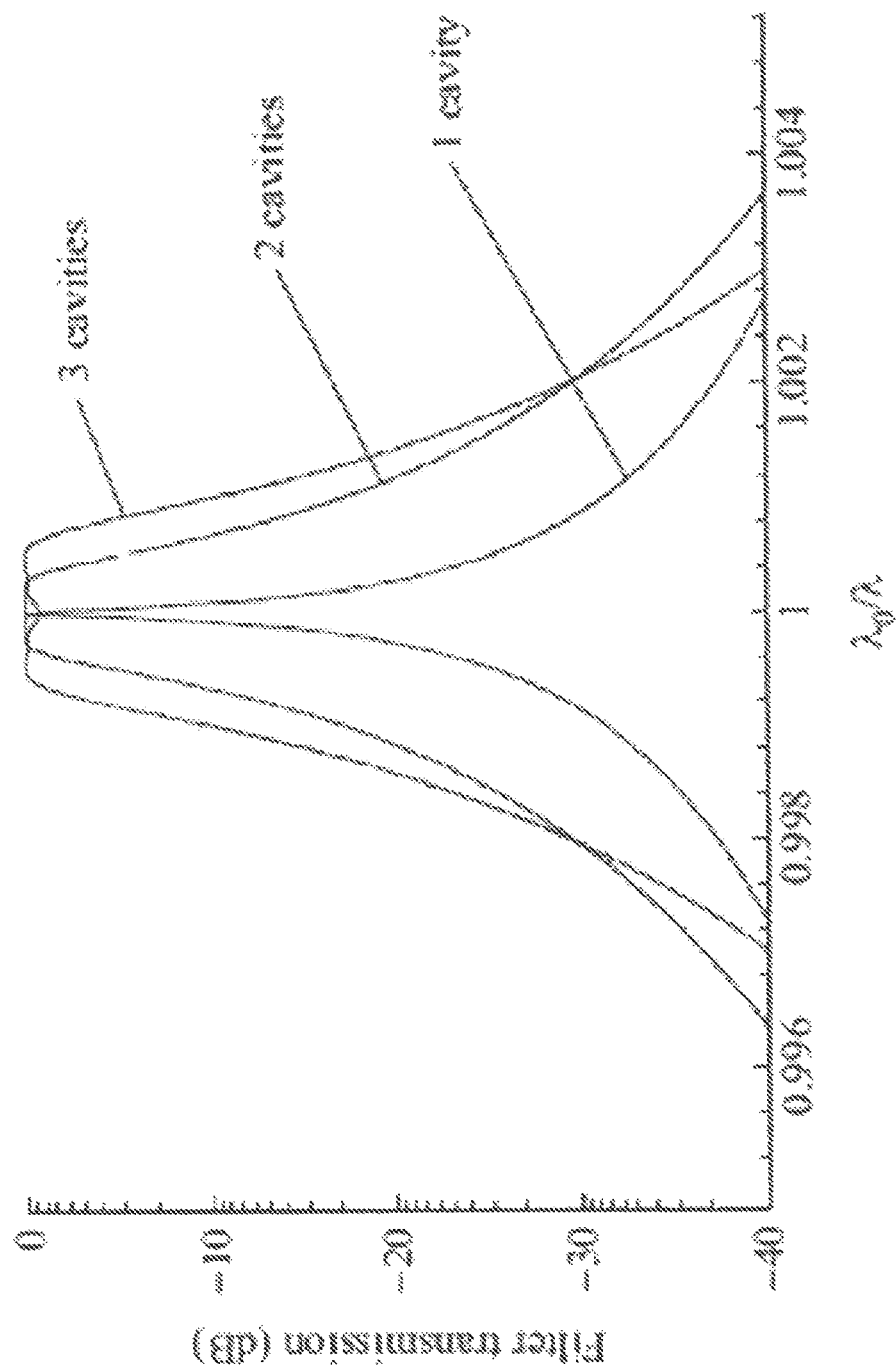
FIG. 9 is a graph depicting transmission spectra of a variety of thin-film filtering elements having various numbers of cavities.

FIG. 9 is a graph depicting transmission spectra of a variety of thin-film filtering elements having various numbers of cavities. The graph depicted in FIG. 9 depicts transmission spectra for thin-film filtering elements with one, two, and three cavities. As can be seen from the graph depicted in FIG. 9, as the number of cavities of the thin-film filtering element increases, the shape of the transmission spectrum broadens at its peak and narrows at its base. Thus, as the number of cavities increases, the fidelity of the wavelength selection provided by the thin-film filtering element increases. As can be seen from a comparison of FIGS. 7 and 9, the use of certain thin-film filtering elements can reduce the amount of optical power directed into loss channels, if only to a relatively small degree. Nevertheless, as can be seen from FIG. 9, a multi-cavity thin-film filter provides a method of increasing the amount of optical power transmitted by the filtering element and thereby limiting the amount of optical power directed into loss channels.

Figure 10:
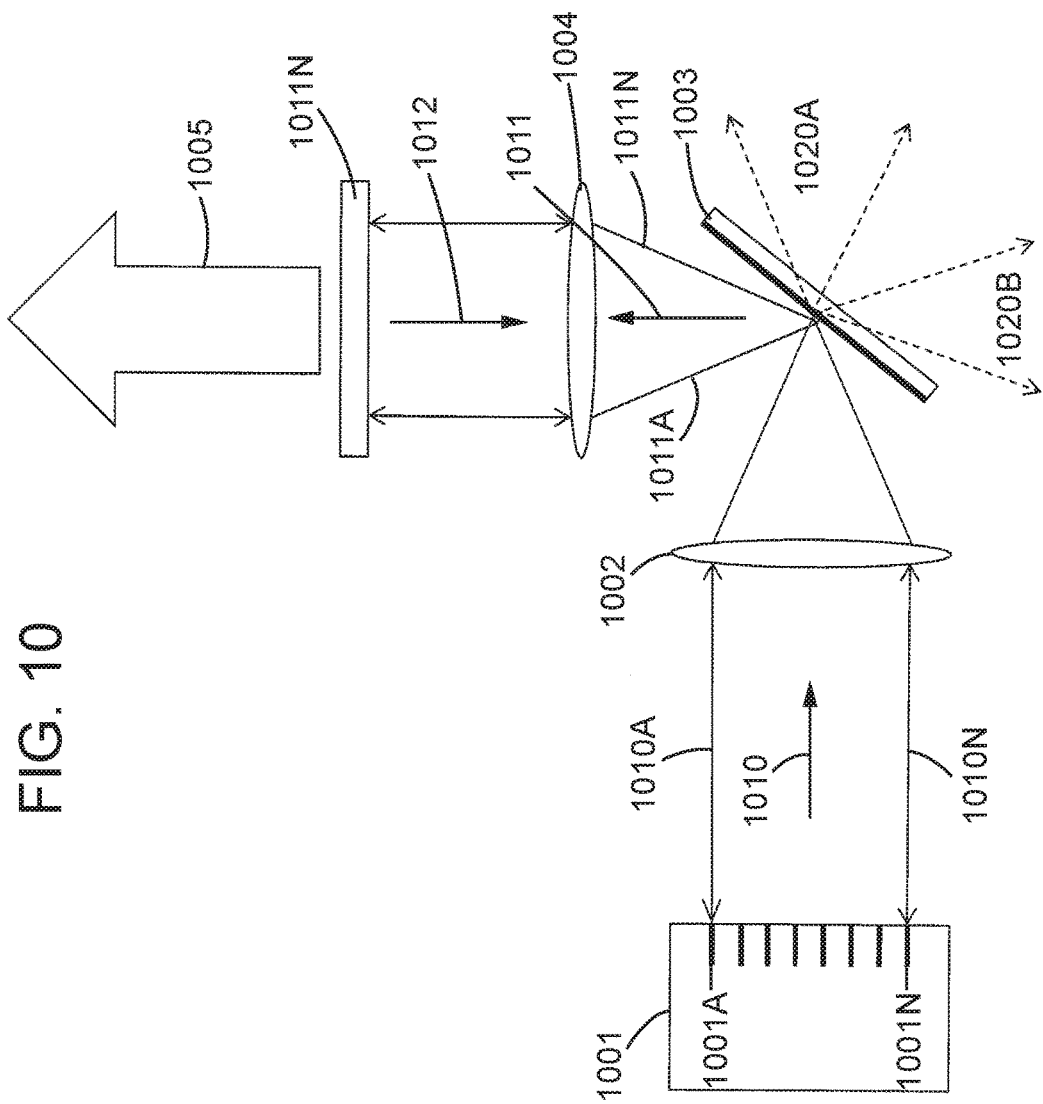
FIG. 10 illustrates a wavelength-selective external resonator that utilizes a thin-film notch filter as a wavelength selective element and a partially reflective mirror to direct resonant feedback into a plurality of emitters to facilitate beam wavelength stabilization.

FIG. 10 illustrates a wavelength-selective external resonator that utilizes a thin-film notch filter as a wavelength selective element and a partially reflective mirror to direct resonant feedback into a plurality of emitters to facilitate beam wavelength stabilization. The apparatus depicted in FIG. 10 includes a laser source 1001 having a plurality of individual emitters (e.g. individual emitters 1001A and 1001N), a first position-to-angle transformation optic 1002, a thin-film filtering element 1003, a collimating optic 1004, and a partially reflective mirror 1005. In the embodiment depicted in FIG. 10, the thin-film filtering element 1003 is a thin-film notch filter. The wavelength-selective external resonator provides resonant feedback to each of the plurality of individual emitters of the laser source 1001 in order to stabilize the wavelength of the beams emitted by the laser source 1001. Specifically, the external resonator couples photons of a specific wavelength into each individual emitter of the laser source 1001 is located and thereby induces each individual emitter to emit additional photons having the same wavelength.

The plurality of emitters of the laser source 1001 emit a plurality of beams that together constitute external resonator input, or laser source output 1010. Laser source output 1010 is therefore composed of a plurality of individual constituent beams, each of which is emitted by a single emitter in the laser source 1001. FIG. 1 depicts two particular external resonator input beams, 1010A and 1010N, emitted by emitters 1001A and 1001N. Each emitter emits optical power at a variety of wavelengths thereby producing an emission spectrum. The external resonator acts to narrow the bandwidth of the emission spectrum of each of the plurality of emitters of the laser source.

Each emitter in the laser source 1001 has a particular location with respect to the first position-to-angle transformation optic 1002. Thus, upon exiting the laser source, the laser source output 1010 has a position spectrum that corresponds to the spatial distribution of the emitters in the laser source 1001. For example, the position of constituent beam 1010A of the laser source output 1010 corresponds to the position of individual emitter 1001A while the position of the constituent beam 1010N of the unfiltered laser source output 1010 corresponds to the position of the individual emitter 1001N.

The first position-to-angle transformation optic 1002 is disposed between the laser source 1001 and the notch filter 1003. The first position-to-angle transformation optic 1002 imparts upon each constituent beam of the laser source output 1010 an angle of incidence with respect to the notch filter 1003. The angles of incidence imparted upon the constituent beams of the laser source output 1010 by the first position-to-angle transformation optic 1002 are determined by the spatial position of the constituent beams and thus the spatial position of the emitters of the laser source 1001. For example, the first position-to-angle transformation optic 1002 imparts upon the constituent beam 1010A an angle of incidence that is determined by the spatial position of the individual emitter 1001A. Therefore, after emerging from the first position-to-angle transformation optic 1002, the unfiltered laser source output 1010 possesses an angular spectrum that corresponds to the spatial distribution of the individual emitters of the laser source 1001. In the embodiment depicted in FIG. 10, the first position-to-angle transformation optic 1002 is a Fourier lens. However, in alternative embodiments, the position-to-angle transformation optic 1002 may be a Fresnel lens, a mirror arrangement, a prismatic object, or a diffraction grating. Additional optical elements capable of translating a position of an incident beam into an angle of incidence with respect to the notch filter 1003 may also be utilized.

The notch filter 1003 is positioned at the focal point of the first position-to-angle transformation optic 1002 such that the constituent beams of the laser source output 1010 are focused at a point in space that lies on the front surface of the notch filter 1003. The notch filter 1003 exhibits a transmission spectrum that is dependent upon both the wavelength of incident beams and upon the angle at which the incident beams strike the notch filter. Specifically, for a given angle of incidence, the notch filter 1003 will transmit all photons with the exception of photons having wavelengths within a very narrow band centered about a wavelength that matches the angle of incidence. The photons that are not transmitted will be reflected. Therefore, for every angle of incidence, the notch filter 1003 will reflect photons having a wavelength that falls within a very narrow band.

The transmittance properties of the notch filter 1003 enable the combination of the notch filter 1003 and the first position-to-angle transformation optic 1002 to select a preferred resonant mode for each emitter of the laser source 1001. Specifically, the position-to-angle transformation optic 1002 imparts a particular angle of incidence upon the photons emitted by each individual emitter of the laser source 1001. That is, the first position-to-angle transformation optic assigns a particular angle of incidence to each emitter of the laser source. Thereafter, for each angle of incidence (and thus for each emitter) the notch filter 1003 selects photons of a particular wavelength to be reflected. Photons of wavelengths outside of the very narrow reflection band will be transmitted by the notch filter and thereby ejected from the system as loss channels 1020A and 1020B. As a result of the transmission properties of the notch filter 1003, the reflected photons will correspond to a preferred resonant mode of the emitter from which they were generated. The reflected photons constitute beams that make up the filtered laser source output 1011.

After being reflected by the notch filter 1003, the filtered laser source output 1011 retains an angular spectrum related to the angular spectrum possessed by the laser source output 1010 upon being reflected by the notch filter 1003. The filtered laser source output 1011 consists of a plurality of single-wavelength constituent beams, e.g. constituent beam 1011A and constituent beam 1011N, each of which has an angle of reflection with respect to the notch filter 103. Additionally, each constituent beam of the filtered laser source output 1011 also has an angle of incidence with respect to the collimating optic 1004.

The collimating optic 1004 is disposed between the notch filter 1003 and the reflective element 1005. The collimating optic 1004 transforms the angular spectrum of the filtered laser source output 1011 into a position spectrum and directs the constituent beams of the filtered laser source output 1011 at the reflective element 1005. Specifically, the collimating optic 1004 maps the angle of incidence of each constituent beam of the filtered laser source output 1011 to a position at the reflective element 1005. Thus, the collimating optic 1004 projects an image onto the reflective element 1005 that corresponds to an image of the constituent beams of the laser source output 1010 leaving the laser source 1001. However, the projected image consists only of beams having wavelengths selected from the narrow reflection spectra of the notch filter 1003. In the embodiment depicted in FIG. 10, the collimating optic 1004 is a Fourier lens. However, in alternative embodiments, a variety of optical elements may be utilized as a collimating optic. For example, Fresnel lenses, mirror arrangements, prismatic objects, and diffraction gratings may all be used as collimating optics in alternative embodiments.

Upon emerging from the collimating optic 1004, the filtered laser source output 1011 propagates towards and interacts with the reflective element 1005. The reflective element 1005 reflects a portion of the filtered laser source output 1011 as resonant feedback 1012 and transmits a portion of the filtered laser source output 1011 as system output 1013. Both the resonant feedback 1012 and the system output 1013 are composed of a plurality of narrow spectral bandwidth beams. The portion of the incident optical power contained by the filtered laser source output 1011 which is transmitted by the reflective element 1005 and the portion which is not may be adjusted in order to optimize the amount of feedback provided to the laser source 1001. In general, a substantial majority of the optical power reflected by the notch filter 1003 is also transmitted by the reflective element 1005 as system output 1013. Preferably, the reflective element 1005 generally transmits at least eighty percent of the incident electromagnetic radiation as system output 1013 and generally reflects no more than twenty percent of the incident electromagnetic radiation as resonant feedback 1012.

After emerging from the reflective element 1005, the resonant feedback 1012 propagates through the collimating optic 1004 and is reflected by the notch filter 1003 towards the laser source 1001 in a direction of propagation that is opposite that of the laser source output 1010. The collimating optic 1004 imparts an angular spectrum upon the resonant feedback 1012 by imparting an angle of incidence with respect to the notch filter 1003 upon each constituent beam of the resonant feedback 1012. The angle of incidence imparted upon each constituent beams of the resonant feedback corresponds to the angle of reflection from the notch filter of the corresponding constituent beam of the filtered laser source output 1011 and therefore to the angle of incidence of the corresponding constituent beam of the laser source output 1010. Therefore, each constituent beam of the resonant feedback 1012 will have an angle of incidence and a wavelength that corresponds to a reflective band of the notch filter 1003.

After being reflected by the notch filter, the first position-to-angle transformation optic 102 transforms the angular spectrum of the resonant feedback 1012 into a position spectrum that corresponds to the spatial distribution of the plurality of emitters in the laser source 1001. Thus, the first position-to-angle transformation optic 1002 directs each constituent beam of the resonant feedback 1012 into a single emitter of the laser source 1001 thereby stimulating emission of electromagnetic radiation corresponding to the preferred resonant mode, as selected by the notch filter 1003, of each emitter of the laser source 1001.

Figure 11:
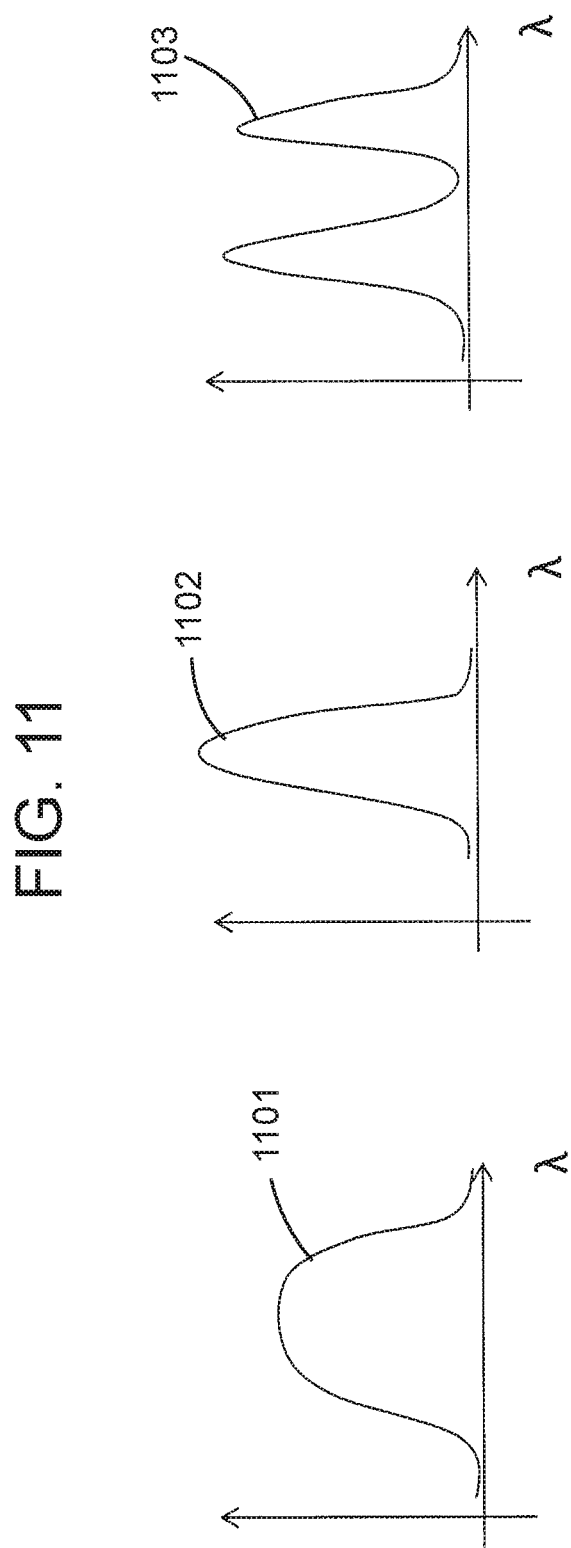
FIG. 11 is a graph depicting the bandwidth of the emission spectrum of an individual emitter in the laser source of FIG. 10, the bandwidth of the reflection spectrum of the notch filter of FIG. 10 at the angle of incidence and wavelength corresponding to the individual emitter, and the spectrum of the loss channels corresponding to the individual emitter.

FIG. 11 is a graph depicting the bandwidth of the emission spectrum of an individual emitter in the laser source of FIG. 10, the bandwidth of the transmission spectrum of the notch filter of FIG. 10 at the angle of incidence and wavelength corresponding to the individual emitter, and the spectrum of the loss channels corresponding to the individual emitter. The emission spectrum, transmission spectrum, and spectrum of the loss channels depicted in FIG. 11 all pertain to a single emitter in the laser source 1001 of FIG. 10. The curve 1101 represents an emission spectrum of an individual emitter in the laser source of FIG. 10. As can be seen, the individual emitter emits optical power at a relatively narrow range of wavelengths. The emission spectrum represented by 1101 corresponds to an individual emitter in the laser source 101 that has begun to receive feedback. Therefore, the beam corresponding to the emission spectrum represented by 1101 is of a sufficiently narrow spectral bandwidth such that it will not detract from the output beam quality of a DWBC system were it to be combined with other beams of similarly narrow spectral bandwidth.

The curve 1102 represents a transmission spectrum of the notch filter of FIG. 1 at an angle of incidence corresponding to the individual emitter in the laser source 1001 whose emission spectrum is represented by the curve 1101. As can be seen, the transmission spectrum of the notch filter is of a substantially narrower spectral bandwidth than is the emission spectrum represented by the curve 1101. A comparison of the curves 1101 and 1102 underscores the fact that an emission spectrum of an individual diode emitter in the laser source 1001 can not be made infinitely narrow through providing substantially narrower feedback. Instead, spectral broadening effects such as spectral and spatial hole burning limit the degree to which the bandwidth of the emission spectrum of an individual diode emitter can be narrowed.

The curve 1103 represents the spectrum of the loss channels 1020A and 1020B of FIG. 10. The spectrum of the loss channels represented by the curve 1103 is a product of the emission spectrum of the individual emitter represented by the curve 1101 and the transmission spectrum of the notch filter represented by the curve 1102. The spectrum of the loss channels represented by the curve 1103 demonstrates that a considerable amount of optical power produced by the individual diode emitter is ejected from the system and precluded from contributing to the power of the output beam. Although a DWBC system that eliminates substantial amounts of input optical power in favor of highly selective wavelength transmission may be useful for some applications, the poor wall-plug efficiency resulting from the arrangement depicted in FIG. 10 as demonstrated by the curve 1103 will preclude such a system from being ideal for a number of applications that require considerable beam output power.

II. DWBC Systems Utilizing Optical Power Splitting

As illustrated by FIGS. 7 and 11, the utilization of thin-film filters as wavelength selective elements in an external resonator results in the channeling of a considerable amount of optical power incident upon the thin-film filter into a loss channel and therefore out of the system. More specifically, the output beams produced by the diode lasers of the laser sources have spectral bandwidths that are considerably broader than the bandwidths of the components selected by the thin-film filters. Nevertheless, the beams emitted by the diodes are of sufficiently narrow spectral bandwidth to be combined into a high quality output beam by a beam combining element. However, in the embodiments depicted in FIGS. 1 and 10, the optical power corresponding to wavelengths emitted by the diode lasers but not selected by the thin-film elements is lost and not coupled into the system output beam nor utilized by the system as resonant feedback. The result is a substantial reduction in the overall wall plug efficiency of the DWBC system. In order to minimize optical power losses attributable to the use of a thin-film filter as a wavelength selective element, it is desirable to separate the input optical power produced by the laser source into separate components and to direct a first component to an output beam combining apparatus and to direct a second component to an external resonator to be used as wavelength stabilizing feedback. Directing a substantial majority of the input optical power to the output beam combining apparatus without first passing it through a thin-film filter enables a considerable reduction in the losses attributable to wavelength filtering via the thin-film filter. Meanwhile, performing wavelength selection with the remaining minority optical power is capable of producing sufficient feedback to achieve the input beam wavelength stabilization necessary for the production of a high quality combined output beam.

FIGS. 12-21 illustrate a variety of wavelength stabilization systems, each capable of being utilized as a component in a DWBC system, that separate input optical power into a first component to be filtered and used for resonant feedback and a second component to be coupled into a beam combining apparatus. FIGS. 12-21 illustrate wavelength stabilization systems that include a laser source, a means for beam splitting, a means for directing a portion of the optical power produced by the laser source towards an output beam coupling element, and a resonant feedback branch that includes a thin-film filtering element. In some implementations, a single component of the system serves multiple functions. For example, a single component may serve as both a means for beam splitting and a means for output beam coupling. As depicted in FIGS. 12-21, the laser sources are arrays of individual diode laser emitters. However, in alternative embodiments, the individual laser emitters may be diode lasers, fiber lasers, solid-state lasers, or any other type of lasers. The arrays of diode laser emitters may be one dimensional arrays or two dimensional arrays. Diode laser emitters typically emit beams with an asymmetric beam profile having two axes along which the beam diverges at disparate rates. The two axes are perpendicular to one another and perpendicular to the direction in which the beam propagates. A first of the two axes can be identified as a fast axis along which the beam diverges more rapidly, and the second of the two axes can be identified as a slow axis, along which the beam diverges comparatively more slowly. Although not depicted in any of FIGS. 12-21, a variety of optical elements may be used to manipulate the beams emitted by the individual diode emitters prior to the beams interacting with the elements depicted in FIGS. 12-21. Such manipulation may be referred to as preprocessing, and a variety of prior art literature discusses techniques for preprocessing beams emitted by diode laser emitters. Preprocessing may be performed to ensure production of a high-quality multi-spectral combined output beam. For example, beams may be rotated such that downstream processing is performed along a fast axis rather than along a slow axis.

Furthermore, the wavelength stabilization systems illustrated in FIGS. 12-21 contain a number of optical elements that impart an angle of incidence with respect to a particular component upon one or more of the input beams emitted by the diode laser emitters of the laser source. In FIGS. 12-21, such position-to-angle transformative elements are depicted as Fourier lenses. However, a variety of alternative possibilities that include Fresnel lenses, prismatic objects, and mirror configurations may be used to achieve the same effect.

Figure 12:
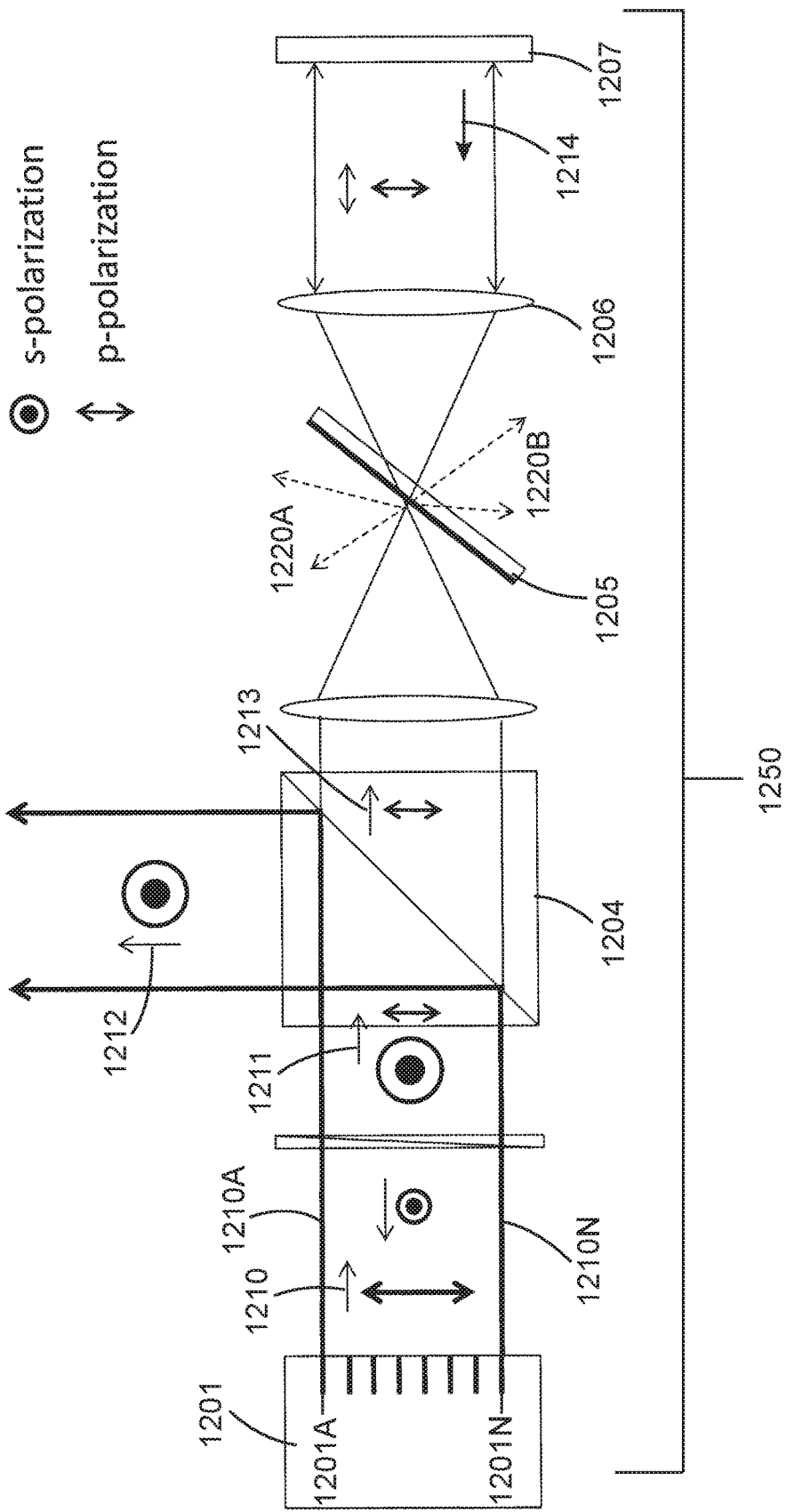
FIG. 12 illustrates a wavelength-stabilization system, capable of use in a DWBC apparatus, that utilizes a beam-splitting polarizer to direct an optical feedback component into a wavelength selective feedback-branch that utilizes a thin-film etalon as a wavelength selective element.

FIG. 12 illustrates a wavelength-stabilization system, capable of use in a DWBC apparatus, that utilizes a beam-splitting polarizer to direct an optical feedback component into an external resonator that utilizes a thin-film etalon as a wavelength selective element. The wavelength stabilization system depicted in FIG. 12 includes a laser source 1201, a polarizing element 1202, a beam-splitting polarizer 1203, a position-to-angle transformation optic 1204, a thin-film etalon 1205, a collimating optic 1206, and a high-reflective element 1207. The wavelength stabilization system also includes a wavelength-selective external resonator 1250. The wavelength-selective external resonator 1250 is defined by the optical path from the laser source 1201 through the polarizing element 1202, the beam-splitting polarizer 1203, the position-to-angle transformation optic 1204, the etalon 1205, the collimating optic 1206, and the reflective element 1207. The etalon 1205 serves as a wavelength-selective element for the wavelength-selective external resonator 1250. The wavelength-selective external resonator 1250 provides wavelength stabilizing feedback to the laser source 1201 to promote the emission of photons of preferred wavelengths by the laser source 1201.

The laser source 1201 emits a plurality of individual beams that together constitute laser source output 1210, which also serves as an external resonator input. Each of the plurality of beams is emitted by a single emitter in the laser source 1201. FIG. 12 depicts two particular unfiltered laser source output beams, 1210A and 1210N, emitted by emitters 1201A and 1201N. Each emitter in the laser source 1201 has a particular spatial location. The plurality of spatial locations at which each of the emitters of the laser source 1201 are located together define a spatial distribution. Upon exiting the laser source, the unfiltered laser source output 1210 has a position spectrum that corresponds to the spatial distribution of the emitters in the laser source 1201. For example, the position of constituent beam 1210A of the unfiltered laser source output 1210 corresponds to the position of individual emitter 1201A while the position of the constituent beam 1210N of the unfiltered laser source output 1210 corresponds to the position of the individual emitter 1201N.

The polarizing element 1202 is positioned in the optical path of the unfiltered laser source output 1210. The polarizing element 1202 imparts a polarization upon each of the constituent beams of the unfiltered laser source output 1210. In the embodiment depicted in FIG. 12, the polarizing element 1202 is a half wave plate. However, a variety of polarizing elements including but not limited to quarter-wave plates, linear polarizers, crystal polarizers, thin-film polarizers, and various combinations thereof may be utilized as the polarizing element 1202 (which may be referred to as a polarizing system where multiple elements are utilized in combination). Upon emerging from the polarizing element 1202, the constituent beams of the laser source output 1210 are polarized and together compose polarized laser source output 1211. In the embodiment depicted in FIG. 12, the polarized laser source output 1211 is linearly polarized at an angle that includes two components aligned along orthogonal polarization axes defined as an s-polarization axis and a p-polarization axis.

The beam-splitting polarizer 1203 splits the polarized laser source output 1211 into two separate components: an s-polarization component and a p-polarization component. A first component is directed into a feedback branch 1260 as a feedback branch input 1213 (in FIG. 12, the p-polarization component), while a second component is directed out of the system as output beam 1212 (in FIG. 12, the s-polarization component). The angle of polarization imparted upon the constituent beams of the polarized laser source output 1211 by the polarizing element 1202 determines the proportion of the polarized laser source output 1211 aligned along the s-polarization axis and the proportion aligned along the p-polarization axis. Therefore, the polarizing element 1202 determines the proportion of incident optical power directed into the output beam 1212 and directed into the feedback branch input 1213. Generally, it is preferable that at least eighty percent of the optical power of the laser source output 1210 is directed into the output beam 1212. However, in order to provide output beams of increased brightness, it is desirable to direct ninety percent or greater of the incident power of the laser source output 1210 into the output beam 1212.

After emerging from the beam-splitting polarizer 1203, the feedback branch input interacts with the position-to-angle transformation optic 1204. The position-to-angle transformation optic 1204 is disposed between the beam-splitting polarizer 1203 and the etalon 1205. The position-to-angle transformation optic 1204 imparts upon each constituent beam of the feedback branch input 1213 an angle of incidence with respect to the etalon 1205. The angles of incidence imparted upon the constituent beams of the feedback branch input by the position-to-angle transformation optic 1204 are determined by the spatial positions of the constituent beams. Therefore, after emerging from the position-to-angle transformation optic 1204, the feedback branch input 1213 possesses an angular spectrum that corresponds to the spatial distribution of the individual emitters of the laser source 1201. In the embodiment depicted in FIG. 12, the position-to-angle transformation optic 1204 is a Fourier lens. However, in alternative embodiments, the position-to-angle transformation optic 1204 may be a Fresnel lens, a mirror arrangement, or a prismatic object.

The etalon 1205 is positioned at the focal point of the first position-to-angle transformation optic 1204 such that the constituent beams of the feedback branch input 1213 are focused at a point in space that lies on the front surface of the etalon 1205. The etalon 1205 exhibits a transmission spectrum that is dependent upon both the wavelength of incident beams and upon the angle at which the incident beams strike the etalon 1205. Specifically, for a given angle of incidence, the etalon 1205 will only transmit photons having wavelengths that correspond to a very narrow band of wavelengths corresponding to a transmission band of the etalon.

The transmittance properties of the etalon 1205 enable the combination of the etalon 1205 and the position-to-angle transformation optic 1204 to select a preferred resonant mode for each emitter of the laser source 1201. Specifically, the position-to-angle transformation optic 1204 imparts a particular angle of incidence upon the photons emitted by each individual emitter of the laser source 1201. That is, the position-to-angle transformation optic assigns a particular angle of incidence to each emitter of the laser source 1201. Thereafter, for each angle of incidence (and thus for each emitter) the etalon 1205 selects photons of a particular wavelength for transmission. Photons of wavelengths that do not correspond to a particular resonant mode of the etalon will be reflected out of the resonator as loss channels 1220A and 1220B.

The transmission properties of the etalon 1205 thereby assign a preferred resonant mode to each emitter in the laser source 1201. Specifically, the photons emerging from the etalon 1205 all have wavelengths selected from a very narrow band defining a preferred resonant mode of the emitter from which they were generated. After being transmitted by the etalon 1205, the constituent beams of the laser source feedback 1214 interact with the collimating optic 1206. The collimating optic 1206 is disposed between the etalon 1205 and the reflective element 1207. The collimating optic 1206 transforms the angular spectrum of the laser source feedback (which is inherited from the feedback branch input 1213) into a position spectrum and directs the constituent beams of the laser source feedback 1214 at the reflective element 1207. Specifically, the collimating optic 1206 maps the angle of incidence of each constituent beam of the laser source feedback 1214 to a position at the reflective element 1207. Thus, the collimating optic 1206 projects an image onto the reflective element 1207 that corresponds to an image of the beams leaving the laser source 1201. In the embodiment depicted in FIG. 12, the collimating optic 1204 is a Fourier lens. However, in alternative embodiments, a variety of optical elements may be utilized as a collimating optic. For example, Fresnel lenses, mirror arrangements, and diffraction gratings may all be used as collimating optics in alternative embodiments.

Upon emerging from the collimating optic 1204, the laser source feedback 1214 propagates towards and interacts with the reflective element 1207. In the embodiment depicted in FIG. 12, the reflective element 1207 is a highly reflective mirror. The highly reflective mirror reflects the laser source feedback 1214 thereby directing the laser source feedback 1214 back through the feedback branch 1260. Specifically, the laser source feedback 1214 propagates through the collimating optic 1206, the etalon 1205, the position-to-angle transformation optic 1204, the beam-splitting polarizer 1203, and the polarizing element 1202 towards the laser source 1201. During the reverse path propagation of the laser source feedback 1214, the collimating optic 1206 imparts an angular spectrum upon the laser source feedback 1214 by imparting an angle of incidence with respect to the etalon 1205 upon each constituent beam of the laser source feedback 1214. The angle of incidence imparted upon each constituent beam of the laser source feedback 1214 corresponds to the angle of incidence of the corresponding constituent beam of the feedback branch input 1213. Therefore, each constituent beam of the laser source feedback 1214 will have an angle of incidence and a wavelength that corresponds to a transmission peak of the etalon 1205. Thus, the etalon 1205 will be transparent to the laser source feedback 1214.

After passing through the etalon 1205, the position-to-angle transformation optic 1204 transforms the angular spectrum of the laser source feedback 1214 into a position spectrum that corresponds to the spatial distribution of the plurality of emitters in the laser source 1201. Thus, the position-to-angle transformation optic 1204 thereby directs each constituent beam of the laser source feedback 1214 through the beam-splitting polarizer 1203 and the polarizing element 1202 into a single emitter of the laser source 1201 thereby stimulating emission of electromagnetic radiation corresponding to the preferred resonant mode, as selected by the etalon 1205, of each emitter of the laser source 1201.

Figure 13:
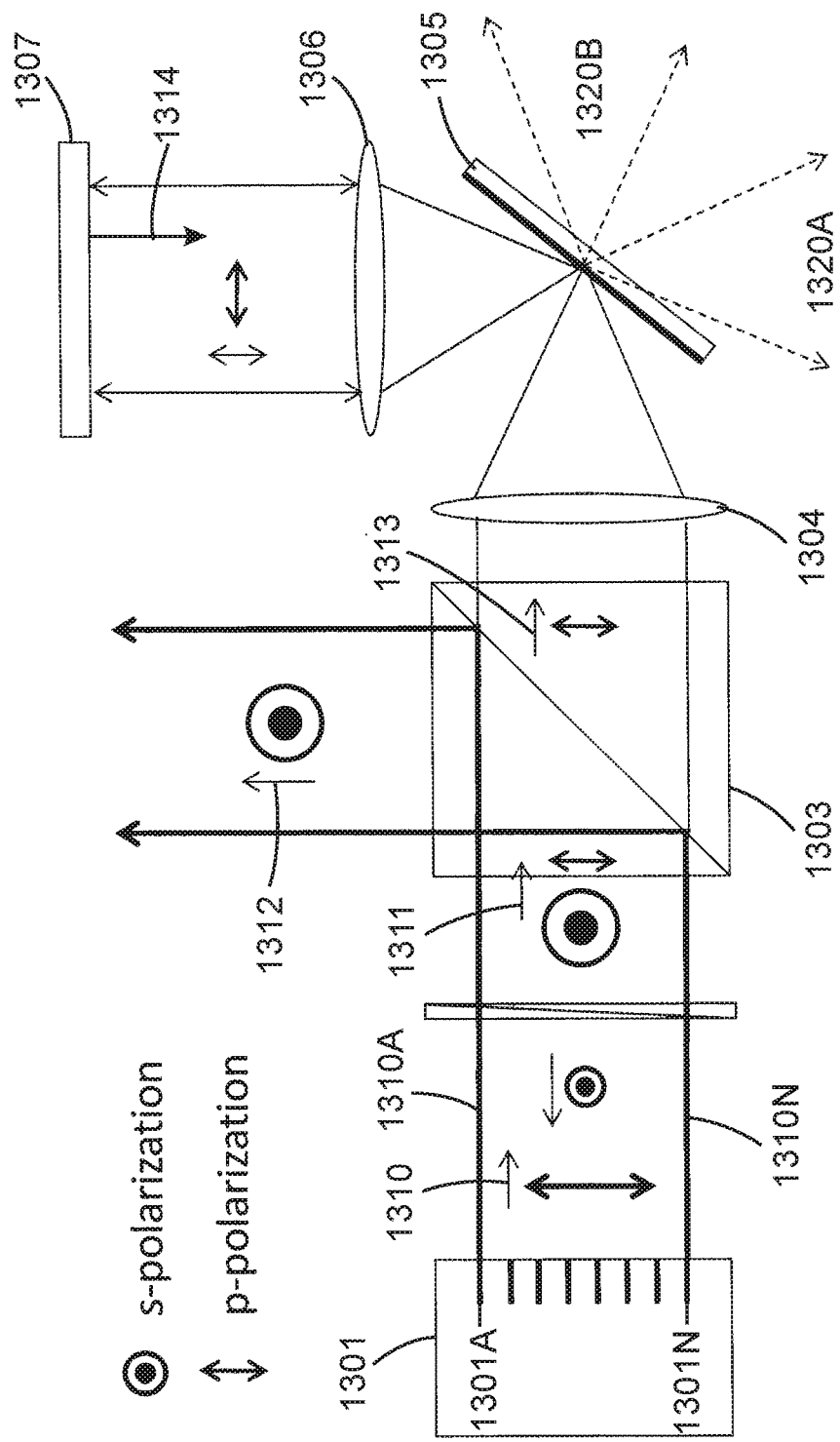
FIG. 13 illustrates a wavelength stabilization system, capable of use in a DWBC apparatus, that utilizes a beam-splitting polarizer to direct an optical feedback component into a wavelength selective feedback-branch that utilizes a thin-film notch filter as a wavelength selective element.

FIG. 13 illustrates a wavelength-stabilization system, capable of use in a DWBC apparatus, that utilizes a beam-splitting polarizer to direct an optical feedback component into a feedback-branch that utilizes a thin-film notch filter as a wavelength selective element. The wavelength stabilization system depicted in FIG. 13 includes a laser source 1301, a polarizing element 1302, a beam-splitting polarizer 1303, a position-to-angle transformation optic 1304, a thin-film notch filter 1305, a collimating optic 1306, and a high-reflective element 1307. The wavelength stabilization system also includes a wavelength-selective external resonator 1350. The wavelength-selective external resonator 1350 is defined by the optical path from the laser source 1301 through the polarizing element 1302, through the beam-splitting polarizer 1303, through the position-to-angle transformation optic 1304, to the notch filter 1305, through the collimating optic 1306, and to the reflective element 1307. The notch filter 1305 serves as a wavelength-selective element for the wavelength-selective external resonator 1350. The wavelength-selective external resonator 1350 provides wavelength stabilizing feedback to the laser source 1301 to promote the emission of photons of preferred wavelengths by the laser source 1301.

The laser source 1301 emits a plurality of individual beams that together constitute laser source output 1310, which also serves as an external resonator input. Each of the plurality of beams is emitted by a single emitter in the laser source 1301. FIG. 13 depicts two particular unfiltered laser source output beams, 1310A and 1310N, emitted by emitters 1301A and 1301N. Each emitter in the laser source 1301 has a particular spatial location. The plurality of spatial locations at which each of the emitters of the laser source 1301 are located together define a spatial distribution. Upon exiting the laser source, the unfiltered laser source output 1310 has a position spectrum that corresponds to the spatial distribution of the emitters in the laser source 1301. For example, the position of constituent beam 1310A of the unfiltered laser source output 1310 corresponds to the position of individual emitter 1301A while the position of the constituent beam 1310N of the unfiltered laser source output 1310 corresponds to the position of the individual emitter 1301N.

The polarizing element 1302 is positioned in the optical path of the unfiltered laser source output 1310. The polarizing element 1302 imparts a polarization upon each of the constituent beams of the unfiltered laser source output 1310. In the embodiment depicted in FIG. 13, the polarizing element 1302 is a half wave plate. However, a variety of polarizing elements including but not limited to quarter-wave plates, linear polarizers, crystal polarizers, thin-film polarizers, and various combinations thereof may be utilized as the polarizing element 1302 (which may be referred to as a polarizing system where multiple elements are utilized in combination). Upon emerging from the polarizing element 1302, the constituent beams of the laser source output 1310 are polarized and together compose polarized laser source output 1311. In the embodiment depicted in FIG. 13, the polarized laser source output 1311 is linearly polarized at an angle that includes two components aligned along orthogonal polarization axes defined as an s-polarization axis and a p-polarization axis.

The beam-splitting polarizer 1303 splits the polarized laser source output 1311 into two separate components: an s-polarization component and a p-polarization component. A first component is directed into a feedback branch 1360 as a feedback branch input 1313 (in FIG. 13, the p-polarization component), while a second component is directed out of the system as the output beam 1312 (in FIG. 13, the s-polarization component). The angle of polarization imparted upon the constituent beams of the polarized laser source output 1311 by the polarizing element 1302 determines the proportion of the polarized laser source output 1311 aligned along the s-polarization axis and the proportion aligned along the p-polarization axis. Therefore, the polarizing element 1302 determines the proportion of incident optical power directed into the output beam 1312 and directed into the feedback branch input 1313. Generally, it is preferable that at least eighty percent of the optical power of the laser source output 1310 is directed into the output beam 1312. However, in order to provide combined output beams of increased brightness, it is desirable to direct ninety percent or greater of the incident power of the laser source output 1310 into the output beam 1312.

After emerging from the beam-splitting polarizer 1303, the feedback branch input interacts with the position-to-angle transformation optic 1304. The position-to-angle transformation optic 1304 is disposed between the beam-splitting polarizer 1303 and the notch filter 1305. The position-to-angle transformation optic 1304 imparts upon each constituent beam of the feedback branch input 1313 an angle of incidence with respect to the notch filter 1305. The angles of incidence imparted upon the constituent beams of the feedback branch input by the position-to-angle transformation optic 1304 are determined by the spatial positions of the constituent beams. Therefore, after emerging from the position-to-angle transformation optic 1304, the feedback branch input 1313 possesses an angular spectrum that corresponds to the spatial distribution of the individual emitters of the laser source 1301. In the embodiment depicted in FIG. 13, the position-to-angle transformation optic 1304 is a Fourier lens. However, in alternative embodiments, the position-to-angle transformation optic 1304 may be a Fresnel lens, a mirror arrangement, and a diffraction grating.

The notch filter 1305 is positioned at the focal point of the first position-to-angle transformation optic 1304 such that the constituent beams of the feedback branch input 1313 are focused at a point in space that lies on the front surface of the notch filter 1305. The notch filter 1305 exhibits a reflection spectrum that is dependent upon both the wavelength of incident beams and upon the angle at which the incident beams strike the notch filter 1305. Specifically, for a given angle of incidence, the notch filter 1305 will only reflect photons having wavelengths that correspond to a very narrow band of wavelengths corresponding to a reflection band of the notch filter. Photons of other wavelengths will be transmitted through the notch filter 1305 as one of loss channels 1320A and 1320B.

The reflection properties of the notch filter 1305 enable the combination of the notch filter 1305 and the position-to-angle transformation optic 1304 to select a preferred resonant mode for each emitter of the laser source 1301. Specifically, the position-to-angle transformation optic 1304 imparts a particular angle of incidence upon the photons emitted by each individual emitter of the laser source 1301. That is, the position-to-angle transformation optic assigns a particular angle of incidence to each emitter of the laser source 1301. Thereafter, for each angle of incidence (and thus for each emitter) the notch filter 1305 selects photons of a particular wavelength for reflection. Photons of wavelengths that do not correspond to a particular resonant mode of the notch filter will be transmitted through the notch filter and out of the resonator as loss channels 1320A and 1320B.

The reflection properties of the notch filter 1305 thereby assign a preferred resonant mode to each emitter in the laser source 1301. Specifically, the photons reflected by the notch filter 1305 all have wavelengths selected from a very narrow band defining a preferred resonant mode of the emitter from which they were generated. After being reflected by the notch filter 1305, the constituent beams of the laser source feedback 1314 interact with the collimating optic 1306. The collimating optic 1306 is disposed between the notch filter 1305 and the reflective element 1307. The collimating optic 1306 transforms the angular spectrum of the laser source feedback (which is inherited from the feedback branch input 1313) into a position spectrum and directs the constituent beams of the laser source feedback 1314 at the reflective element 1307. Specifically, the collimating optic 1306 maps the angle of incidence of each constituent beam of the laser source feedback 1314 to a position at the reflective element 1307. Thus, the collimating optic 1306 projects an image onto the reflective element 1307 that corresponds to an image of the beams leaving the laser source 1301. In the embodiment depicted in FIG. 13, the collimating optic 1304 is a Fourier lens. However, in alternative embodiments, a variety of optical elements may be utilized as a collimating optic. For example, Fresnel lenses, mirror arrangements, and diffraction gratings may all be used as collimating optics in alternative embodiments.

Upon emerging from the collimating optic 1304, the laser source feedback 1314 propagates towards and interacts with the reflective element 1307. In the embodiment depicted in FIG. 13, the reflective element 1307 is a highly reflective mirror. The highly reflective mirror reflects the laser source feedback 1314 thereby directing the laser source feedback 1314 back through the feedback branch 1360. Specifically, the laser source feedback 1314 propagates through the collimating optic 1306, is reflected by the notch filter 1305 towards the position-to-angle transformation optic 1304, propagates through the position-to-angle transformation optic 1304, the beam-splitting polarizer 1303, and the polarizing element 1302 towards the laser source 1301. During the reverse path propagation of the laser source feedback 1314, the collimating optic 1306 imparts an angular spectrum upon the laser source feedback 1314 by imparting an angle of incidence with respect to the notch filter 1305 upon each constituent beam of the laser source feedback 1314. The angle of incidence imparted upon each constituent beam of the laser source feedback 1314 corresponds to the angle of incidence of the corresponding constituent beam of the feedback branch input 1313. Therefore, each constituent beam of the laser source feedback 1314 will have an angle of incidence and a wavelength that corresponds to a reflection peak of the notch filter 1305. Thus, the notch filter 1305 will reflect the laser source feedback 1314.

After being reflected by the notch filter 1305, the position-to-angle transformation optic 1304 transforms the angular spectrum of the laser source feedback 1314 into a position spectrum that corresponds to the spatial distribution of the plurality of emitters in the laser source 1301. Thus, the position-to-angle transformation optic 1304 thereby directs each constituent beam of the laser source feedback 1314 through the beam-splitting polarizer 1303 and the polarizing element 1302 into a single emitter of the laser source 1301 thereby stimulating emission of electromagnetic radiation corresponding to the preferred resonant mode, as selected by the notch filter 1305, of each emitter of the laser source 1301.

Figure 14:
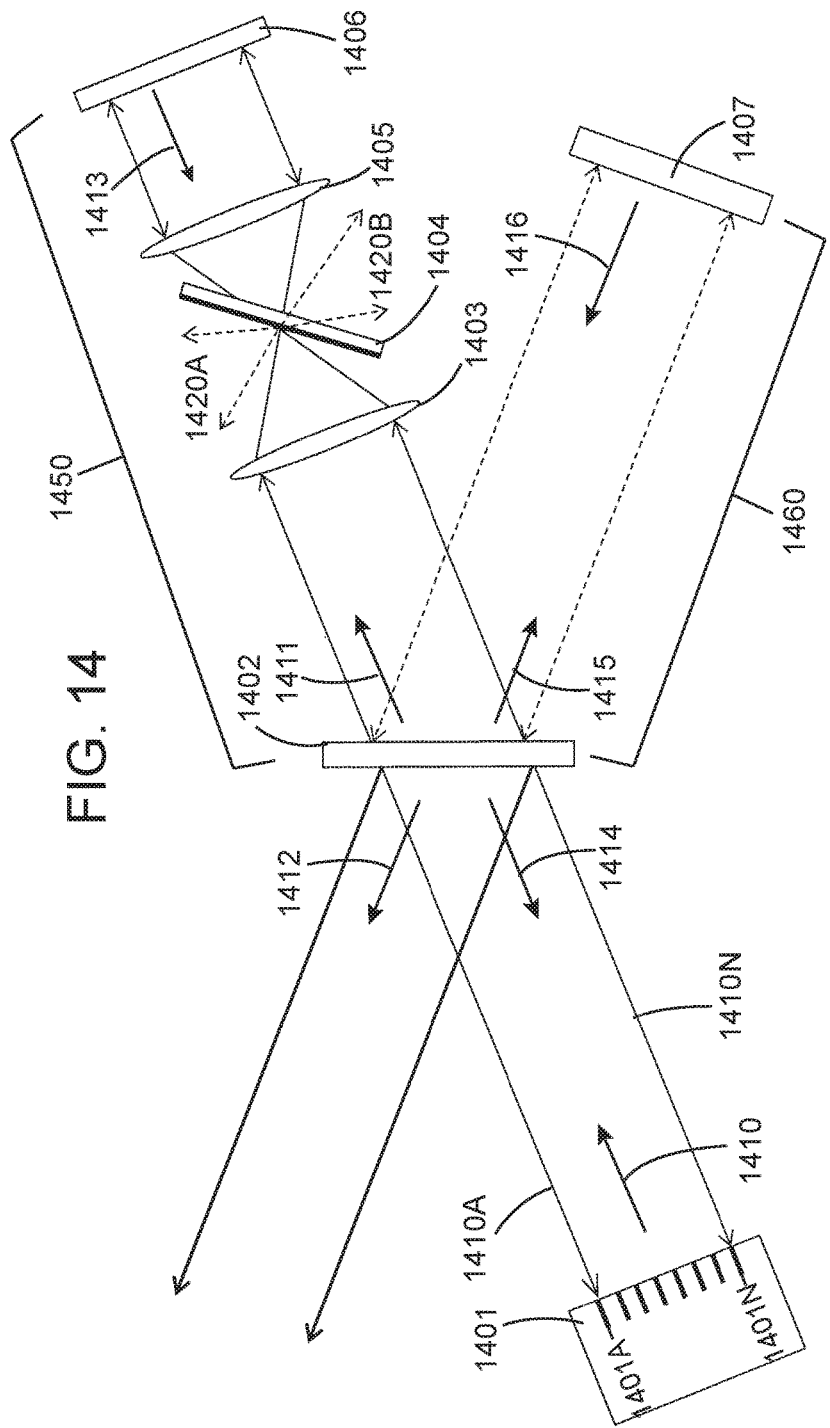
FIG. 14 illustrates a wavelength stabilization system, capable of use in a DWBC apparatus, that utilizes a partially reflective mirror of high reflectivity to direct an optical feedback component into a feedback-branch that utilizes a thin-film etalon as a wavelength selective element.

FIG. 14 illustrates a wavelength-stabilization system, capable of use in a DWBC apparatus, that utilizes a partially reflective element of high reflectivity to direct an optical feedback component into a feedback-branch that utilizes a thin-film etalon as a wavelength selective element. The apparatus depicted in FIG. 14 includes a laser source 1401 that includes a plurality of individual emitters (e.g. 1401A and 1401N), a partially reflective element 1402, a first position-to-angle transformation optic 1403, a thin-film etalon 1404, a second position-to-angle transformation optic 1405, a first highly reflective mirror 1406, and a second highly reflective mirror 1407. In the embodiment depicted in FIG. 14, the optical path between the laser source 1401 and the first and second highly reflective mirrors 1406 and 1407 defines a wavelength selective external resonator. The external resonator depicted in FIG. 14 includes wavelength selective branch 1450 and a power recycling branch 1460. The external resonator receives input beams from the laser source 1401, filters components of the input beams that correspond to undesired wavelengths, and images the input beams back onto the laser source 1401 in order to provide resonant feedback to the laser source 1401 and thereby facilitate beam wavelength stabilization.

The plurality of emitters of the laser source 1401 emit a plurality of beams that together constitute external resonator input 1410. External resonator input 1410 is therefore composed of a plurality of individual component beams, each of which is emitted by a single emitter in the laser source 1401. Prior to receiving any feedback, the individual emitters of the laser source 1401 produce a relatively broad emission spectrum (as compared to individual emitters that receive feedback). More specifically, the individual emitters of the laser source 1401 produce optical power corresponding to a relatively broad range of wavelengths. However, as optical power propagates through the external resonator cavity and resonant feedback is transmitted back into the emitters, the emission spectrum produced by each of the individual emitters narrows considerably.

FIG. 14 depicts two particular external resonator input component beams, 1410A and 1410N, which are emitted by emitters 1401A and 1401N, respectively. The emission spectrum of component beams 1410A and 1410N exhibits a narrow peak about a particular wavelength where the wavelength corresponds to the wavelength of the feedback selected for emitters 1410A and 1410N by the external resonator cavity.

The component beams of the external resonator input 1410 are directed from the laser source 1401 towards the partially reflective element 1402. In the embodiment depicted in FIG. 14, the partially reflective element 1402 is a partially reflective mirror that transmits a substantial minority of the incident optical power as a first feedback arm input 1411 and that reflects a substantial majority of incident optical power as an output arm component 1412. In various implementations, partially reflective elements of various reflectivity may be utilized. However, in the configuration depicted in FIG. 14, the partially reflective mirror should reflect at least seventy percent of the incident optical power. Depending on the characteristics of the system and the applications for which the DWBC system will be used, it may be preferable to utilize an partially reflective optical element that reflects ninety percent or greater of the incident optical power.

After being transmitted through the partially reflective element 1402, the first feedback arm input 1411 travels through the first position-to-angle transformation optic 1403. The first position-to-angle transformation optic 1403 imparts an angle of incidence with respect to the thin-film etalon 1404 upon each component beam of the first feedback arm input. The particular angle of incidence imparted upon each component beam is determined by the spatial position of the individual emitter in the laser source 1401 that emitted the component beam.

The etalon 1404 is positioned at the focal point of the first position-to-angle transformation optic 1403 such that the component beams of the feedback arm input 1411 are focused at a point in space that lies on the front surface of the etalon 1404. For a particular angle of incidence, the transmission spectrum of the etalon 1404 exhibits a very narrow peak at a particular wavelength. Therefore, for each component beam of the first feedback arm input 1411, only a very small component of the optical power corresponding to a very narrow wavelength range will be transmitted while the remaining optical power will be reflected out of the system and into one of the loss channels 1420A and 1420B.

The components of the first feedback arm input 1411 that are transmitted by the etalon subsequently propagate through the second position-to-angle transformation lens 1405, which images the component beams of the laser source output 1401 onto the first highly reflective element 1406. The first highly reflective element 1406 reflects the transmitted components of the first feedback arm input 1411 as first feedback arm output 1413. First feedback arm output propagates back through the first feedback arm until it reaches the partially reflective mirror. Upon reaching the partially reflective mirror, the first feedback arm output is split into two separate components. A first component is transmitted through the partially reflective mirror and subsequently travels back towards the plurality of diode laser emitters as a resonant feedback component 1414. A second component is reflected by the partially reflective mirror and directed towards the second highly reflective element as a power recycling arm input 1415. The power recycling arm input is reflected by the second highly reflective element 1407 and directed back towards the partially reflective element 1402 as power recycling arm output 1416. A portion of the power recycling arm output 1416 is transmitted by the partially reflective element 1402 as additional output arm input 1412, while a separate portion of the optical power of the power recycling arm output 1416 is reflected as additional first feedback arm input 1411. Therefore, a component of the beams continues traveling back and forth through the first feedback arm and the power recycling arm. Thus, an interferometer is formed by the partially reflective element 1402, the first highly reflective element 1406, and the second highly reflective element 1407.

Figure 15:
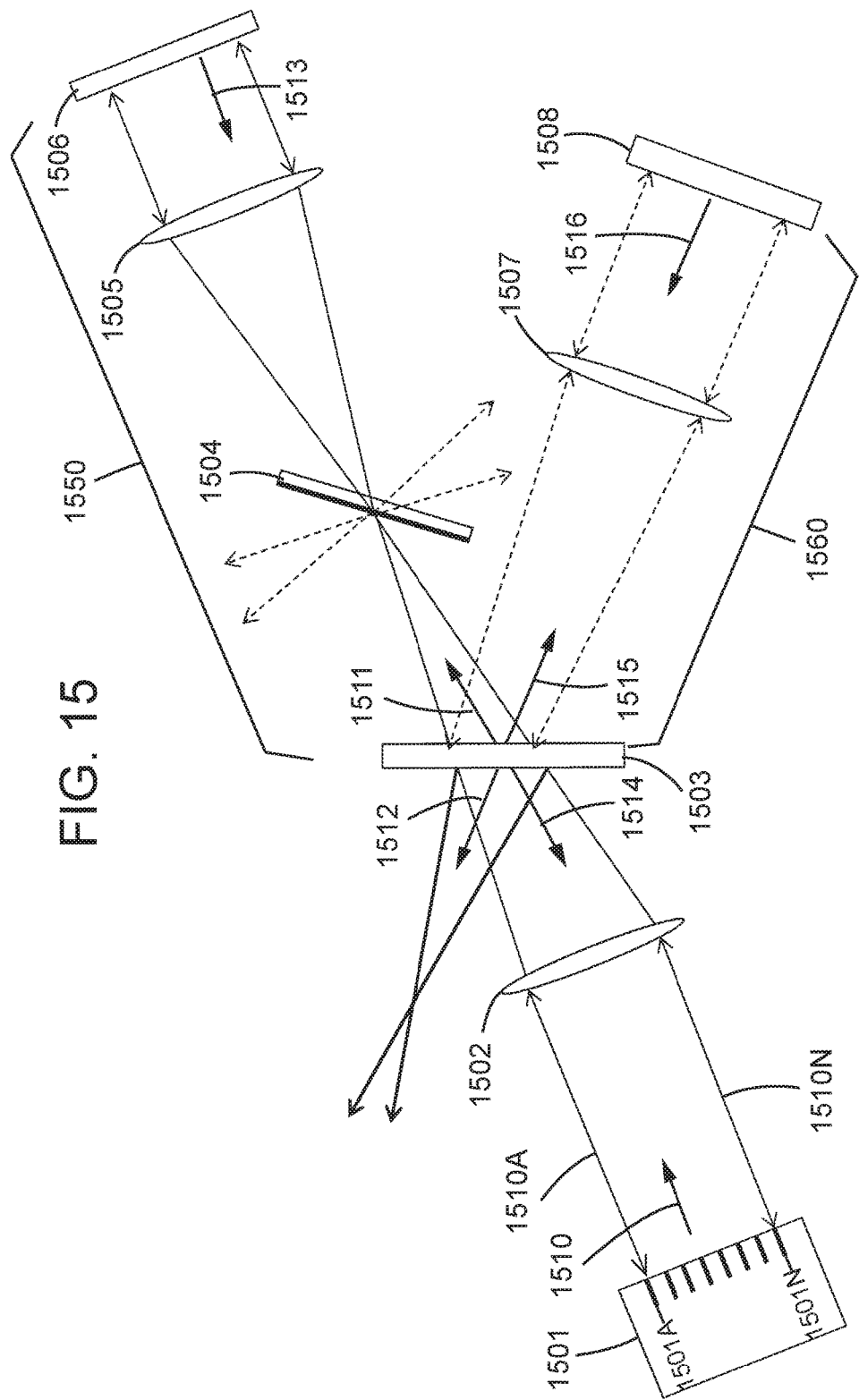
FIG. 15 illustrates an alternative wavelength stabilization system, capable of use in a DWBC apparatus, that utilizes a partially reflective mirror of high reflectivity to direct an optical feedback component into a feedback-branch that utilizes a thin-film etalon as a wavelength selective element.

FIG. 15 illustrates an alternative wavelength-stabilization system, capable of use in a DWBC apparatus, that utilizes a partially reflective mirror of high reflectivity to direct an optical feedback component into a wavelength selective a feedback-branch that utilizes a thin-film etalon as a wavelength selective element. The apparatus depicted in FIG. 15 includes a laser source 1501 that includes a plurality of individual emitters (e.g. 1501A and 1501N), a first position-to-angle transformation optic 1502, a partially reflective element 1503, a thin-film etalon 1504, a second position-to-angle transformation optic 1505, a first highly reflective mirror 1506, a third position-to-angle transformation optic 1507, and a highly reflective mirror 1508. In the embodiment depicted in FIG. 15, the optical path between the laser source 1501 and the first and second highly reflective mirrors 1506 and 1508 defines a wavelength selective external resonator. The external resonator depicted in FIG. 15 includes wavelength selective branch 1550 and a power recycling branch 1560. The external resonator receives input beams from the laser source 1501, filters components of the input beams that correspond to undesired wavelengths, and images the input beams back onto the laser source 1501 in order to provide resonant feedback to the laser source 1501 and thereby facilitate beam wavelength stabilization.

In the embodiment depicted in FIG. 15, the laser source 1501 consists of a plurality of spatially separated individual diode laser emitters. The plurality of emitters of the laser source 1501 emit a plurality of beams that together constitute external resonator input 1510. External resonator input 1510 is therefore composed of a plurality of individual component beams, each of which is emitted by a single emitter in the laser source 1501. Prior to receiving any feedback, the individual emitters of the laser source 1501 have a relatively broad emission spectrum (as compared to the individual emitters after receiving feedback). More specifically, prior to receiving feedback from the external resonator, the individual emitters of the laser source 1501 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 15 depicts two particular external resonator input component beams, 1510A and 1510N, which are emitted by emitters 1501A and 1501N, respectively. Emitters 1501A and 1501N emit beams with a narrow spectral bandwidth. More specifically, the emission spectrum of component beams 1510A and 1510N exhibits a narrow peak about a particular wavelength where the wavelength corresponds to the wavelength of the feedback selected for emitters 1510A and 1510N by the external resonator cavity.

The component beams of the external resonator input 1510 are directed from the laser source 1501 through the first position-to-angle transformation optic 1502. The first position-to-angle transformation optic 1502 imparts an angle of incidence with respect to the thin-film etalon 1504 upon each component beam of the external resonator input 1510. The particular angle of incidence imparted upon each component beam is determined by the spatial position of the individual emitter in the laser source 1501 that emitted the component beam.

After traveling through the first position-to-angle transformation optic 1502, the external resonator input 1510 interacts with the partially reflective element 1503. In the embodiment depicted in FIG. 15, the partially reflective element 1503 is a partially reflective mirror that transmits a substantial minority of the incident optical power as a first feedback arm input 1511 and that reflects a substantial majority of incident optical power as an output arm component 1512. In various implementations, partially reflective elements of various reflectivity may be utilized. However, in the configuration depicted in FIG. 15, the partially reflective mirror should reflect at least seventy percent of the incident optical power. If a larger component of the optical power of the external resonator input 1510 is transmitted through the partially reflective element 1503 and filtered by the etalon 1504, the wall plug efficiency of the DWBC system will suffer considerably. Depending on the characteristics of the system and the applications for which the DWBC system will be used, it may be preferable to utilize a partially reflective optical element that reflects ninety percent or greater of the incident optical power.

The etalon 1504 is positioned at the focal point of the first position-to-angle transformation optic 1502 such that the component beams of the feedback arm input 1511 are focused at a point in space that lies on the front surface of the etalon 1504. For a particular angle of incidence, the transmission spectrum of the etalon 1504 exhibits a very narrow peak at a particular wavelength. Therefore, for each component beam of the first feedback arm input 1511, only a small component of the optical power corresponding to a very narrow wavelength range at which the etalon 1504 has a transmission peak will be transmitted. The remaining optical power will be reflected out of the system and into one of the loss channels 1520A and 1520B.

The components of the first feedback arm input 1511 that are transmitted by the etalon subsequently propagate through the second position-to-angle transformation lens 1505, which images the component beams of the laser source output 1501 onto the first highly reflective element 1506. The first highly reflective element 1506 reflects the transmitted components of the first feedback arm input 1511 as first feedback arm output 1513. First feedback arm output propagates back through the first feedback arm until it reaches the partially reflective mirror. Upon reaching the partially reflective mirror, the first feedback arm output is split into two separate components. A first component is transmitted through the partially reflective mirror and subsequently travels back towards the plurality of diode laser emitters as a resonant feedback component 1514. A second component is reflected by the partially reflective mirror and directed towards the second highly reflective element as a power recycling arm input 1515. The component beams of the power recycling arm input 1515 subsequently propagate through the third position-to-angle transformation lens 1507, which images the component beams of the laser source output 1501 onto the second highly reflective element 1506. The power recycling arm input is reflected by the second highly reflective element 1508 and directed back towards the partially reflective element 1502 as power recycling arm output 1516. A portion of the power recycling arm output 1516 is transmitted by the partially reflective element 1502 as additional output arm input 1512, while a separate portion of the optical power of the power recycling arm output 1516 is reflected as additional first feedback arm input 1511. Therefore, a component of the beams continues traveling back and forth through the first feedback arm and the power recycling arm. Thus, an interferometer is formed by the partially reflective element 1503, the first highly reflective element 1506, and the second highly reflective element 1508.

Figure 16:
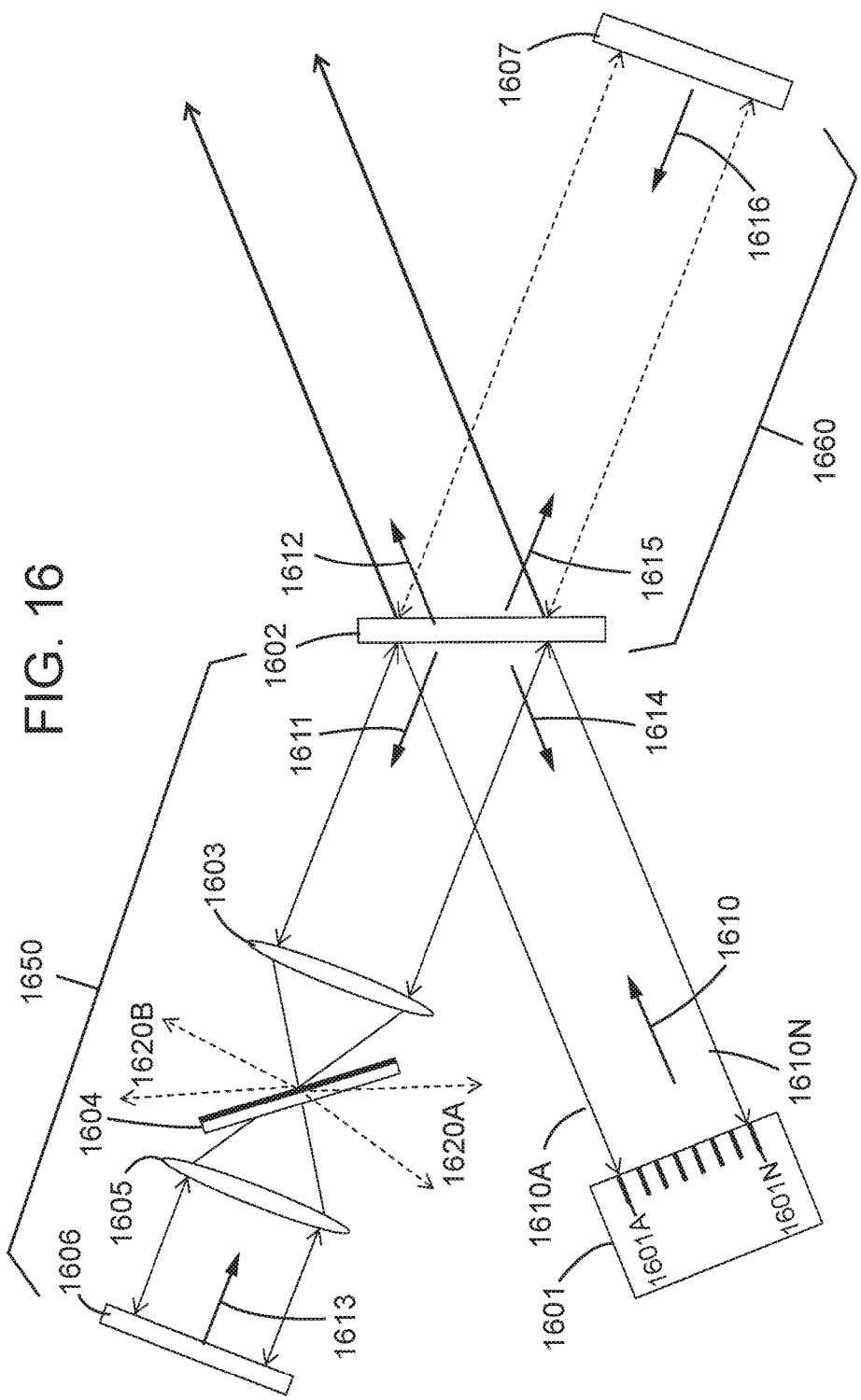
FIG. 16 illustrates a wavelength stabilization system, capable of use in a DWBC apparatus, that utilizes a partially reflective mirror of low reflectivity to direct an optical feedback component into a feedback-branch that utilizes a thin-film etalon as a wavelength selective element.

FIG. 16 illustrates a wavelength-stabilization, system capable of use in a DWBC apparatus, that utilizes a partially reflective mirror of low reflectivity to direct an optical feedback component into a wavelength selective a feedback-branch that utilizes a thin-film etalon as a wavelength selective element. The apparatus depicted in FIG. 16 includes a laser source 1601 that includes a plurality of individual emitters (e.g. 1601A and 1601N), a partially reflective element 1602, a first position-to-angle transformation optic 1603, a thin-film etalon 1604, a second position-to-angle transformation optic 1605, a first highly reflective mirror 1606, and a second highly reflective mirror 1607. In the embodiment depicted in FIG. 16, the optical path between the laser source 1601 and the first and second highly reflective mirrors 1606 and 1607 defines a wavelength selective external resonator. The external resonator depicted in FIG. 16 includes wavelength selective branch 1650 and a power recycling branch 1660. The external resonator receives input beams from the laser source 1601, filters components of the input beams that correspond to undesired wavelengths, and images the input beams back onto the laser source 1601 in order to provide resonant feedback to the laser source 1601 and thereby facilitate beam wavelength stabilization.

In the embodiment depicted in FIG. 16, the laser source 1601 consists of a plurality of spatially separated individual diode laser emitters. The plurality of emitters of the laser source 1601 emit a plurality of beams that together constitute external resonator input 1610. External resonator input 1610 is therefore composed of a plurality of individual component beams, each of which is emitted by a single emitter in the laser source 1601. Prior to receiving any feedback, the individual emitters of the laser source 1601 have a relatively broad emission spectrum (as compared to the individual emitters after they begin receiving feedback from the external resonator). More specifically, the individual emitters of the laser source 1601 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 16 depicts two particular external resonator input component beams, 1610A and 1610N, which are emitted by emitters 1601A and 1601N, respectively. More specifically, the emission spectra of the individual emitters 1601A and 1601N exhibit a narrow peak about a particular wavelength where the wavelength corresponds to the wavelength of the feedback selected for emitters 1601A and 1601N by the external resonator cavity.

The component beams of the external resonator input 1610 are directed from the laser source 1601 towards the partially reflective element 1602. In the embodiment depicted in FIG. 16, the partially reflective element 1602 is a partially reflective mirror that reflects a substantial minority of the incident optical power as a first feedback arm input 1611 and that transmits a substantial majority of incident optical power as an output arm component 1612. In various implementations, partially reflective elements of various reflectivity may be utilized. However, in the configuration depicted in FIG. 16, the partially reflective mirror should transmit at least seventy percent of the incident optical power. Depending on the characteristics of the system and the applications for which the DWBC system will be used, it may be preferable to utilize an partially reflective optical element that transmits ninety percent or greater of the incident optical power.

After being reflected by the partially reflective element 1602, the first feedback arm input 1611 travels through the first position-to-angle transformation optic 1603. The first position-to-angle transformation optic 1603 imparts an angle of incidence with respect to the thin-film etalon 1604 upon each component beam of the first feedback arm input. The particular angle of incidence imparted upon each component beam is determined by the spatial position of the individual emitter in the laser source 1601 that emitted the component beam.

The etalon 1604 is positioned at the at the focal point of the first position-to-angle transformation optic 1603 such that the component beams of the feedback arm input 1611 are focused at a point in space that lies on the front surface of the etalon 1604. For a particular angle of incidence, the transmission spectrum of the etalon 1604 exhibits a very narrow peak at a particular wavelength. Therefore, for each component beam of the first feedback arm input 1611, only a very small component of the optical power corresponding to a very narrow wavelength range will be transmitted while the remaining optical power will be reflected out of the system and into one of the loss channels 1620A and 1620B.

The components of the first feedback arm input 1611 that are transmitted by the etalon subsequently propagate through the second position-to-angle transformation lens 1605, which images the component beams of the laser source output 1601 onto the first highly reflective element 1606. The first highly reflective element 1606 reflects the transmitted components of the first feedback arm input 1611 as first feedback arm output 1613. First feedback arm output propagates back through the first feedback arm until it reaches the partially reflective mirror. Upon reaching the partially reflective mirror, the first feedback arm output is split into two separate components. A first component is reflected the partially reflective mirror and subsequently travels back towards the plurality of diode laser emitters as a resonant feedback component 1614. A second component is transmitted by the partially reflective mirror and directed towards the second highly reflective element 1607 as a power recycling arm input 1615. The power recycling arm input is reflected by the second highly reflective element 1607 and directed back towards the partially reflective element 1602 as power recycling arm output 1616. A portion of the power recycling arm output 1616 is reflected by the partially reflective element 1602 as additional output arm input 1612, while a separate portion of the optical power of the power recycling arm output 1616 is transmitted as additional first feedback arm input 1611. Therefore, a component of the beams continues traveling back and forth through the first feedback arm and the power recycling arm. Thus, an interferometer is formed by the partially reflective element 1602, the first highly reflective element 1606, and the second highly reflective element 1607.

Figure 17:
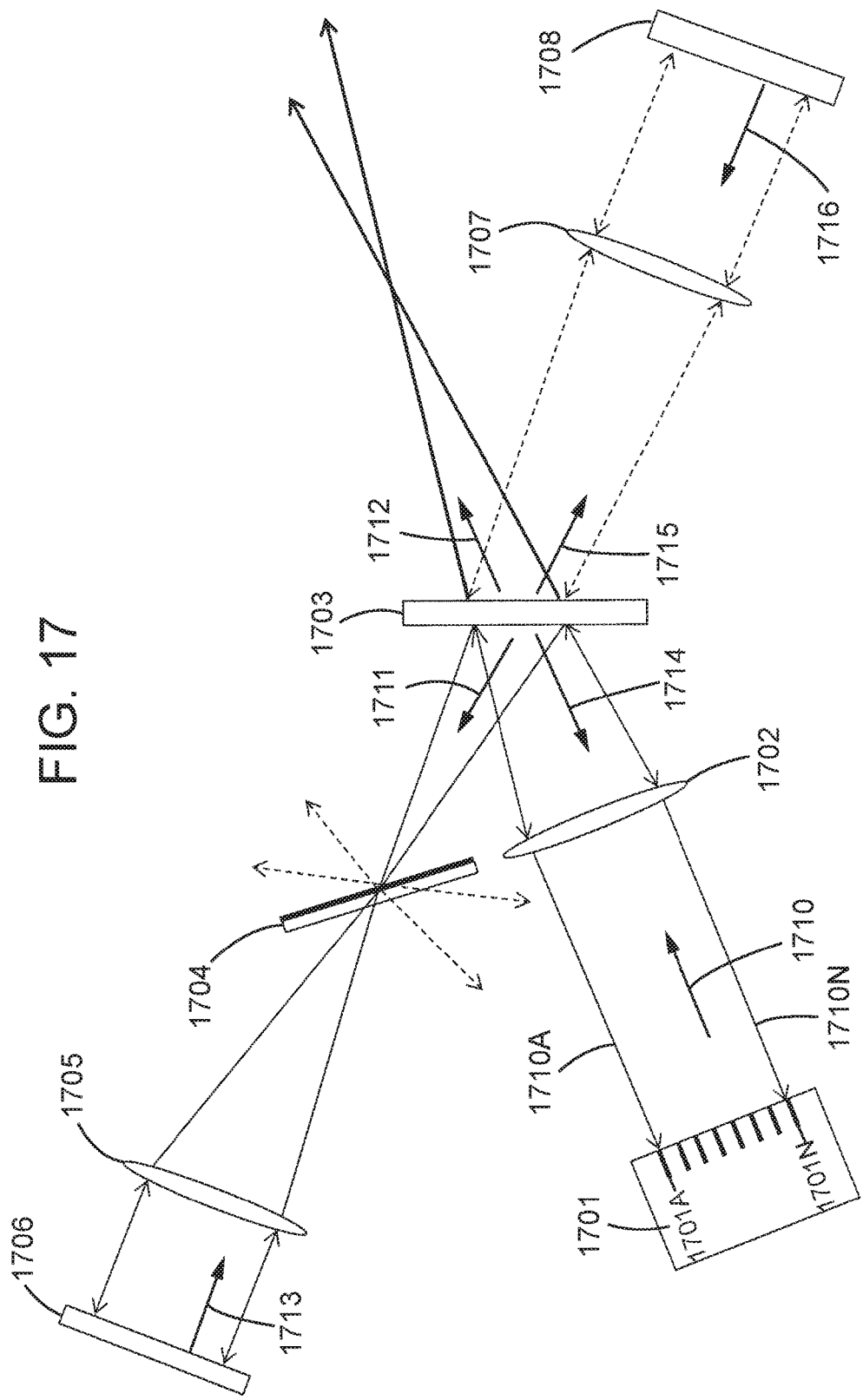
FIG. 17 illustrates an alternative wavelength stabilization system, capable of use in a DWBC apparatus, that utilizes a partially reflective mirror of low reflectivity to direct an optical feedback component into a feedback-branch that utilizes a thin-film etalon as a wavelength selective element.

FIG. 17 illustrates an alternative wavelength-stabilization system, capable of use in a DWBC apparatus, that utilizes a partially reflective mirror of high reflectivity to direct an optical feedback component into a wavelength selective feedback-branch that utilizes a thin-film etalon as a wavelength selective element. The apparatus depicted in FIG. 17 includes a laser source 1701 that includes a plurality of individual emitters (e.g. 1701A and 1701N), a first position-to-angle transformation optic 1702, a partially reflective element 1703, a thin-film etalon 1704, a second position-to-angle transformation optic 1705, a first highly reflective mirror 1706, a third position-to-angle transformation optic 1707, and a highly reflective mirror 1708. In the embodiment depicted in FIG. 17, the optical path between the laser source 1701 and the first and second highly reflective mirrors 1706 and 1708 defines a wavelength selective external resonator. The external resonator depicted in FIG. 17 includes wavelength selective branch 1750 and a power recycling branch 1760. The external resonator receives input beams from the laser source 1701, filters components of the input beams that correspond to undesired wavelengths, and images the input beams back onto the laser source 1701 in order to provide resonant feedback to the laser source 1701 and thereby facilitate beam wavelength stabilization.

In the embodiment depicted in FIG. 17, the laser source 1701 consists of a plurality of spatially separated individual diode laser emitters. The plurality of emitters of the laser source 1701 emit a plurality of beams that together constitute external resonator input 1710. External resonator input 1710 is therefore composed of a plurality of individual component beams, each of which is emitted by a single emitter in the laser source 1701. Prior to receiving any feedback, the individual emitters of the laser source 1701 have a relatively broad emission spectrum (as compared to the individual emitters after receiving feedback). More specifically, prior to receiving feedback from the external resonator, the individual emitters of the laser source 1701 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 17 depicts two particular external resonator input component beams, 1710A and 1710N, which are emitted by emitters 1701A and 1701N, respectively. Emitters 1701A and 1701N emit beams with a narrow spectral bandwidth. More specifically, the emission spectrum of component beams 1710A and 1710N exhibits a narrow peak about a particular wavelength where the wavelength corresponds to the wavelength of the feedback selected for emitters 1710A and 1710N by the external resonator cavity.

The component beams of the external resonator input 1710 are directed from the laser source 1701 through the first position-to-angle transformation optic 1702. The first position-to-angle transformation optic 1702 imparts an angle of incidence with respect to the thin-film etalon 1704 upon each component beam of the external resonator input 1710. The particular angle of incidence imparted upon each component beam is determined by the spatial position of the individual emitter in the laser source 1701 that emitted the component beam.

After traveling through the first position-to-angle transformation optic 1702, the external resonator input 1710 interacts with the partially reflective element 1703. In the embodiment depicted in FIG. 17, the partially reflective element 1703 is a partially reflective minor that reflects a substantial minority of the incident optical power as a first feedback arm input 1711 and that transmits a substantial majority of incident optical power as an output arm component 1712. In various implementations, partially reflective elements of various reflectivity may be utilized. However, in the configuration depicted in FIG. 17, the partially reflective mirror should transmit at least seventy percent of the incident optical power. If a larger component of the optical power of the external resonator input 1710 is reflected by the partially reflective element 1703 and filtered by the etalon 1704, the wall plug efficiency of the DWBC system will suffer considerably. Depending on the characteristics of the system and the applications for which the DWBC system will be used, it may be preferable to utilize a partially reflective optical element that transmits ninety percent or greater of the incident optical power.

The etalon 1704 is positioned at the at the focal point of the first position-to-angle transformation optic 1702 such that the component beams of the feedback arm input 1711 are focused at a point in space that lies on the front surface of the etalon 1704. For a particular angle of incidence, the transmission spectrum of the etalon 1704 exhibits a very narrow peak at a particular wavelength. Therefore, for each component beam of the first feedback arm input 1711, only a small component of the optical power corresponding to a very narrow wavelength range at which the etalon 1704 has a transmission peak will be transmitted. The remaining optical power will be reflected out of the system and into one of the loss channels 1720A and 1720B.

The components of the first feedback arm input 1711 that are transmitted by the etalon subsequently propagate through the second position-to-angle transformation lens 1705, which images the component beams of the laser source output 1701 onto the first highly reflective element 1706. The first highly reflective element 1706 reflects the transmitted components of the first feedback arm input 1711 as first feedback arm output 1713. First feedback arm output propagates back through the first feedback arm until it reaches the partially reflective mirror. Upon reaching the partially reflective mirror, the first feedback arm output is split into two separate components. A first component is reflected by the partially reflective mirror and subsequently travels back towards the plurality of diode laser emitters as a resonant feedback component 1714. A second component is transmitted through the partially reflective mirror and directed towards the second highly reflective element as a power recycling arm input 1715. The component beams of the power recycling arm input 1715 subsequently propagate through the third position-to-angle transformation lens 1707, which images the component beams of the laser source output 1701 onto the second highly reflective element 1706. The power recycling arm input is reflected by the second highly reflective element 1708 and directed back towards the partially reflective element 1702 as power recycling arm output 1718. A portion of the power recycling arm output 1716 is reflected by the partially reflective element 1702 as additional output arm input 1712, while a separate portion of the optical power of the power recycling arm output 1718 is transmitted as additional first feedback arm input 1711. Therefore, a component of the beams continues traveling back and forth through the first feedback arm and the power recycling arm. Thus, an interferometer is formed by the partially reflective element 1703, the first highly reflective element 1706, and the second highly reflective element 1708.

Figure 18:
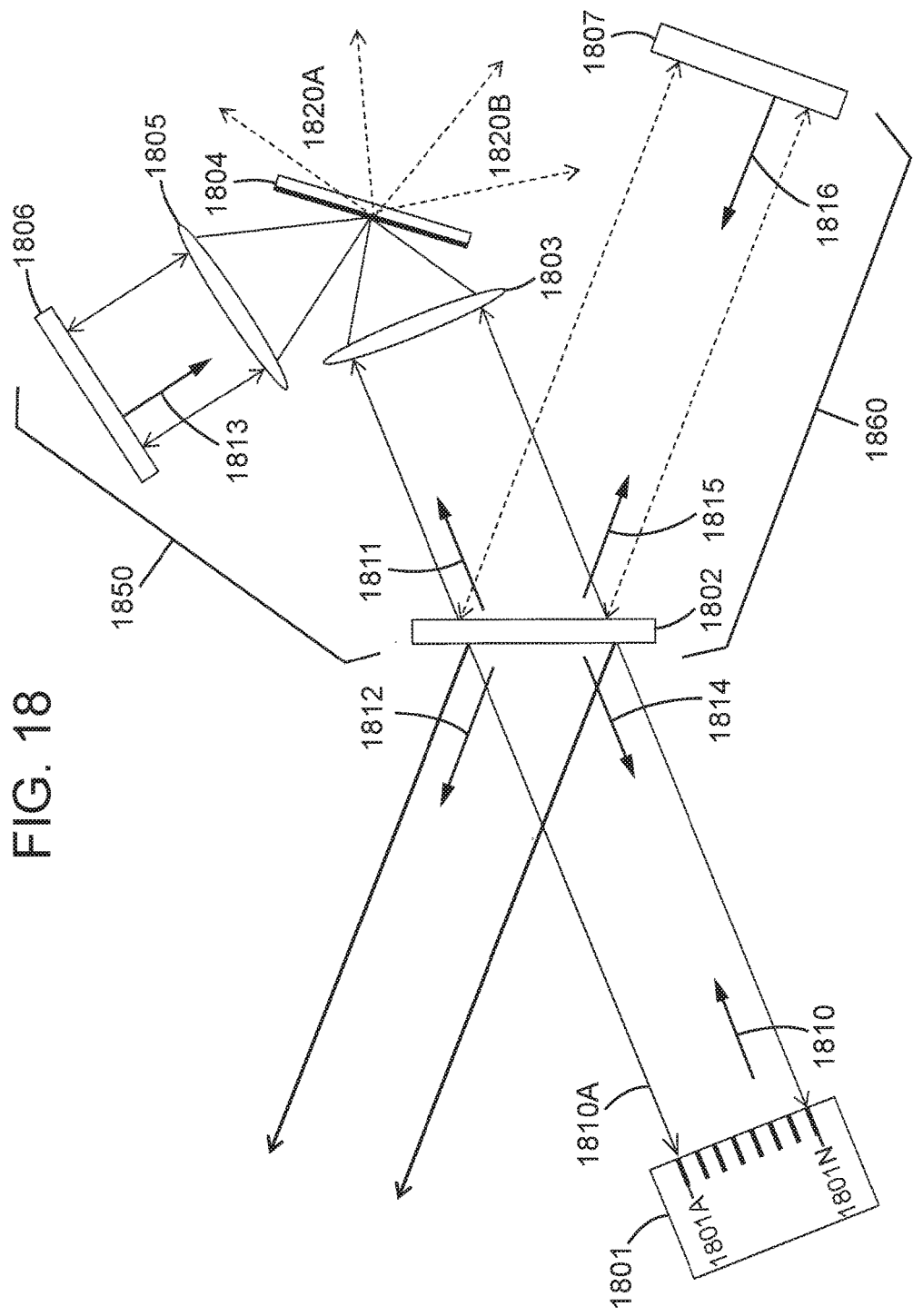
FIG. 18 illustrates a wavelength stabilization system, capable of use in a DWBC apparatus, that utilizes a partially reflective mirror of high reflectivity to direct an optical feedback component into a feedback-branch that utilizes a thin-film notch filter as a wavelength selective element.

FIG. 18 illustrates a wavelength-stabilization system, capable of use in a DWBC apparatus, that utilizes a partially reflective element of high reflectivity to direct an optical feedback component into a wavelength selective feedback-branch that utilizes a thin-film notch filter as a wavelength selective element. The apparatus depicted in FIG. 18 includes a laser source 1801 that includes a plurality of individual emitters (e.g. 1801A and 1801N), a partially reflective element 1802, a first position-to-angle transformation optic 1803, a thin-film notch filter 1804, a second position-to-angle transformation optic 1805, a first highly reflective mirror 1806, and a second highly reflective mirror 1807. In the embodiment depicted in FIG. 18, the optical path between the laser source 1801 and the first and second highly reflective mirrors 1806 and 1807 defines a wavelength selective external resonator. The external resonator depicted in FIG. 18 includes wavelength selective branch 1850 and a power recycling branch 1860. The external resonator receives input beams from the laser source 1801, filters components of the input beams that correspond to undesired wavelengths, and images the input beams back onto the laser source 1801 in order to provide resonant feedback to the laser source 1801 and thereby facilitate beam wavelength stabilization.

The plurality of emitters of the laser source 1801 emit a plurality of beams that together constitute external resonator input 1810. External resonator input 1810 is therefore composed of a plurality of individual component beams, each of which is emitted by a single emitter in the laser source 1801. Prior to receiving any feedback, the individual emitters of the laser source 1801 produce a relatively broad emission spectrum (as compared to individual emitters that receive feedback). More specifically, the individual emitters of the laser source 1801 produce optical power corresponding to a relatively broad range of wavelengths. However, as optical power propagates through the external resonator cavity and resonant feedback is transmitted back into the emitters, the emission spectrum produced by each of the individual emitters narrows considerably.

FIG. 18 depicts two particular external resonator input component beams, 1810A and 1810N, which are emitted by emitters 1801A and 1801N, respectively. The emission spectrum of component beams 1810A and 1810N exhibits a narrow peak about a particular wavelength where the wavelength corresponds to the wavelength of the feedback selected for emitters 1810A and 1810N by the external resonator cavity.

The component beams of the external resonator input 1810 are directed from the laser source 1801 towards the partially reflective element 1802. In the embodiment depicted in FIG. 18, the partially reflective element 1802 is a partially reflective mirror that transmits a substantial minority of the incident optical power as a first feedback arm input 1811 and that reflects a substantial majority of incident optical power as an output arm component 1812. In various implementations, partially reflective elements of various reflectivity may be utilized. However, in the configuration depicted in FIG. 18, the partially reflective mirror should reflect at least seventy percent of the incident optical power. Depending on the characteristics of the system and the applications for which the DWBC system will be used, it may be preferable to utilize an partially reflective optical element that reflects ninety percent or greater of the incident optical power.

After being transmitted through the partially reflective element 1802, the first feedback arm input 1811 travels through the first position-to-angle transformation optic 1803. The first position-to-angle transformation optic 1803 imparts an angle of incidence with respect to the thin-film notch filter 1804 upon each component beam of the first feedback arm input. The particular angle of incidence imparted upon each component beam is determined by the spatial position of the individual emitter in the laser source 1801 that emitted the component beam.

The notch filter 1804 is positioned at the focal point of the first position-to-angle transformation optic 1803 such that the component beams of the feedback arm input 1811 are focused at a point in space that lies on the front surface of the notch filter 1804. For a particular angle of incidence, the transmission spectrum of the notch filter 1804 exhibits a very narrow peak at a particular wavelength. Therefore, for each component beam of the first feedback arm input 1811, only a very small component of the optical power corresponding to a very narrow wavelength range will be transmitted while the remaining optical power will be reflected out of the system and into one of the loss channels 1820A and 1820B.

The components of the first feedback arm input 1811 that are transmitted by the notch filter subsequently propagate through the second position-to-angle transformation lens 1805, which images the component beams of the laser source output 1801 onto the first highly reflective element 1806. The first highly reflective element 1806 reflects the transmitted components of the first feedback arm input 1811 as first feedback arm output 1813. First feedback arm output propagates back through the first feedback arm until it reaches the partially reflective mirror. Upon reaching the partially reflective mirror, the first feedback arm output is split into two separate components. A first component is transmitted through the partially reflective mirror and subsequently travels back towards the plurality of diode laser emitters as a resonant feedback component 1814. A second component is reflected by the partially reflective mirror and directed towards the second highly reflective element as a power recycling arm input 1815. The power recycling arm input is reflected by the second highly reflective element 1807 and directed back towards the partially reflective element 1802 as power recycling arm output 1816. A portion of the power recycling arm output 1816 is transmitted by the partially reflective element 1802 as additional output arm input 1812, while a separate portion of the optical power of the power recycling arm output 1816 is reflected as additional first feedback arm input 1811. Therefore, a component of the beams continues traveling back and forth through the first feedback arm and the power recycling arm. Thus, an interferometer is formed by the partially reflective element 1802, the first highly reflective element 1806, and the second highly reflective element 1807.

Figure 19:
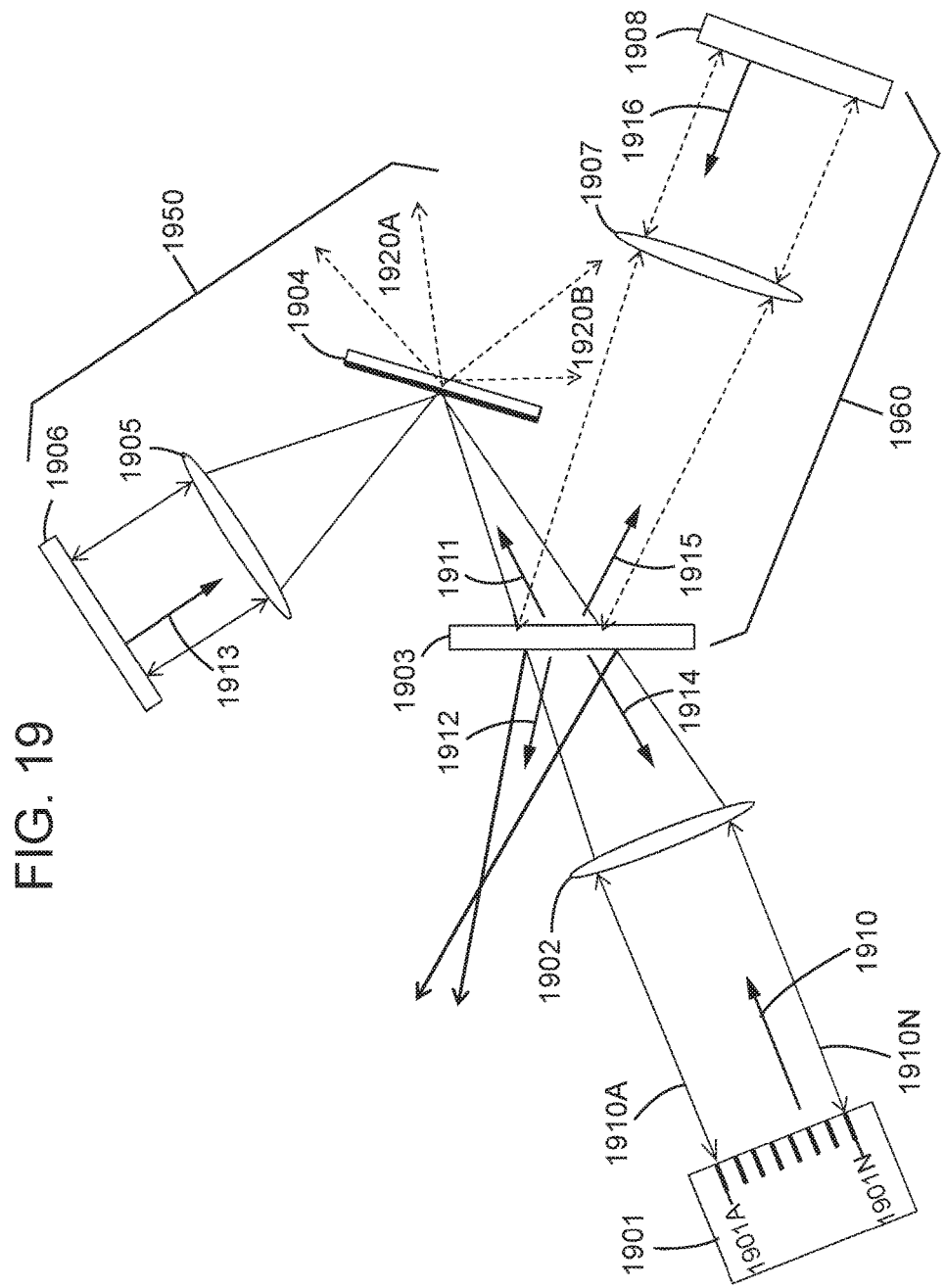
FIG. 19 illustrates an alternative wavelength stabilization system, capable of use in a DWBC apparatus, that utilizes a partially reflective mirror of high reflectivity to direct an optical feedback component into a feedback-branch that utilizes a thin-film notch filter as a wavelength selective element.

FIG. 19 illustrates an alternative wavelength-stabilization system, capable of use in a DWBC apparatus, that utilizes a partially reflective mirror of high reflectivity to direct an optical feedback component into a wavelength selective feedback-branch that utilizes a thin-film notch filter as a wavelength selective element. The apparatus depicted in FIG. 19 includes a laser source 1901 that includes a plurality of individual emitters (e.g. 1901A and 1901N), a first position-to-angle transformation optic 1902, a partially reflective element 1903, a thin-film notch filter 1904, a second position-to-angle transformation optic 1905, a first highly reflective mirror 1906, a third position-to-angle transformation optic 1907, and a highly reflective mirror 1908. In the embodiment depicted in FIG. 19, the optical path between the laser source 1901 and the first and second highly reflective mirrors 1906 and 1908 defines a wavelength selective external resonator. The external resonator depicted in FIG. 19 includes wavelength selective branch 1950 and a power recycling branch 1960. The external resonator receives input beams from the laser source 1901, filters components of the input beams that correspond to undesired wavelengths, and images the input beams back onto the laser source 1901 in order to provide resonant feedback to the laser source 1901 and thereby facilitate beam wavelength stabilization.

In the embodiment depicted in FIG. 19, the laser source 1901 consists of a plurality of spatially separated individual diode laser emitters. The plurality of emitters of the laser source 1901 emit a plurality of beams that together constitute external resonator input 1910. External resonator input 1910 is therefore composed of a plurality of individual component beams, each of which is emitted by a single emitter in the laser source 1901. Prior to receiving any feedback, the individual emitters of the laser source 1901 have a relatively broad emission spectrum (as compared to the individual emitters after receiving feedback). More specifically, prior to receiving feedback from the external resonator, the individual emitters of the laser source 1901 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 19 depicts two particular external resonator input component beams, 1910A and 1910N, which are emitted by emitters 1901A and 1901N, respectively. Emitters 1901A and 1901N emit beams with a narrow spectral bandwidth. More specifically, the emission spectrum of component beams 1910A and 1910N exhibits a narrow peak about a particular wavelength where the wavelength corresponds to the wavelength of the feedback selected for emitters 1910A and 1910N by the external resonator cavity.

The component beams of the external resonator input 1910 are directed from the laser source 1901 through the first position-to-angle transformation optic 1902. The first position-to-angle transformation optic 1902 imparts an angle of incidence with respect to the thin-film notch filter 1904 upon each component beam of the external resonator input 1910. The particular angle of incidence imparted upon each component beam is determined by the spatial position of the individual emitter in the laser source 1901 that emitted the component beam.

After traveling through the first position-to-angle transformation optic 1902, the external resonator input 1910 interacts with the partially reflective element 1903. In the embodiment depicted in FIG. 19, the partially reflective element 1903 is a partially reflective mirror that transmits a substantial minority of the incident optical power as a first feedback arm input 1911 and that reflects a substantial majority of incident optical power as an output arm component 1912. In various implementations, partially reflective elements of various reflectivity may be utilized. However, in the configuration depicted in FIG. 19, the partially reflective mirror should reflect at least seventy percent of the incident optical power. If a larger component of the optical power of the external resonator input 1910 is transmitted through the partially reflective element 1903 and filtered by the notch filter 1904, the wall plug efficiency of the DWBC system will suffer considerably. Depending on the characteristics of the system and the applications for which the DWBC system will be used, it may be preferable to utilize a partially reflective optical element that reflects ninety percent or greater of the incident optical power.

The notch filter 1904 is positioned at the focal point of the first position-to-angle transformation optic 1902 such that the component beams of the feedback arm input 1911 are focused at a point in space that lies on the front surface of the notch filter 1904. For a particular angle of incidence, the transmission spectrum of the notch filter 1904 exhibits a very narrow peak at a particular wavelength. Therefore, for each component beam of the first feedback arm input 1911, only a small component of the optical power corresponding to a very narrow wavelength range at which the notch filter 1904 has a transmission peak will be transmitted. The remaining optical power will be reflected out of the system and into one of the loss channels 1920A and 1920B.

The components of the first feedback arm input 1911 that are transmitted by the notch filter subsequently propagate through the second position-to-angle transformation lens 1905, which images the component beams of the laser source output 1901 onto the first highly reflective element 1906. The first highly reflective element 1906 reflects the transmitted components of the first feedback arm input 1911 as first feedback arm output 1913. First feedback arm output propagates back through the first feedback arm until it reaches the partially reflective mirror. Upon reaching the partially reflective mirror, the first feedback arm output is split into two separate components. A first component is transmitted through the partially reflective mirror and subsequently travels back towards the plurality of diode laser emitters as a resonant feedback component 1914. A second component is reflected by the partially reflective mirror and directed towards the second highly reflective element as a power recycling arm input 1915. The component beams of the power recycling arm input 1915 subsequently propagate through the third position-to-angle transformation lens 1907, which images the component beams of the laser source output 1901 onto the second highly reflective element 1906. The power recycling arm input is reflected by the second highly reflective element 1908 and directed back towards the partially reflective element 1902 as power recycling arm output 1916. A portion of the power recycling arm output 1916 is transmitted by the partially reflective element 1902 as additional output arm input 1912, while a separate portion of the optical power of the power recycling arm output 1916 is reflected as additional first feedback arm input 1911. Therefore, a component of the beams continues traveling back and forth through the first feedback arm and the power recycling arm. Thus, an interferometer is formed by the partially reflective element 1903, the first highly reflective element 1906, and the second highly reflective element 1908.

Figure 20:
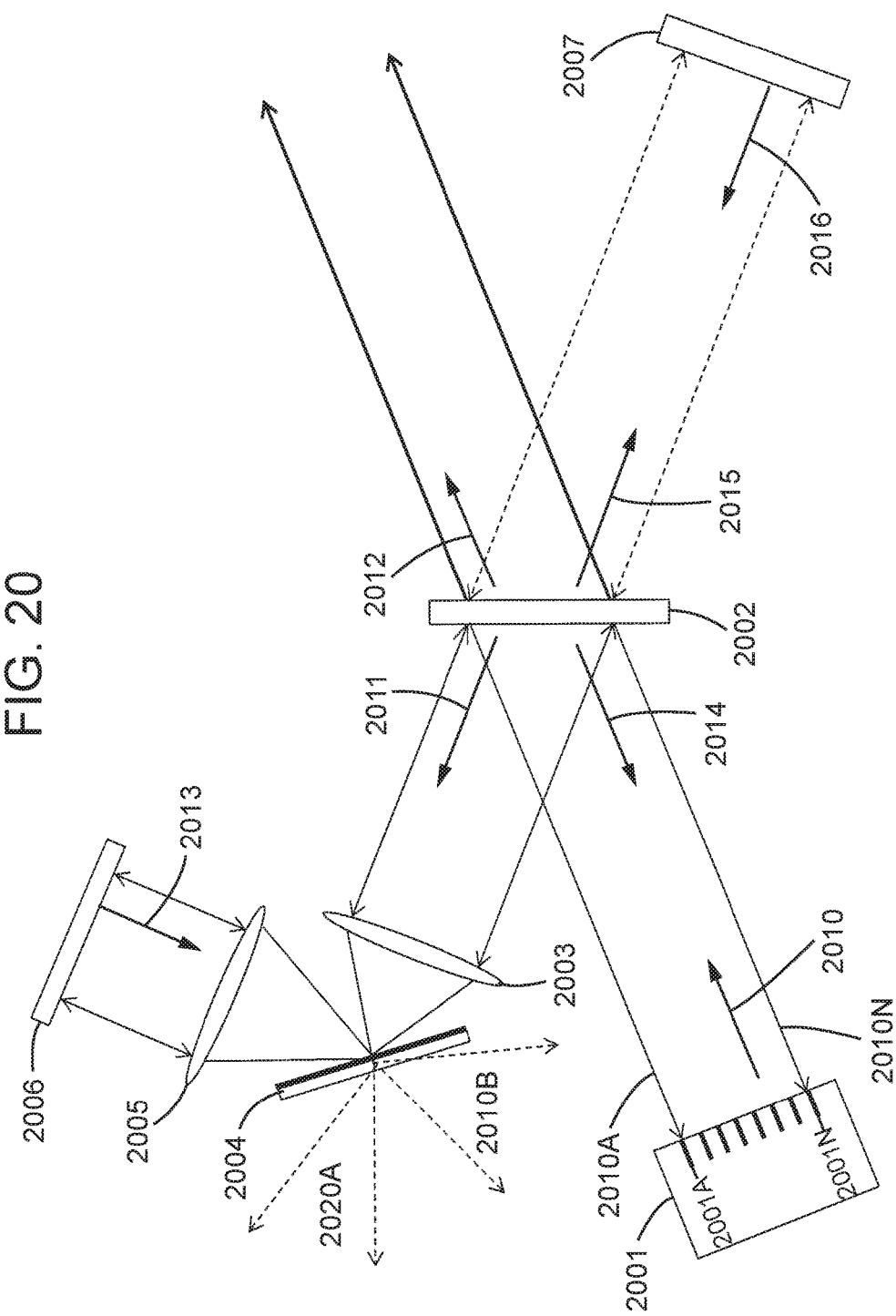
FIG. 20 illustrates a wavelength stabilization system, capable of use in a DWBC apparatus, that utilizes a partially reflective mirror of low reflectivity to direct an optical feedback component into a feedback-branch that utilizes a thin-film notch filter as a wavelength selective element.

FIG. 20 illustrates a wavelength-stabilization system, capable of use in a DWBC apparatus, that utilizes a partially reflective mirror of low reflectivity to direct an optical feedback component into a wavelength selective feedback-branch that utilizes a thin-film notch filter as a wavelength selective element. The apparatus depicted in FIG. 20 includes a laser source 2001 that includes a plurality of individual emitters (e.g. 2001A and 2001N), a partially reflective element 2002, a first position-to-angle transformation optic 2003, a thin-film notch filter 2004, a second position-to-angle transformation optic 2005, a first highly reflective mirror 2006, and a second highly reflective mirror 2007. In the embodiment depicted in FIG. 20, the optical path between the laser source 2001 and the first and second highly reflective mirrors 2006 and 2007 defines a wavelength selective external resonator. The external resonator depicted in FIG. 20 includes wavelength selective branch 2050 and a power recycling branch 2060. The external resonator receives input beams from the laser source 2001, filters components of the input beams that correspond to undesired wavelengths, and images the input beams back onto the laser source 2001 in order to provide resonant feedback to the laser source 2001 and thereby facilitate beam wavelength stabilization.

In the embodiment depicted in FIG. 20, the laser source 2001 consists of a plurality of spatially separated individual diode laser emitters. The plurality of emitters of the laser source 2001 emit a plurality of beams that together constitute external resonator input 2010. External resonator input 2010 is therefore composed of a plurality of individual component beams, each of which is emitted by a single emitter in the laser source 2001. Prior to receiving any feedback, the individual emitters of the laser source 2001 have a relatively broad emission spectrum (as compared to the individual emitters after they begin receiving feedback from the external resonator). More specifically, the individual emitters of the laser source 2001 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 20 depicts two particular external resonator input component beams, 2010A and 2010N, which are emitted by emitters 2001A and 2001N, respectively. More specifically, the emission spectra of the individual emitters 2001A and 2001N exhibit a narrow peak about a particular wavelength where the wavelength corresponds to the wavelength of the feedback selected for emitters 2001A and 2001N by the external resonator cavity.

The component beams of the external resonator input 2010 are directed from the laser source 2001 towards the partially reflective element 2002. In the embodiment depicted in FIG. 20, the partially reflective element 2002 is a partially reflective mirror that reflects a substantial minority of the incident optical power as a first feedback arm input 2011 and that transmits a substantial majority of incident optical power as an output arm component 2012. In various implementations, partially reflective elements of various reflectivity may be utilized. However, in the configuration depicted in FIG. 20, the partially reflective mirror should transmit at least seventy percent of the incident optical power. Depending on the characteristics of the system and the applications for which the DWBC system will be used, it may be preferable to utilize an partially reflective optical element that transmits ninety percent or greater of the incident optical power.

After being reflected by the partially reflective element 2002, the first feedback arm input 2011 travels through the first position-to-angle transformation optic 2003. The first position-to-angle transformation optic 2003 imparts an angle of incidence with respect to the thin-film notch filter 2004 upon each component beam of the first feedback arm input. The particular angle of incidence imparted upon each component beam is determined by the spatial position of the individual emitter in the laser source 2001 that emitted the component beam.

The notch filter 2004 is positioned at the focal point of the first position-to-angle transformation optic 2003 such that the component beams of the feedback arm input 2011 are focused at a point in space that lies on the front surface of the notch filter 2004. For a particular angle of incidence, the transmission spectrum of the notch filter 2004 exhibits a very narrow peak at a particular wavelength. Therefore, for each component beam of the first feedback arm input 2011, only a very small component of the optical power corresponding to a very narrow wavelength range will be transmitted while the remaining optical power will be reflected out of the system and into one of the loss channels 2020A and 2020B.

The components of the first feedback arm input 2011 that are transmitted by the notch filter subsequently propagate through the second position-to-angle transformation lens 2005, which images the component beams of the laser source output 2001 onto the first highly reflective element 2006. The first highly reflective element 2006 reflects the transmitted components of the first feedback arm input 2011 as first feedback arm output 2013. First feedback arm output propagates back through the first feedback arm until it reaches the partially reflective mirror. Upon reaching the partially reflective mirror, the first feedback arm output is split into two separate components. A first component is reflected the partially reflective mirror and subsequently travels back towards the plurality of diode laser emitters as a resonant feedback component 2014. A second component is transmitted by the partially reflective mirror and directed towards the second highly reflective element 2007 as a power recycling arm input 2015. The power recycling arm input is reflected by the second highly reflective element 2007 and directed back towards the partially reflective element 2002 as power recycling arm output 2016. A portion of the power recycling arm output 2016 is reflected by the partially reflective element 2002 as additional output arm input 2012, while a separate portion of the optical power of the power recycling arm output 2016 is transmitted as additional first feedback arm input 2011. Therefore, a component of the beams continues traveling back and forth through the first feedback arm and the power recycling arm. Thus, an interferometer is formed by the partially reflective element 2002, the first highly reflective element 2006, and the second highly reflective element 2007.

Figure 21:
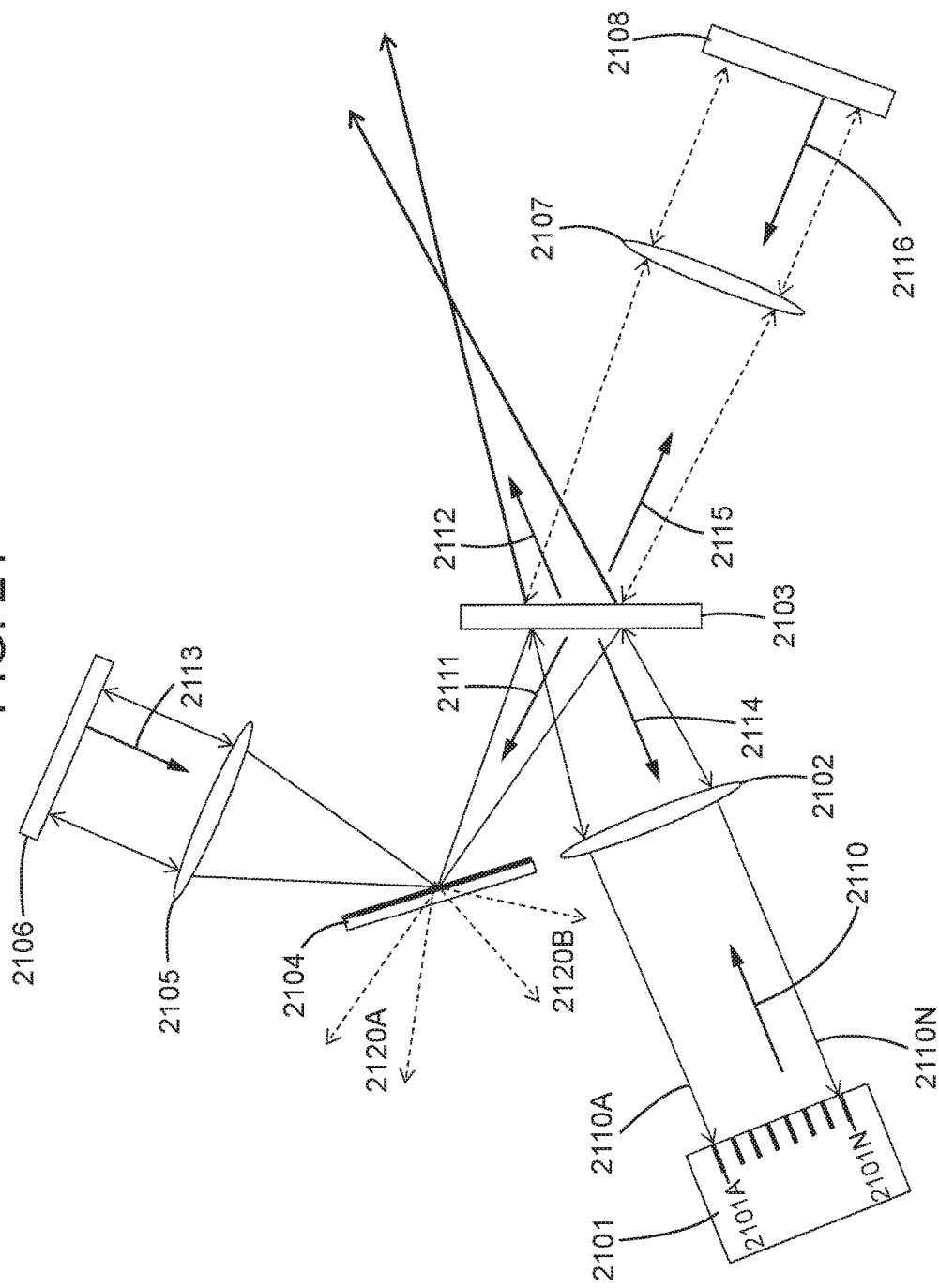
FIG. 21 illustrates an alternative wavelength stabilization system, capable of use in a DWBC apparatus, that utilizes a partially reflective mirror of low reflectivity to direct an optical feedback component into a feedback-branch that utilizes a thin-film notch filter as a wavelength selective element.

FIG. 21 illustrates an alternative wavelength stabilization system, capable of use in a DWBC apparatus, that utilizes a partially reflective mirror of high reflectivity to direct an optical feedback component into a wavelength selective external resonator that utilizes a thin-film notch filter as a wavelength selective element. The apparatus depicted in FIG. 21 includes a laser source 2101 that includes a plurality of individual emitters (e.g. 2101A and 2101N), a first position-to-angle transformation optic 2102, a partially reflective element 2103, a thin-film notch filter 2104, a second position-to-angle transformation optic 2105, a first highly reflective mirror 2106, a third position-to-angle transformation optic 2107, and a highly reflective mirror 2108. In the embodiment depicted in FIG. 21, the optical path between the laser source 2101 and the first and second highly reflective mirrors 2106 and 2108 defines a wavelength selective external resonator. The external resonator depicted in FIG. 21 includes wavelength selective branch 2150 and a power recycling branch 2160. The external resonator receives input beams from the laser source 2101, filters components of the input beams that correspond to undesired wavelengths, and images the input beams back onto the laser source 2101 in order to provide resonant feedback to the laser source 2101 and thereby facilitate beam wavelength stabilization.

In the embodiment depicted in FIG. 21, the laser source 2101 consists of a plurality of spatially separated individual diode laser emitters. The plurality of emitters of the laser source 2101 emit a plurality of beams that together constitute external resonator input 2110. External resonator input 2110 is therefore composed of a plurality of individual component beams, each of which is emitted by a single emitter in the laser source 2101. Prior to receiving any feedback, the individual emitters of the laser source 2101 have a relatively broad emission spectrum (as compared to the individual emitters after receiving feedback). More specifically, prior to receiving feedback from the external resonator, the individual emitters of the laser source 2101 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 21 depicts two particular external resonator input component beams, 2110A and 2110N, which are emitted by emitters 2101A and 2101N, respectively. Emitters 2101A and 2101N emit beams with a narrow spectral bandwidth. More specifically, the emission spectrum of component beams 2110A and 2110N exhibits a narrow peak about a particular wavelength where the wavelength corresponds to the wavelength of the feedback selected for emitters 2110A and 2110N by the external resonator cavity.

The component beams of the external resonator input 2110 are directed from the laser source 2101 through the first position-to-angle transformation optic 2102. The first position-to-angle transformation optic 2102 imparts an angle of incidence with respect to the thin-film notch filter 2104 upon each component beam of the external resonator input 2110. The particular angle of incidence imparted upon each component beam is determined by the spatial position of the individual emitter in the laser source 2101 that emitted the component beam.

After traveling through the first position-to-angle transformation optic 2102, the external resonator input 2110 interacts with the partially reflective element 2103. In the embodiment depicted in FIG. 21, the partially reflective element 2103 is a partially reflective mirror that reflects a substantial minority of the incident optical power as a first feedback arm input 2111 and that transmits a substantial majority of incident optical power as an output arm component 2112. In various implementations, partially reflective elements of various reflectivity may be utilized. However, in the configuration depicted in FIG. 21, the partially reflective mirror should transmit at least seventy percent of the incident optical power. If a larger component of the optical power of the external resonator input 2110 is reflected by the partially reflective element 2103 and filtered by the notch filter 2104, the wall plug efficiency of the DWBC system will suffer considerably. Depending on the characteristics of the system and the applications for which the DWBC system will be used, it may be preferable to utilize a partially reflective optical element that transmits ninety percent or greater of the incident optical power.

The notch filter 2104 is positioned at the focal point of the first position-to-angle transformation optic 2102 such that the component beams of the feedback arm input 2111 are focused at a point in space that lies on the front surface of the notch filter 2104. For a particular angle of incidence, the transmission spectrum of the notch filter 2104 exhibits a very narrow peak at a particular wavelength. Therefore, for each component beam of the first feedback arm input 2111, only a small component of the optical power corresponding to a very narrow wavelength range at which the notch filter 2104 has a transmission peak will be transmitted. The remaining optical power will be reflected out of the system and into one of the loss channels 2120A and 2120B.

The components of the first feedback arm input 2111 that are transmitted by the notch filter subsequently propagate through the second position-to-angle transformation lens 2105, which images the component beams of the laser source output 2101 onto the first highly reflective element 2106. The first highly reflective element 2106 reflects the transmitted components of the first feedback arm input 2111 as first feedback arm output 2113. First feedback arm output propagates back through the first feedback arm until it reaches the partially reflective mirror. Upon reaching the partially reflective mirror, the first feedback arm output is split into two separate components. A first component is reflected by the partially reflective mirror and subsequently travels back towards the plurality of diode laser emitters as a resonant feedback component 2114. A second component is transmitted through the partially reflective mirror and directed towards the second highly reflective element as a power recycling arm input 2115. The component beams of the power recycling arm input 2115 subsequently propagate through the third position-to-angle transformation lens 2107, which images the component beams of the laser source output 2101 onto the second highly reflective element 2106. The power recycling arm input is reflected by the second highly reflective element 2108 and directed back towards the partially reflective element 2102 as power recycling arm output 2121. A portion of the power recycling arm output 2116 is reflected by the partially reflective element 2102 as additional output arm input 2112, while a separate portion of the optical power of the power recycling arm output 2121 is transmitted as additional first feedback arm input 2111. Therefore, a component of the beams continues traveling back and forth through the first feedback arm and the power recycling arm. Thus, an interferometer is formed by the partially reflective element 2103, the first highly reflective element 2106, and the second highly reflective element 2108.

III. Composite Element Systems

Figure 22:
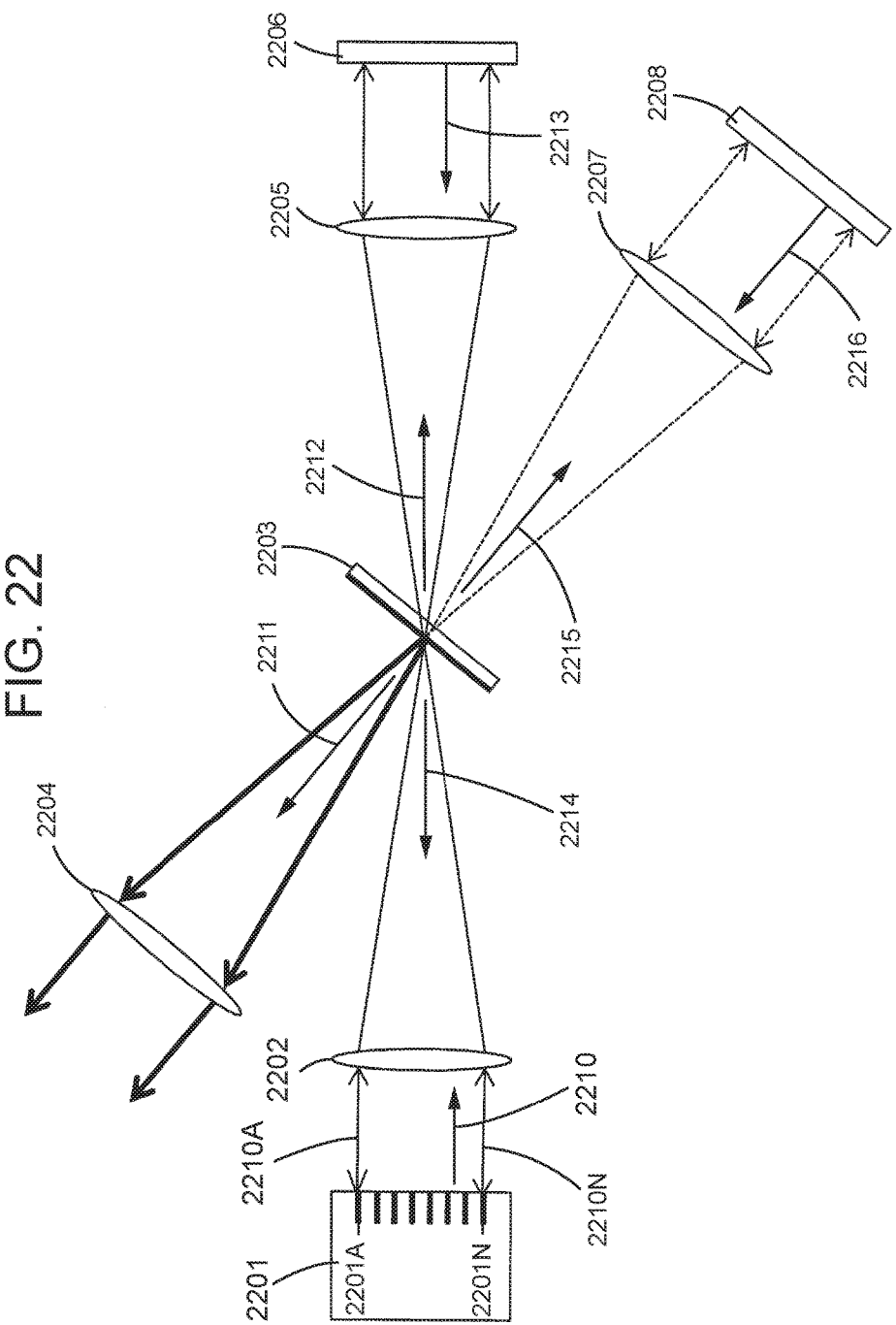
FIG. 22 illustrates a wavelength stabilization system, capable of use in a DWBC apparatus, that utilizes a thin-film etalon to direct an optical feedback component into a feedback-branch and to direct an optical output component towards a beam combining element.
Figure 23:
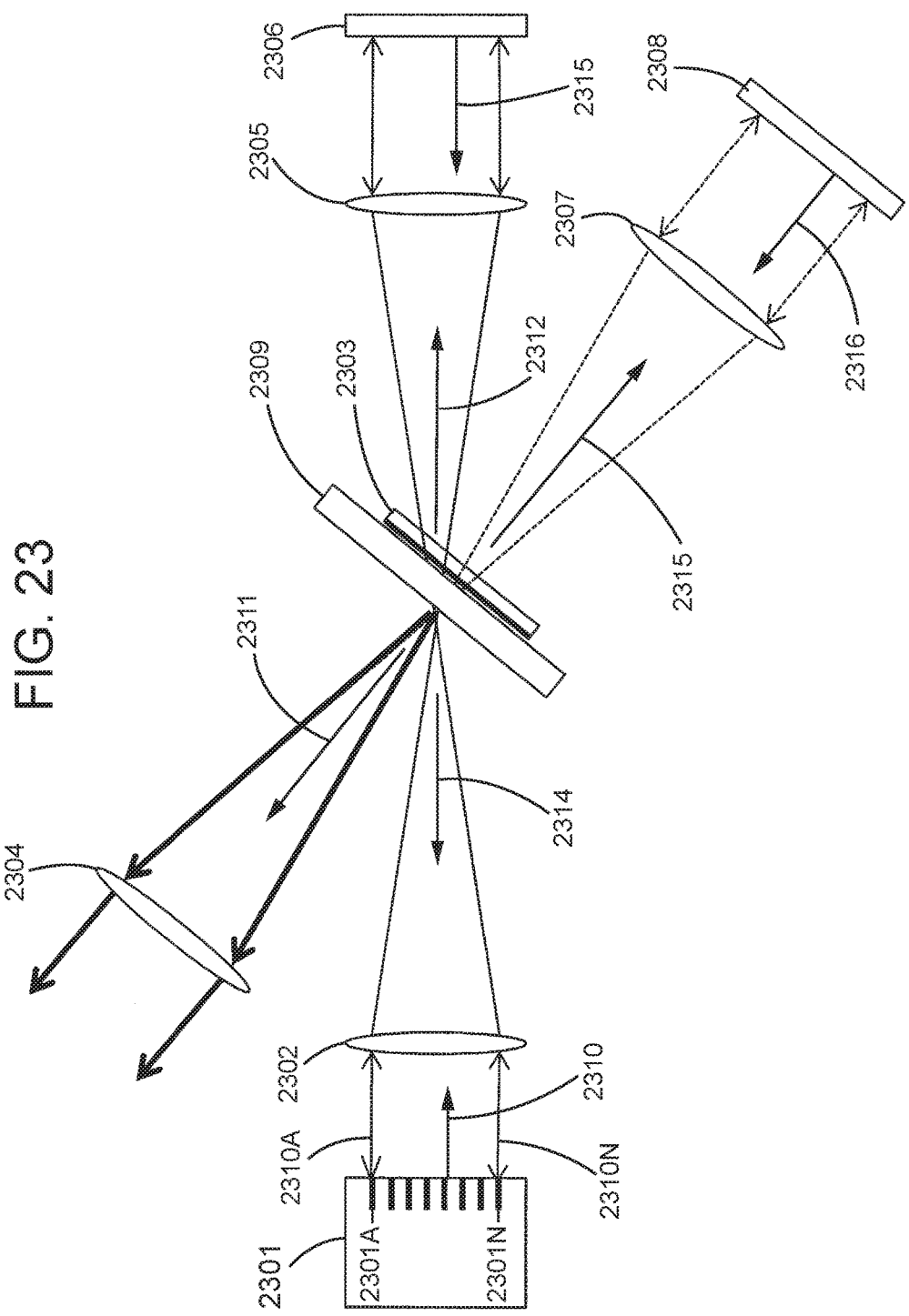
FIG. 23 illustrates a wavelength stabilization system, capable of use in a DWBC apparatus, that utilizes a partially reflective mirror of high reflectivity to direct an optical feedback component into a feedback-branch that utilizes a thin-film etalon as a wavelength selective element, wherein the partially reflective mirror of high reflectivity is positioned on the surface of the thin-film etalon.
Figure 27:
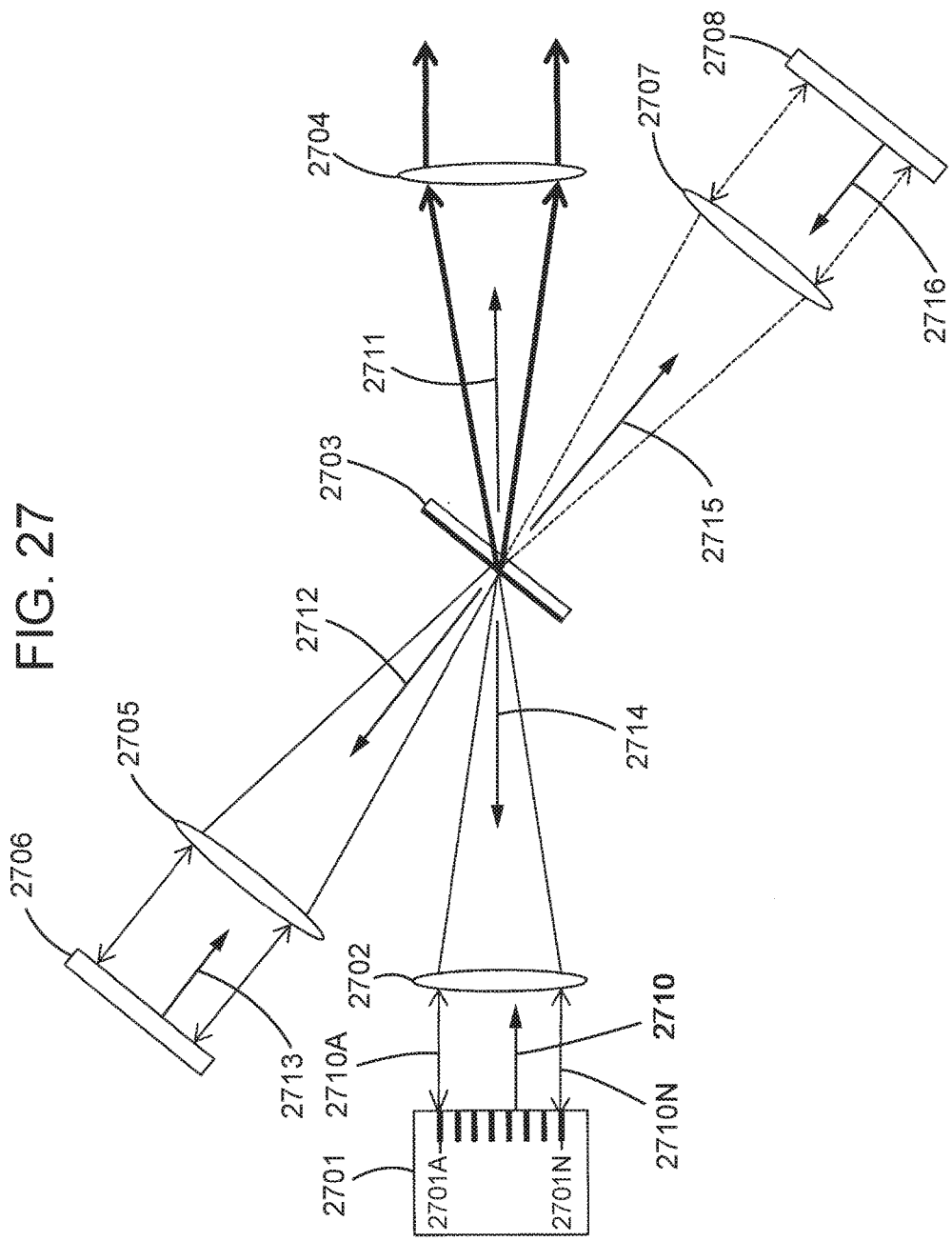
FIG. 27 illustrates a wavelength stabilization system, capable of use in a DWBC apparatus, that utilizes a thin-film notch filter to direct an optical feedback component into a feedback-branch and to direct an optical output component towards a beam combining element.

FIGS. 12-21 illustrate a variety of wavelength-stabilization systems, each capable of use in a DWBC apparatus, that limit optical power losses attributable to wavelength selective filtering elements by performing filtering on only a fraction of the total input optical power. Nevertheless, the wavelength stabilization systems of FIGS. 12-21 still have loss channels where optical power is lost. FIGS. 22, 23, and 27 provide advantages over the systems depicted in FIGS. 12-21 by eliminating loss channels attributable to the wavelength selection process performed by the thin-film filtering elements by coupling the loss channels into the system output channels. More specifically, the embodiments depicted in FIGS. 22, 23, and 27 transform the loss channels resulting from thin-film filtering into the primary sources of optical power to be coupled as system output.

FIGS. 22, 23, and 27 illustrate wavelength stabilization systems that include a laser source and a thin-film filtering element that serves as both a means for optical power splitting and wavelength selection for resonant feedback. As depicted in FIGS. 22, 23, and 27, the laser sources are arrays of individual diode laser emitters. However, in alternative embodiments, the individual laser emitters may be diode lasers, fiber lasers, solid-state lasers or any other type of lasers. The arrays of diode laser emitters may be one dimensional or two dimensional. Diode laser emitters typically emit beams with an asymmetric beam profile having two axes along which the beam diverges at disparate rates. The two axes are perpendicular to one another and perpendicular to the direction in which the beam propagates. A first of the two axes can be identified as a fast axis along which the beam diverges more rapidly, and the second of the two axes can be identified as a slow axis, along which the beam diverges comparatively more slowly.

Although not depicted in any of FIGS. 22, 23, and 27, a variety of optical elements may be used to manipulate the beams emitted by the individual diode emitters prior to the beams interacting with the elements depicted in FIGS. 22, 23, and 27. Such manipulation may be referred to as preprocessing, and a variety of prior art literature discusses techniques for preprocessing beams emitted by diode laser emitters. Preprocessing may be performed to ensure production of a high-quality multi-spectral combined output beam. For example, beams may be rotated such that downstream processing is performed along a fast axis rather than along a slow axis. Furthermore, some of the wavelength-stabilization system illustrated in FIGS. 22, 23, and 27 contain a number of optical elements that impart an angle of incidence with respect to a particular component upon one or more of the input beams emitted by the diode laser emitters of the laser source. In FIGS. 22, 23, and 27, such position-to-angle transformative elements are depicted as Fourier lenses. However, a variety of alternative possibilities that include Fresnel lenses, prismatic objects, and mirror configurations may be used to achieve the same effect.

FIG. 22 illustrates a wavelength-stabilization system, capable of use in a DWBC apparatus, that utilizes a thin-film etalon to direct an optical feedback component into a feedback-branch and to direct an optical output component towards a beam combining element. The apparatus depicted in FIG. 22 includes a laser source 2201 that includes a plurality of individual emitters (e.g. 2201A and 2201N), a first position-to-angle transformation optic 2202, a thin-film etalon 2203, a second position-to-angle transformation optic 2204, a third position-to-angle transformation optic 2205, a first highly reflective mirror 2206, a fourth position-to-angle transformation optic 2207, and a second highly reflective mirror 2208. As an alternative to the thin-film etalon depicted in FIG. 22, a chirped etalon could be utilized as well. However, if a chirped etalon is substituted for a thin-film etalon, the various position-to-angle transformation optics are not necessary. In the embodiment depicted in FIG. 22, the optical path between the laser source 2201 and the first and second highly reflective mirrors 2206 and 2208 defines a wavelength selective external resonator. The external resonator receives input beams from the laser source 2201, filters components of the input beams that correspond to undesired wavelengths, and images the filtered components of the input beams back onto the laser source 2201 in order to provide resonant feedback to the laser source 2201 and thereby facilitate beam wavelength stabilization.

In the embodiment depicted in FIG. 22, the laser source 2201 consists of a plurality of spatially separated individual diode laser emitters. The plurality of emitters of the laser source 2201 emit a plurality of beams that together constitute external resonator input 2210. External resonator input 2210 is therefore composed of a plurality of individual component beams, each of which is emitted by a single emitter in the laser source 2201. Prior to receiving any feedback, the individual emitters of the laser source 2201 have a relatively broad emission spectrum (as compared to the individual emitters after receiving feedback). More specifically, prior to receiving feedback from the external resonator, the individual emitters of the laser source 2201 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 22 depicts two particular external resonator input component beams, 2210A and 2210N, which are emitted by emitters 2201A and 2201N, respectively. Emitters 2201A and 2201N emit beams with a narrow spectral bandwidth. More specifically, the emission spectrum of component beams 2210A and 2210N exhibits a narrow peak about a particular wavelength where the wavelength corresponds to the wavelength of the feedback selected for emitters 2210A and 2210N by the external resonator cavity.

The component beams of the external resonator input 2210 are directed from the laser source 2201 through the first position-to-angle transformation optic 2202. The first position-to-angle transformation optic 2202 imparts an angle of incidence with respect to the thin-film etalon 2203 upon each component beam of the external resonator input 2210. The particular angle of incidence imparted upon each component beam is determined by the spatial position of the individual emitter in the laser source 2201 that emitted the component beam.

After traveling through the first position-to-angle transformation optic 2202, the external resonator input 2210 interacts with the etalon 2203. The etalon 2203 is positioned at the focal point of the first position-to-angle transformation optic 2202 such that the component beams of the external resonator input 2210 are focused at a point in space that lies on the front surface of the etalon 2203. For a particular angle of incidence, the transmission spectrum of the etalon 2203 exhibits a very narrow peak centered at a particular wavelength. Therefore, for each component beam of the external resonator input 2210, only a small component of the optical power corresponding to a very narrow wavelength range at which the etalon 2203 has a transmission peak will be transmitted as a feedback arm input 2212. However, because of the positioning of the etalon 2203, the remaining optical power not transmitted by the etalon 2203 will be reflected by the etalon 2203 at the second position-to-angle transformation lens 2204. Therefore, the optical power not transmitted by the etalon 2203 will be reflected as system output 2211.

The components of the external resonator input 2210 that are transmitted by the etalon 2203 subsequently propagate through the third position-to-angle transformation lens 2205, which images the component beams of the laser source output 2201 onto the first highly reflective element 2206. The first highly reflective element 2206 reflects the transmitted components of the feedback arm input 2212 as first feedback arm output 2213. First feedback arm output propagates back through the first feedback arm and interacts with the etalon 2203. Upon reaching the etalon 2203, the first feedback arm output 2213 is split into two separate components. A first component is transmitted through the etalon 2203 and subsequently travels back towards the plurality of diode laser emitters as a resonant feedback component 2214. A second component is reflected by the partially reflective surface and directed towards the second highly reflective element as a power recycling arm input 2215. The component beams of the power recycling arm input 2215 subsequently propagate through the fourth position-to-angle transformation lens 2207, which images the component beams of the laser source output 2201 onto the second highly reflective element 2208. The power recycling arm input is reflected by the second highly reflective element 2208 and directed back towards the etalon 2203 as power recycling arm output 2216. A portion of the power recycling arm output 2216 is transmitted by the etalon 2203 as an additional system output 2211, while a separate portion of the optical power of the power recycling arm output 2216 is reflected as additional feedback arm input 2211. Therefore, a component of the beams continues traveling back and forth through the first feedback arm and the power recycling arm.

Thus, an interferometer is formed by the etalon 2203, the first highly reflective element 2206, and the second highly reflective element 2208.

FIG. 23 illustrates a wavelength-stabilization system, capable of use in a DWBC apparatus, that utilizes a partially reflective mirror of high reflectivity to direct an optical feedback component into a wavelength selective feedback-branch that utilizes a thin-film etalon as a wavelength selective element, wherein the partially reflective mirror of high reflectivity is positioned on the surface of the thin-film etalon. The apparatus depicted in FIG. 23 includes a laser source 2301 that includes a plurality of individual emitters (e.g. 2301A and 2301N), a first position-to-angle transformation optic 2302, a thin-film etalon directly covered by a partially reflective surface 2303, a second position-to-angle transformation optic 2304, a third position-to-angle transformation optic 2305, a first highly reflective mirror 2306, a fourth position-to-angle transformation optic 2307, and a second highly reflective mirror 2308. In the embodiment depicted in FIG. 23, the optical path between the laser source 2301 and the first and second highly reflective mirrors 2306 and 2308 defines a wavelength selective external resonator. The external resonator receives input beams from the laser source 2301, filters components of the input beams that correspond to undesired wavelengths, and images the filtered components of the input beams back onto the laser source 2301 in order to provide resonant feedback to the laser source 2301 and thereby facilitate beam wavelength stabilization.

In the embodiment depicted in FIG. 23, the laser source 2301 consists of a plurality of spatially separated individual diode laser emitters. The plurality of emitters of the laser source 2301 emit a plurality of beams that together constitute external resonator input 2310. External resonator input 2310 is therefore composed of a plurality of individual component beams, each of which is emitted by a single emitter in the laser source 2301. Prior to receiving any feedback, the individual emitters of the laser source 2301 have a relatively broad emission spectrum (as compared to the individual emitters after receiving feedback). More specifically, prior to receiving feedback from the external resonator, the individual emitters of the laser source 2301 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 23 depicts two particular external resonator input component beams, 2310A and 2310N, which are emitted by emitters 2301A and 2301N, respectively. Emitters 2301A and 2301N emit beams with a narrow spectral bandwidth. More specifically, the emission spectrum of component beams 2310A and 2310N exhibits a narrow peak about a particular wavelength where the wavelength corresponds to the wavelength of the feedback selected for emitters 2310A and 2310N by the external resonator cavity.

The component beams of the external resonator input 2310 are directed from the laser source 2301 through the first position-to-angle transformation optic 2302. The first position-to-angle transformation optic 2302 imparts an angle of incidence with respect to the thin-film etalon 2303 upon each component beam of the external resonator input 2310. The particular angle of incidence imparted upon each component beam is determined by the spatial position of the individual emitter in the laser source 2301 that emitted the component beam.

After traveling through the first position-to-angle transformation optic 2302, the external resonator input 2310 interacts with the partially reflective surface covering the etalon 2303. In the embodiment depicted in FIG. 23, the partially reflective surface transmits a substantial minority of the incident optical power into the etalon 2303 and reflects a substantial majority of incident optical power as system output 2311. The component beams of the system output 2311 propagate through the second position-to-angle transformation lens 2304, which images the component beams onto a beam combining apparatus not depicted in FIG. 23. In various implementations, partially reflective surfaces of various reflectivity may be utilized. However, in the configuration depicted in FIG. 23, the partially reflective surface should reflect at least fifty percent of the incident optical power, and in order to achieve superior results for certain applications, the partially reflective surface should reflect at least seventy percent of the incident optical power.

The etalon 2303 is positioned directly beneath the partially reflective surface and at the at the focal point of the first position-to-angle transformation optic 2302 such that the component beams of the external resonator input 2310 are focused at a point in space that lies on the front surface of the etalon 2303. For a particular angle of incidence, the transmission spectrum of the etalon 2303 exhibits a very narrow peak centered at a particular wavelength. Therefore, for each component beam of the external resonator input 2310, only a small component of the optical power corresponding to a very narrow wavelength range at which the etalon 2303 has a transmission peak will be transmitted as a feedback arm input 2312. However, because of the positioning of the etalon 2303, the remaining optical power not transmitted by the etalon 2303 will be reflected at a direction parallel to the reflection from the reflective surface positioned directly above the etalon 2303. Therefore, the optical power not transmitted by the etalon 2303 will be reflected as a system output 2311.

The components of the external resonator input 2310 that are transmitted by the etalon 2303 subsequently propagate through the third position-to-angle transformation lens 2305, which images the component beams of the laser source output 2301 onto the first highly reflective element 2306. The first highly reflective element 2306 reflects the transmitted components of the feedback arm input 2312 as first feedback arm output 2313. First feedback arm output propagates back through the first feedback arm and through the etalon 2303 where it reaches the partially reflective surface. Upon reaching the partially reflective surface, the first feedback arm output 2313 is split into two separate components. A first component is transmitted through the partially reflective surface and subsequently travels back towards the plurality of diode laser emitters as a resonant feedback component 2314. A second component is reflected by the partially reflective surface and directed towards the second highly reflective element as a power recycling arm input 2315. The component beams of the power recycling arm input 2315 subsequently propagate through the fourth position-to-angle transformation lens 2307, which images the component beams of the laser source output 2301 onto the second highly reflective element 2308. The power recycling arm input is reflected by the second highly reflective element 2308 and directed back towards the etalon 2303 as power recycling arm output 2316. A portion of the power recycling arm output 2316 is transmitted by the partially reflective surface covering the etalon 2303 as an additional system output 2311, while a separate portion of the optical power of the power recycling arm output 2316 is reflected as additional feedback arm input 2311. Therefore, a component of the beams continues traveling back and forth through the first feedback arm and the power recycling arm. Thus, an interferometer is formed by the partially reflective surface covering the etalon 2303, the first highly reflective element 2306, and the second highly reflective element 2308.

Figure 24:
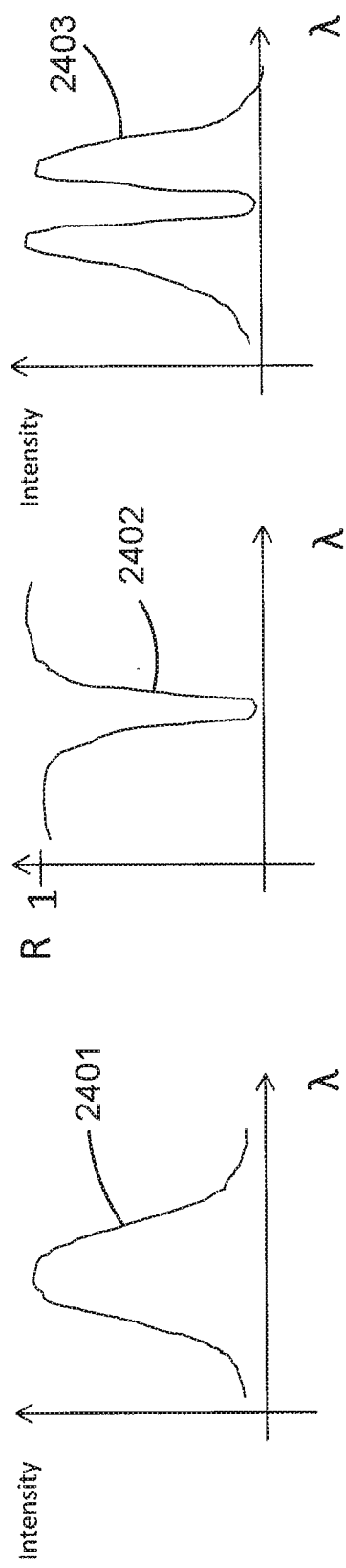
FIG. 24 is a graph depicting the bandwidth of the emission spectrum corresponding to an individual emitter in the laser source of FIG. 22, the bandwidth of the transmission spectrum of the etalon of FIG. 22 at a wavelength and angle of incidence corresponding to the individual emitter, and the reflection spectrum of the thin-film etalon of FIG. 22 at a wavelength and angle of incidence corresponding to the individual emitter.

FIG. 24 is a graph depicting the bandwidth of the emission spectrum corresponding to an individual emitter in the laser source of FIG. 22 (e.g. emitter 2201A), the bandwidth of the reflection spectrum of the etalon of FIG. 22 at a wavelength and angle of incidence corresponding to the individual emitter, and the spectral characteristics of the output beam component corresponding to the reflection by the etalon of the optical power emitted by the individual emitter. The emission spectrum, transmission spectrum, and spectral characteristics of the output beam depicted in FIG. 24 all pertain to a single emitter in the laser source 2201 of FIG. 22. The curve 2401 represents an emission spectrum of an individual emitter in the laser source of FIG. 22. As can be seen, the individual emitter emits optical power at a relatively narrow range of wavelengths. The emission spectrum represented by 2401 corresponds to an individual emitter in the laser source 2201 that has begun to receive feedback. Therefore, the beam corresponding to the emission spectrum represented by 2401 is of a sufficiently narrow spectral bandwidth such that it will not detract from the output beam quality of a DWBC system were it to be combined with other beams of similarly narrow spectral bandwidth.

The curve 2402 represents a reflection spectrum of the etalon 2203 of FIG. 22 at an angle of incidence corresponding to the individual emitter in the laser source 2201 whose emission spectrum is represented by the curve 2401. As can be seen, the reflection spectrum of the etalon is of a substantially narrower spectral bandwidth than is the emission spectrum represented by the curve 2401. A comparison of the curves 2401 and 2402 underscores the fact that an emission spectrum of an individual diode emitter in the laser source 2201 cannot be made increasingly narrow through providing substantially narrower feedback. Instead, spectral broadening effects such as spectral and spatial hole burning limit the degree to which the bandwidth of the emission spectrum of an individual diode emitter can be narrowed.

The curve 2403 represents the spectral characteristics of the output beam component corresponding to the reflection by the etalon 2203 of the optical power emitted by the individual emitter of the laser source 2201. The spectral characteristics of the output beam represented by the curve 2403 is a product of the emission spectrum of the individual emitter represented by the curve 2401 and the reflection spectrum represented by the curve 2402. The spectral characteristics of the output beam represented by the curve 2403 demonstrates that a considerable amount of optical power produced by the individual diode emitter is reflected by the etalon 2203 as a system output. However, depending on the particular application for which the DWBC apparatus is to be used, it may be desirable to couple relatively larger or relatively smaller amounts of optical power into the system output. The relative proportions of the optical power that are transmitted or that are reflected can be adjusted through selecting various characteristics of the etalon.

Figure 25:
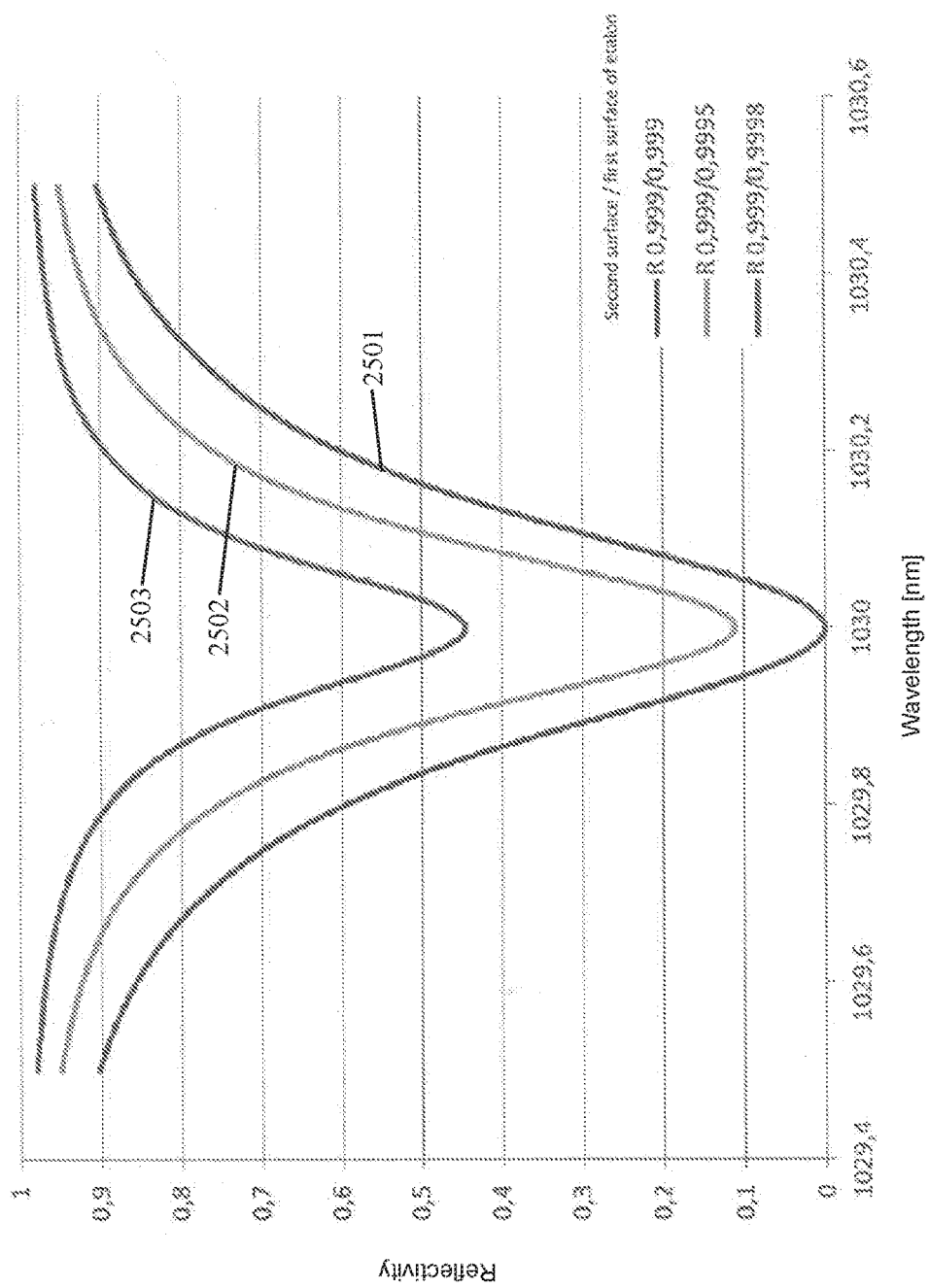
FIG. 25 is a graph depicting the reflection spectrum of multiple thin-film etalons having parallel reflective surfaces of various reflectivity.

FIG. 25 is a graph depicting the reflection spectrum of multiple thin-film etalons having parallel reflective surfaces of various reflectivity. The reflection spectrum represented by curve 2501 corresponds to an etalon having parallel reflective surfaces of symmetric high reflectivity. As can be seen, curve 2501 is nearly perfectly transmissive at a wavelength of 1030 nm and sharply less transmissive for small deviations in wavelength away from 1030 nm. The reflection spectrum represented by curves 2502 and 2503 correspond to etalons having parallel reflective surfaces of asymmetric reflectivity. As can be seen, as the degree of asymmetry between the reflectivity of the surfaces increases, the transmission peak of the etalon becomes increasingly shallow.

Figure 26:
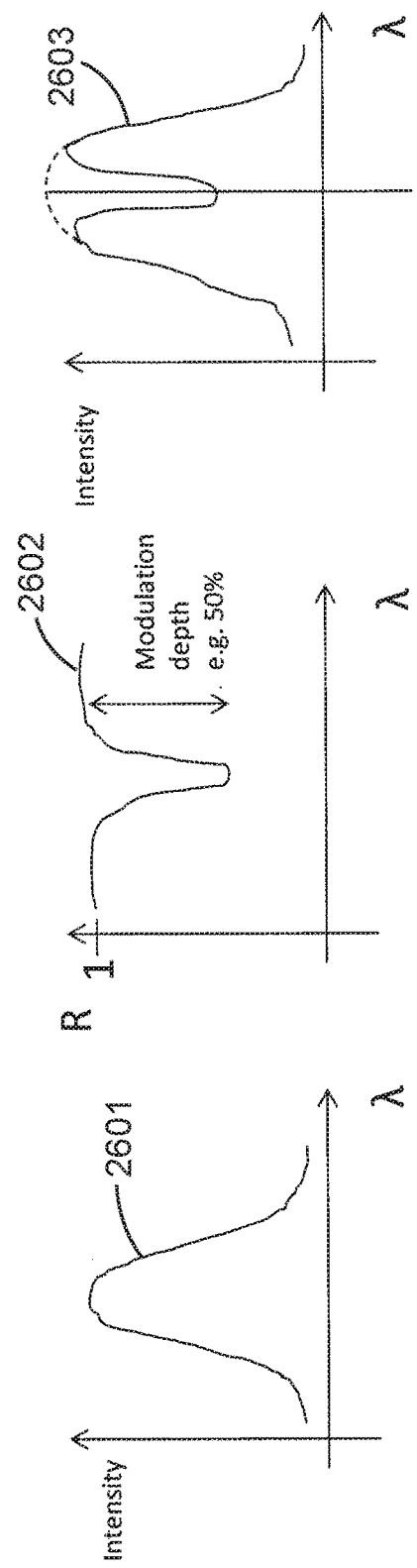
FIG. 26 is a graph depicting the bandwidth of the emission spectrum corresponding to an individual emitter in the laser source of FIG. 22, the bandwidth of the transmission spectrum of the etalon of FIG. 22 at a wavelength and angle of incidence corresponding to the individual emitter, and the reflection spectrum of the etalon of FIG. 22 at a wavelength and angle of incidence corresponding to the individual emitter, wherein the etalon of FIG. 22 has parallel reflective surfaces of asymmetric reflectivity.

FIG. 26 is a graph depicting the bandwidth of the emission spectrum corresponding to an individual emitter in the laser source of FIG. 22 (e.g. emitter 2201A), the bandwidth of the reflection spectrum of the etalon of FIG. 22 at a wavelength and angle of incidence corresponding to the individual emitter, wherein the etalon is composed of parallel reflecting surfaces of asymmetric reflectivity, and the spectral characteristics of the output beam component corresponding to the reflection by the etalon of the optical power emitted by the individual emitter. The emission spectrum, transmission spectrum, and spectral characteristics of the output beam depicted in FIG. 26 all pertain to a single emitter in the laser source 2201 of FIG. 22. The curve 2601 represents an emission spectrum of an individual emitter in the laser source of FIG. 22. As can be seen, the individual emitter emits optical power at a relatively narrow range of wavelengths. The emission spectrum represented by 2601 corresponds to an individual emitter in the laser source 2201 that has begun to receive feedback. Therefore, the beam corresponding to the emission spectrum represented by 2601 is of a sufficiently narrow spectral bandwidth such that it will not detract from the output beam quality of a DWBC system were it to be combined with other beams of similarly narrow spectral bandwidth.

The curve 2602 represents a reflection spectrum of the etalon 2203 of FIG. 22 at an angle of incidence corresponding to the individual emitter in the laser source 2201 whose emission spectrum is represented by the curve 2601. The reflection spectrum of the etalon 2203 represented by the curve 2602 corresponds to an etalon having parallel surfaces of asymmetric reflectivity. As can be seen, the reflection spectrum of the etalon is of a substantially narrower spectral bandwidth than is the emission spectrum represented by the curve 2601. However, due to the asymmetric reflectivity of the parallel reflective surfaces of the etalon, the transmission band of the etalon is not as deep as the transmission band of the etalon depicted in FIG. 24. Therefore, the curve 2603, which represents the spectral characteristics of the output beam component corresponding to the reflection by the etalon 2203 of the optical power emitted by the individual emitter of the laser source 2201, does not fall to zero at the wavelength at which the etalon is transmissive. Depending on the particular application for which the DWBC apparatus is to be used, it may be desirable to utilize an etalon having parallel reflective surfaces of asymmetric reflectivity in order to couple relatively larger or relatively smaller amounts of optical power into the system output.

FIG. 27 illustrates a wavelength-stabilization system, capable of use in a DWBC apparatus, that utilizes a thin-film notch filter to direct an optical feedback component into a feedback-branch and to direct an optical output component towards a beam combining element. The apparatus depicted in FIG. 27 includes a laser source 2701 that includes a plurality of individual emitters (e.g. 2701A and 2701N), a first position-to-angle transformation optic 2702, a thin-film notch filter 2703, a second position-to-angle transformation optic 2704, a third position-to-angle transformation optic 2705, a first highly reflective mirror 2706, a fourth position-to-angle transformation optic 2707, and a second highly reflective mirror 2708. As an alternative to the thin-film notch filter depicted in FIG. 27, a chirped notch filter could be utilized. If the thin-film notch filter is replaced with a chirped notch filter, the various transformation optics, i.e. the first position-to-angle transformation optic 2702, the second position-to-angle transformation optic 2704, the third position-to-angle transformation optic 2705, and the fourth position-to-angle transformation optic 2707, are not necessary. In the embodiment depicted in FIG. 27, the optical path between the laser source 2701 and the first and second highly reflective mirrors 2706 and 2708 defines a wavelength selective external resonator. The external resonator receives input beams from the laser source 2701, filters components of the input beams that correspond to undesired wavelengths, and images the filtered components of the input beams back onto the laser source 2701 in order to provide resonant feedback to the laser source 2701 and thereby facilitate beam wavelength stabilization.

In the embodiment depicted in FIG. 27, the laser source 2701 consists of a plurality of spatially separated individual diode laser emitters. The plurality of emitters of the laser source 2701 emit a plurality of beams that together constitute external resonator input 2710. External resonator input 2710 is therefore composed of a plurality of individual component beams, each of which is emitted by a single emitter in the laser source 2701. Prior to receiving any feedback, the individual emitters of the laser source 2701 have a relatively broad emission spectrum (as compared to the individual emitters after receiving feedback). More specifically, prior to receiving feedback from the external resonator, the individual emitters of the laser source 2701 produce optical power corresponding to a relatively broad range of wavelengths. However, as optical power propagates through the external resonator cavity and resonant feedback is transmitted back into the emitters, the emission spectrum of each of the individual emitters narrows considerably.

FIG. 27 depicts two particular external resonator input component beams, 2710A and 2710N, which are emitted by emitters 2701A and 2701N, respectively. Emitters 2701A and 2701N emit beams with a narrow spectral bandwidth. More specifically, the emission spectrum of component beams 2710A and 2710N exhibits a narrow peak about a particular wavelength where the wavelength corresponds to the wavelength of the feedback selected for emitters 2710A and 2710N by the external resonator cavity.

The component beams of the external resonator input 2710 are directed from the laser source 2701 through the first position-to-angle transformation optic 2702. The first position-to-angle transformation optic 2702 imparts an angle of incidence with respect to the thin-film notch filter 2703 upon each component beam of the external resonator input 2710. The particular angle of incidence imparted upon each component beam is determined by the spatial position of the individual emitter in the laser source 2701 that emitted the component beam.

After traveling through the first position-to-angle transformation optic 2702, the external resonator input 2710 interacts with the notch filter 2703. The notch filter 2703 is positioned at the focal point of the first position-to-angle transformation optic 2702 such that the component beams of the external resonator input 2710 are focused at a point in space that lies on the front surface of the notch filter 2703. For a particular angle of incidence, the reflection spectrum of the notch filter 2703 exhibits a very narrow peak centered at a particular wavelength. Therefore, for each component beam of the external resonator input 2710, only a small component of the optical power corresponding to a very narrow wavelength range at which the notch filter 2703 has a reflection peak will be reflected as a feedback arm input 2712. However, because of the positioning of the notch filter 2703, the remaining optical power not reflected by the notch filter 2703 will be transmitted through the notch filter 2703 to the second position-to-angle transformation lens 2704. Therefore, the optical power not reflected by the notch filter 2703 will be transmitted as system output 2711.

The components of the external resonator input 2710 that are reflected by the notch filter 2703 subsequently propagate through the third position-to-angle transformation lens 2705, which images the component beams of the laser source output 2701 onto the first highly reflective element 2706. The first highly reflective element 2706 reflects the transmitted components of the feedback arm input 2712 as first feedback arm output 2713. First feedback arm output propagates back through the first feedback arm and interacts with the notch filter 2703. Upon reaching the notch filter 2703, the first feedback arm output 2713 is split into two separate components. A first component is reflected by the notch filter 2703 and subsequently travels back towards the plurality of diode laser emitters as a resonant feedback component 2714. A second component is transmitted by the notch filter 2703 and directed towards the second highly reflective element as a power recycling arm input 2715. The component beams of the power recycling arm input 2715 subsequently propagate through the fourth position-to-angle transformation lens 2707, which images the component beams of the laser source output 2701 onto the second highly reflective element 2708. The power recycling arm input is reflected by the second highly reflective element 2708 and directed back towards the notch filter 2703 as power recycling arm output 2716. A portion of the power recycling arm output 2716 is reflected by the notch filter 2703 as an additional system output 2711, while a separate portion of the optical power of the power recycling arm output 2716 is transmitted as additional feedback arm input 2711. Therefore, a component of the beams continues traveling back and forth through the first feedback arm and the power recycling arm. Thus, an interferometer is formed by the notch filter 2703, the first highly reflective element 2706, and the second highly reflective element 2708.

Figure 28:
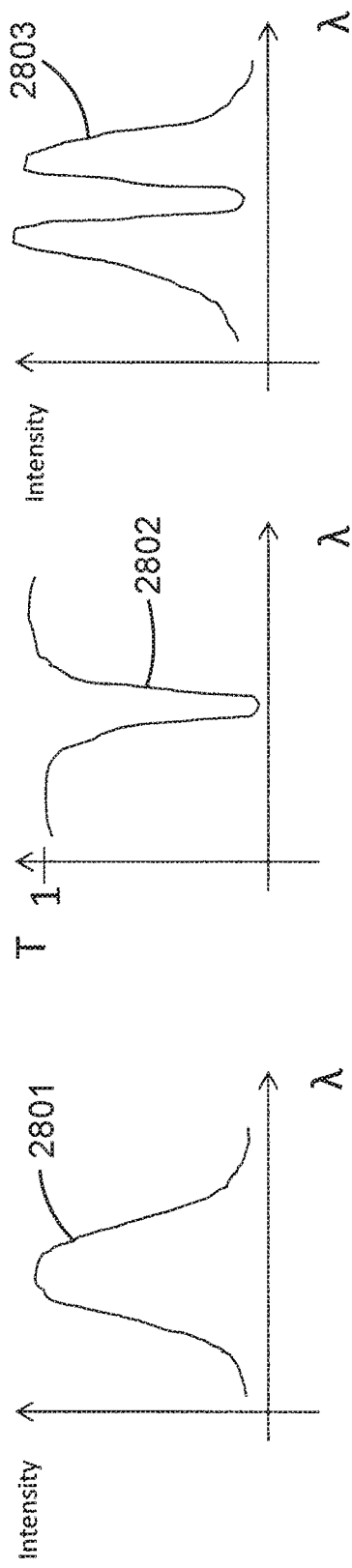
FIG. 28 is a graph depicting the bandwidth of the emission spectrum corresponding to an individual emitter in the laser source of FIG. 27, the bandwidth of the reflection spectrum of the notch filter of FIG. 27 at a wavelength and angle of incidence corresponding to the individual emitter, and the transmission spectrum of the notch filter of FIG. 27 at a wavelength and angle of incidence corresponding to the individual emitter.

FIG. 28 is a graph depicting the bandwidth of the emission spectrum corresponding to an individual emitter in the laser source of FIG. 27, the bandwidth of the transmission spectrum of the notch filter of FIG. 27 at a wavelength and angle of incidence corresponding to the individual emitter, and the spectral characteristics of the output beam component corresponding to the transmission by the notch filter of the optical power emitted by the individual emitter. The emission spectrum, transmission spectrum, and spectral characteristics of the output beam depicted in FIG. 28 all pertain to a single emitter in the laser source 2701 of FIG. 27. The curve 2801 represents an emission spectrum of an individual emitter in the laser source of FIG. 27. As can be seen, the individual emitter emits optical power at a relatively narrow range of wavelengths. The emission spectrum represented by 2801 corresponds to an individual emitter in the laser source 2701 that has begun to receive feedback. Therefore, the beam corresponding to the emission spectrum represented by 2801 is of a sufficiently narrow spectral bandwidth such that it will not detract from the output beam quality of a wavelength-stabilization system were it to be combined with other beams of similarly narrow spectral bandwidth.

The curve 2802 represents a transmission spectrum of the notch filter 2703 of FIG. 27 at an angle of incidence corresponding to the individual emitter in the laser source 2701 whose emission spectrum is represented by the curve 2801. As can be seen, the transmission spectrum of the notch filter is of a substantially narrower spectral bandwidth than is the emission spectrum represented by the curve 2801. A comparison of the curves 2801 and 2802 underscores the fact that an emission spectrum of an individual diode emitter in the laser source 2701 cannot be made increasingly narrow through providing substantially narrower feedback. Instead, spectral broadening effects such as spectral and spatial hole burning limit the degree to which the bandwidth of the emission spectrum of an individual diode emitter can be narrowed.

The curve 2803 represents the spectral characteristics of the output beam component corresponding to the transmission by the notch filter of the optical power emitted by the individual emitter. The spectral characteristics of the output beam represented by the curve 2803 is a product of the emission spectrum of the individual emitter represented by the curve 2801 and the transmission spectrum represented by the curve 2802. The spectral characteristics of the output beam represented by the curve 2803 demonstrates that a considerable amount of optical power produced by the individual diode emitter is transmitted by the notch filter as a system output. However, depending on the particular application for which the DWBC apparatus is to be used, it may be desirable to couple relatively larger or relatively smaller amounts of optical power into the system output. The relative proportions of the optical power that are transmitted or that are reflected can be adjusted through selecting various characteristics of the notch filter.

Figure 29:
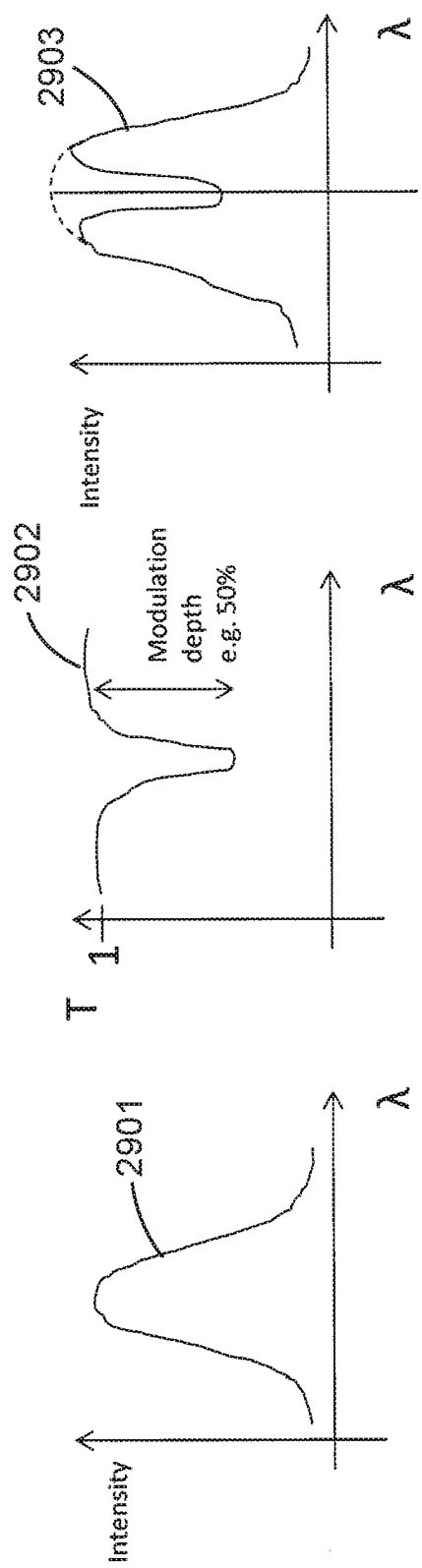
FIG. 29 is a graph depicting the bandwidth of the emission spectrum corresponding to an individual emitter in the laser source of FIG. 27, the bandwidth of the reflection spectrum of the notch filter of FIG. 27 at a wavelength and angle of incidence corresponding to the individual emitter, and the transmission spectrum of the notch filter of FIG. 27 at a wavelength and angle of incidence corresponding to the individual emitter.

FIG. 29 is a graph depicting the bandwidth of the emission spectrum corresponding to an individual emitter in the laser source of FIG. 27, the bandwidth of the transmission spectrum of the notch filter of FIG. 27 at a wavelength and angle of incidence corresponding to the individual emitter, and the spectral characteristics of the output beam component corresponding to the transmission by the notch filter of the optical power emitted by the individual emitter. The emission spectrum, transmission spectrum, and spectral characteristics of the output beam depicted in FIG. 29 all pertain to a single emitter in the laser source 2701 of FIG. 27. The curve 2901 represents an emission spectrum of an individual emitter in the laser source of FIG. 27. As can be seen, the individual emitter emits optical power at a relatively narrow range of wavelengths. The emission spectrum represented by 2901 corresponds to an individual emitter in the laser source 2701 that has begun to receive feedback. Therefore, the beam corresponding to the emission spectrum represented by 2901 is of a sufficiently narrow spectral bandwidth such that it will not detract from the output beam quality of a DWBC system were it to be combined with other beams of similarly narrow spectral bandwidth.

The curve 2902 represents a transmission spectrum of the notch filter 2703 of FIG. 27 at an angle of incidence corresponding to the individual emitter in the laser source 2701 whose emission spectrum is represented by the curve 2901. The transmission spectrum of the notch filter represented by the curve 2902 corresponds to a modified notch filter constructed to be only partially reflective at the selected wavelength. As can be seen, the transmission spectrum of the notch filter is of a substantially narrower spectral bandwidth than is the emission spectrum represented by the curve 2901. However, due to the partially reflective nature of the modified notch filter, the reflection band of the notch filter is not as deep as the reflection band of the notch filter depicted in FIG. 28. Therefore, the curve 2903, which represents the spectral characteristics of the output beam component corresponding to the transmission by the modified notch filter of the optical power emitted by the individual emitter of the laser source 2701, does not fall to zero at the wavelength at which the notch filter is designed to be reflective. Depending on the particular application for which the DWBC apparatus is to be used, it may be desirable to utilize a modified notch filter that exhibits attenuated reflectivity in order to couple relatively larger or relatively smaller amounts of optical power into the system output.

IV. Wavelength-Angle Selection Considerations for Producing a High Quality Combined Output Beam In order to produce a high-quality combined output beam, the beams that compose the combined output beam should be spatially overlapped and should share a common direction of propagation. In other words, it is desirable that the constituent beams of the combined output beam have no residual angular spectrum after emerging from the beam combining element, but instead emerge from an overlap region of the beam combining element while traveling parallel to a desired direction of propagation. In order to achieve the spatial and directional combining of constituent beams required for the production of a combined output beam of sufficient quality for various applications, the individual components of the DWBC apparatus must be positioned at precise relative locations. Furthermore, the characteristics and optical properties of each component must be selected in light of the characteristics and optical properties of the other components of the DWBC apparatus.

Figure 30:
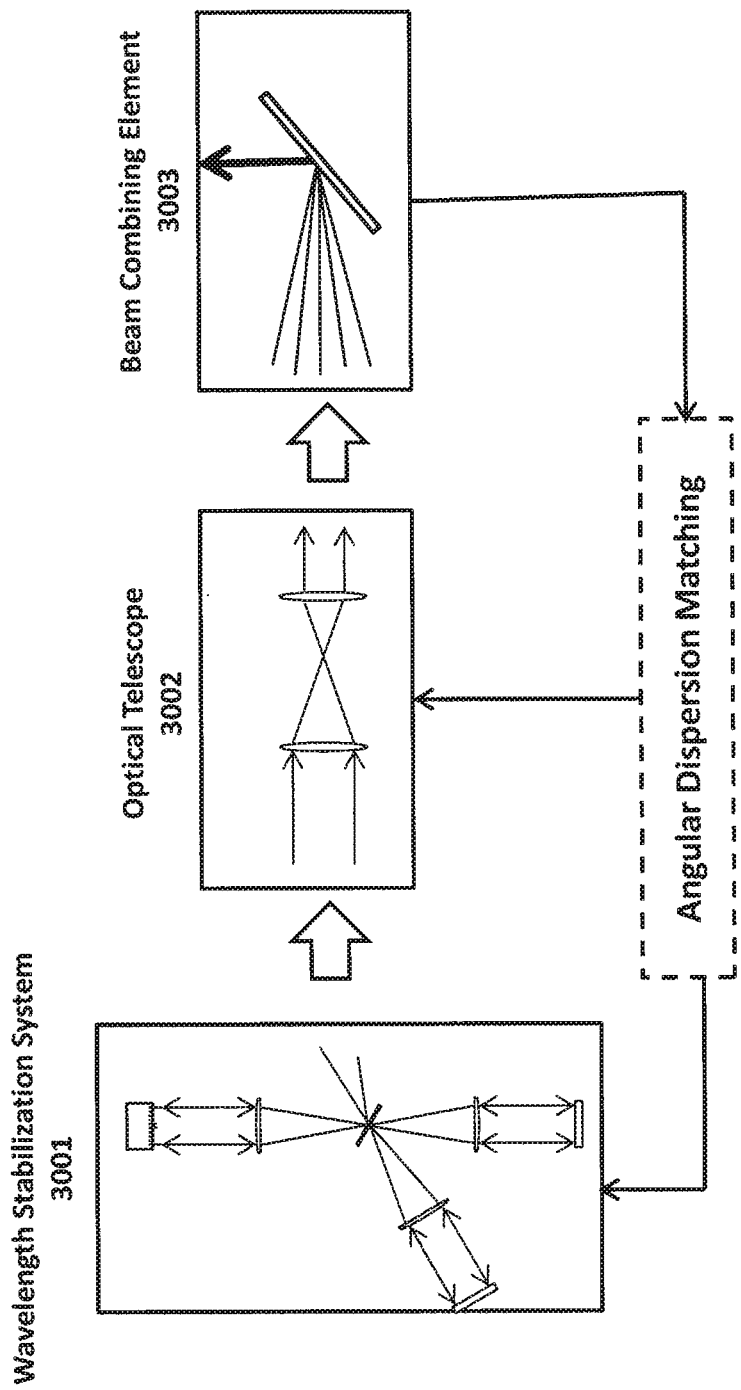
FIG. 30 depicts various components of a DWBC apparatus including a wavelength stabilization system, an optical telescope, and a dispersive beam combining element.

FIG. 30 depicts various components of a DWBC apparatus. The components defined in FIG. 30 include a wavelength stabilization system 3001, an optical telescope 3002, and a beam combining element 3003. The wavelength stabilization system 3001 directs a plurality of individual beams, which together constitute wavelength stabilization system output, through the optical telescope 3002 and towards the beam combining element 3003. Although the wavelength stabilization system 3001 depicted in FIG. 30 resembles the configurations depicted in FIGS. 22-23, any of the wavelength stabilization systems depicted in FIGS. 1, 10, 12-23, and 27, as well as a variety of additional wavelength stabilization systems not depicted nor described in this application, can be utilized as the wavelength stabilization system component of a DWBC apparatus such as that depicted by FIG. 30. Furthermore, although FIG. 30 includes an optical telescope 3002, not all DWBC apparatuses require an optical telescope. FIG. 30 is merely an example of the manner in which components of an example DWBC apparatus interrelate. The present invention may encompass a variety of DWBC apparatuses that include components not depicted in FIG. 30 or that do not include components that are depicted in FIG. 30.

The wavelength stabilization system 3001 includes a wavelength selective element that assigns a wavelength to each emitter in a laser source. In various implementations, such a wavelength selective element may be composed of a plurality of optical elements or may consist of a single optical component. The wavelength selective elements utilized by the wavelength stabilization systems depicted in FIGS. 1, 10, 12-23, and 27 are optical thin-film filter elements. Optical thin-film filter elements can be spectral band pass elements, which transmit certain narrowband wavelengths, or spectral band stop elements, which reflect certain narrowband wavelengths. However, the narrowband wavelengths that are transmitted or reflected are determined, at least in part, by the angle of incidence at which the radiation interacts with the thin-film filter element. In other words, the wavelength that is transmitted (in the case of a band pass element) or reflected (in the case of a band stop element) will change in response to a change in the angle of the incident beam. The band pass and band stop properties of the thin-film filtering elements result from multi-beam interference effects. Therefore, the wavelength selective nature of the thin-film filtering elements is not dependent upon diffraction or refraction and, apart from transmitting or reflecting the allowed narrow band wavelengths, the wavelength selective thin-film filter elements do not change the direction of monochromatic incident light in a wavelength dependent manner nor split an incident polychromatic light beam into an multiple monochromatic beams.

In the context of FIG. 30, a first component of the radiation emitted by a plurality of emitters in a laser source of the wavelength stabilization system 3001 is directed back into the individual emitters as resonant feedback, while a second component is directed out of the wavelength stabilization system 3001. The second component (that which is directed out of the wavelength stabilization system) is directed at the beam combining element 3003 through the optical telescope 3002. The beam combining element 3003 is an angular-dispersive optical element, i.e. an optical element that deflects an incident monochromatic light beam. The direction at which the deflected beam emerges from the angular-dispersive optical element is determined by the wavelength of the incident monochromatic beam and by the angle of incidence of the incident beam. The angle of incidence and angle of deflection can be defined with respect to the surface normal of the angular-dispersive optical element. The optical properties of an angular-dispersive optical element, such as the beam combining element 3003, rely either on the phenomena of diffraction or on the phenomena of refraction. Therefore, the angle of deflection can be described as either an angle of diffraction or an angle of refraction depending on the characteristics of the particular angular-dispersive optical element.

When a polychromatic light beam is incident upon an angular dispersive optical element (such as the beam combining element 3003), the angular-dispersive optical element will split the polychromatic light beam into multiple monochromatic light beams. Each of the monochromatic light beams will emerge from the angular-dispersive optical element with a residual angle of propagation defined with respect to a referential direction of propagation. For each emerging monochromatic beam, the residual angle (which is an angle of diffraction or refraction depending on the characteristics of the optical element) is determined solely by its wavelength. In other words, each of the emerging monochromatic beams corresponds to a single wavelength-output angle pair. The wavelength-output angle pair is determined by the angle of incidence of the polychromatic beam and the wavelength of the monochromatic beam.

In the context of the DWBC apparatus of FIG. 30, a polychromatic combined output beam is the desired output from the beam combining element 3003. Therefore, the wavelength-angle of incidence pairs of the incident monochromatic beams should be selected from the universe of wavelength-angle of incidence pairs that will produce a combined output beam. The universe of allowed wavelength-angle pairs that will emerge from the beam combining element 3003 is determined by the characteristics of the beam combining element. Therefore, characteristics of the beam combining element 3003 determine a beam combining condition that defines the set of allowed wavelength-angle of incidence pairs that will produce a combined output beam consisting of constituent beams having a common direction of propagation. Thus, the wavelength stabilization system 3001 and the optical telescope must be selected and positioned such that the second component of the radiation emitted by the plurality of emitters of the laser source be composed of constituent beams that meet the criteria defined by the beam combining condition.

However, the beams that reach the output beam combining element 3003 possess a spectrum of wavelength-angle pairs that is impacted by the properties of the components of the wavelength stabilization system 3001. In particular, the wavelength-filtering element, which in the wavelength stabilization systems depicted in FIGS. 1, 10, 12-23, and 27 is a thin-film filtering element, selects a wavelength for each emitter in the laser source. Specifically, for a given angle of incidence, the wavelength-filtering elements of the wavelength stabilization systems depicted in FIGS. 1, 10, 12-23, and 27, transmit or reflect only a single, unique narrowband wavelength. At that particular angle of incidence, all other wavelengths are non-resonant with the filtering element and will be coupled out of the feedback branch that provides resonant feedback back into each lasing element, or emitter, of the laser source. However, at slightly different angles, slightly different unique wavelengths are resonant with the filtering element and are reflected or transmitted. The wavelength stabilization system utilizes position-to-angle transformation optics to convert small differences in the positions of the emitters into small differences in angles of incidence with respect to the filtering element. The filtering element thereafter selects a narrow band wavelength spectrum of radiation for transmission or reflection at each angle of incidence corresponding to each emitter. The wavelength stabilization system thereafter reflects the beams corresponding to the narrow band wavelength spectrum back into the emitters thereby stimulating further emission of radiation with the same wavelengths. In this manner, each channel (emitter) in the laser source adjusts its emission wavelength to the wavelength at which the wavelength stabilization system provides it with feedback. While each channel adjusts to a single wavelength, the configuration does not preclude the possibility that multiple channels will each emit beams of the same wavelength. For example, in situations where the laser source is a stack of diode bars, it may be possible that individual emitters from different diode bars emit beams of the same wavelength.

Therefore, it is irrelevant whether the initial channel separation is linear in space or not. The arrangement always adjusts the wavelength of each channel such that the beam emitted by the channel experiences reduced losses at the filtering element. Thus, a nonlinear spatial emitter separation leads to a nonlinear angle spectrum and a nonlinear angle-to-wavelength correlation.

However, in many implementations, the wavelength filtering element will exhibit a nonlinear transmission or reflection characteristic with respect to the allowed wavelength-angle pairs regardless of whether the initial channel separation is nonlinear. Where the wavelength stabilization system 3001 utilizes an etalon as a wavelength selective element, the allowed wavelength-angle pairs are defined by the interference condition: $m\lambda = 2d\sqrt{n_{eff}^2 - \sin^2\theta}$. Thus, the thickness d of the etalon, or more precisely, the optical thickness $n_{eff}*d$ of the etalon, defines the number of transmitted orders m. For the case of a single transmitted order (m=1) and a given central wavelength transmitted at a particular angle of incidence, different wavelengths will be transmitted at different angles of incidence. Thus, the optical thickness $n_{eff}*d$ of the etalon dictates its wavelength-angle dispersion properties, i.e. the optical thickness $n_{eff}*d$ determines the allowed wavelength-angle pairs. The wavelength-angle dispersion (i.e. the change in the transmitted wavelength that corresponds to a change in angle of incidence relative to another allowed wavelength-angle pair) imparted upon the plurality of incident beams by the etalon is provided by the equation $$\frac{d\theta}{d\lambda} = -\frac{1}{\lambda} \times \frac{n_{eff}^2 - \sin^2\theta}{\sin\theta \cdot \cos\theta}.$$

The wavelength-angle dispersion function strongly varies with the angle of incidence and therefore also with the wavelength assigned to the wavelength-stabilizing resonator. The derivative of the wavelength-angle dispersion imparted by the etalon is given by the equation $$\frac{d}{d\theta}\frac{d\theta}{d\lambda} = \frac{1}{\lambda}\left[2 + (n_{eff}^2 - \sin^2\theta)\frac{\cos^2\theta - \sin^2\theta}{\cos^2\theta \sin^2\theta}\right].$$

This characteristic of the allowed wavelength-angle pair relationship defined by the etalon must be compared with the dispersion nonlinearity of the beam combining element.

Figure 31:
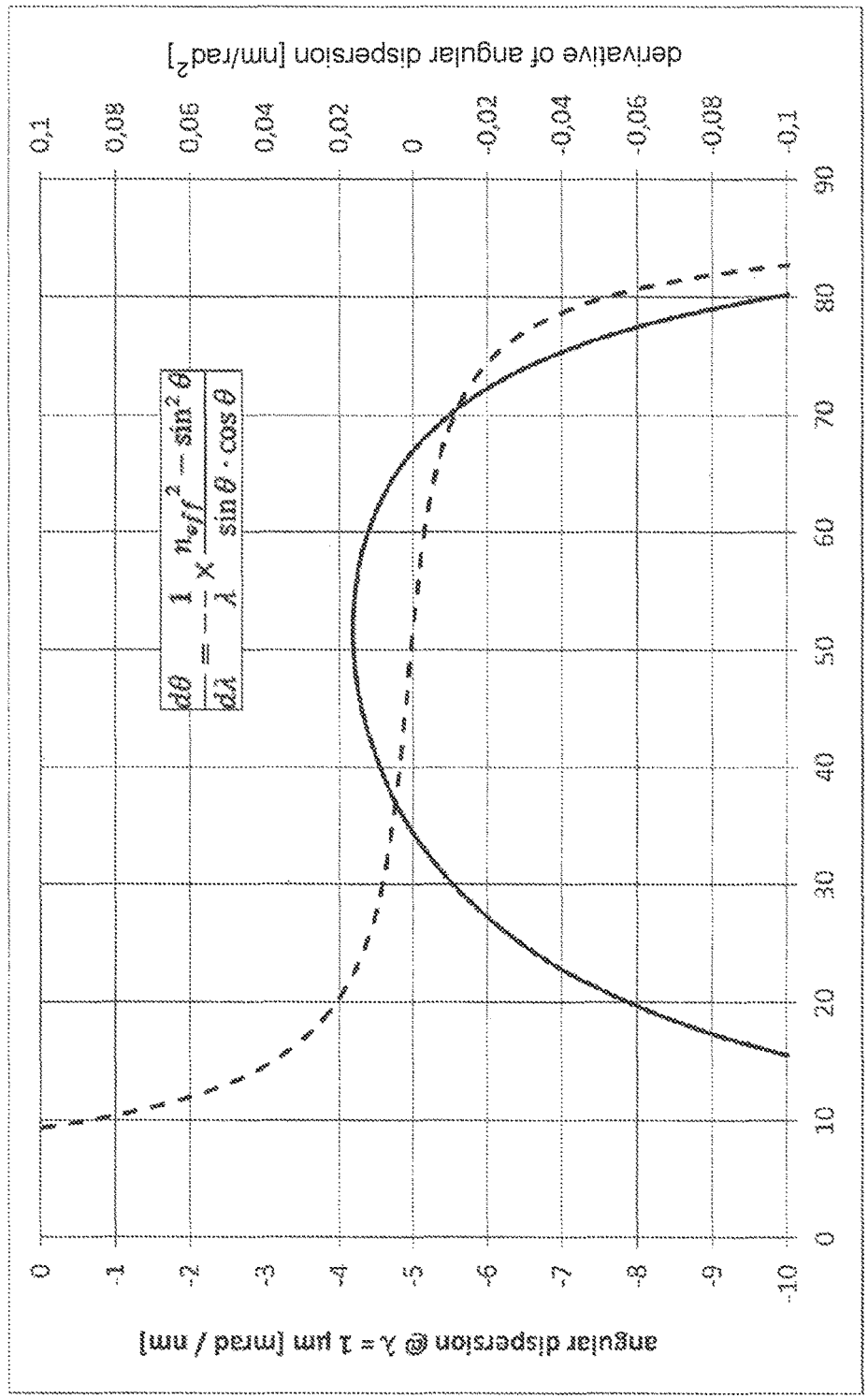
FIG. 31 is a graph depicting the wavelength-angle dispersion of a thin-film filter and the derivative of the wavelength-angle dispersion of the thin-film filter.

FIG. 31 is a graph depicting the wavelength-angle dispersion of a thin-film filter and the derivative of the wavelength-angle dispersion of the thin-film filter. For a low refractive index ($n_{eff}$=1.629) fused silica cavity spacer layer, one finds that the wavelength-angle dispersion exhibits a maximum at an angle of incidence of roughly 55° and is roughly constant over an angular spectrum centered about 55°. At approximately 55°, the derivative of the wavelength-angle dispersion goes to zero, and for a certain angular spread (i.e. a certain range of angles of incidence) centered about 55°, the derivative of the wavelength-angle dispersion remains relatively constant at values close to zero. However, as can be seen from FIG. 31, as the angle of incidence varies by greater amounts from 55°, the wavelength-angle dispersion varies by increasingly greater amounts for a given difference in angle of incidence and the magnitude of the derivative of the wavelength-angle dispersion increases significantly. In this way the nonlinearity of the etalon can be tailored. Specifically, the thickness of the thin-film filter and the orientation of the thin-film filter within the wavelength stabilization system (which determines the angle of incidence of the beams with respect to the thin-film filter) can be selected such that, for a particular range of wavelengths, the values of $$\frac{d}{d\theta}\frac{d\theta}{d\lambda}$$

of the wavelength angle relationship defining the wavelength-angle pairs allowed by the thin-film filter match the values of $$\frac{d}{d\theta}\frac{d\theta}{d\lambda}$$

of the wavelength angle relationship defining the wavelength-angle pairs required by the beam combining condition determined by the characteristics of the beam combining element 3003. In some cases, although it may not be possible to achieve an exact match, it may be possible to tailor the characteristics of the thin-film filter such that, for a range of wavelengths (i.e. for a particular wavelength spectrum), the values of $$\frac{d}{d\theta}\frac{d\theta}{d\lambda}$$

of the thin-film filter wavelength angle relationship have the same sign, i.e. positive or negative, as the values of $$\frac{d}{d\theta}\frac{d\theta}{d\lambda}$$

of the wavelength angle relationship of the beam combining condition. The wavelength spectrum for matching the derivatives (or for matching the signs of the derivatives) of the wavelength-angle relationships may correspond to a wavelength spectrum that includes all wavelengths emitted by the plurality of emitters in the laser source emit, or it may correspond to a subset thereof.

Figure 32:
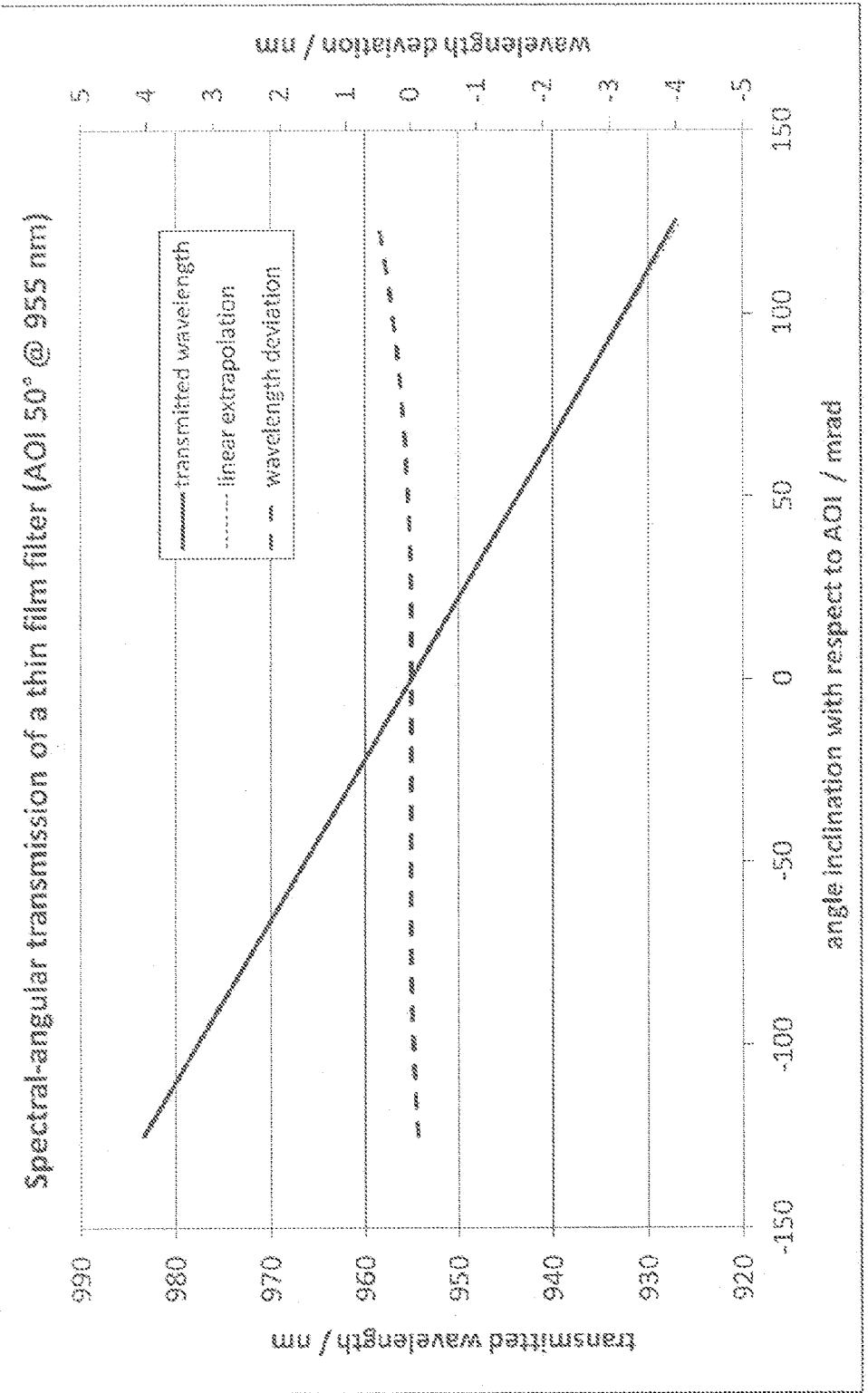
FIG. 32 is a graph depicting a wavelength-angle spectrum emerging from a wavelength stabilization system.

FIG. 32 is a graph depicting the wavelength-angle spectrum emerging from the wavelength stabilization system 3001 where the thin-film filter is operated such that an angle of incidence spread of incident beams is centered about an angle of incidence of 50°. As can be seen, a constant change in the angle of incidence corresponds to an approximately constant change in the transmitted wavelength. However, as the angle of incidence differs by increasingly greater amounts from the 50° angle of incidence center, the response of the transmitted wavelength to a change in angle of incidence becomes increasingly nonlinear. The wavelength-angle spectrum emerging from the wavelength stabilization system 3001 can be said to have both linear and non-linear components. The linear components correspond to the linear extrapolation depicted by the dotted line, while the non-linear components can be defined as components that determine the amount from the linear extrapolation that the transmitted wavelength deviates.

Figure 33:
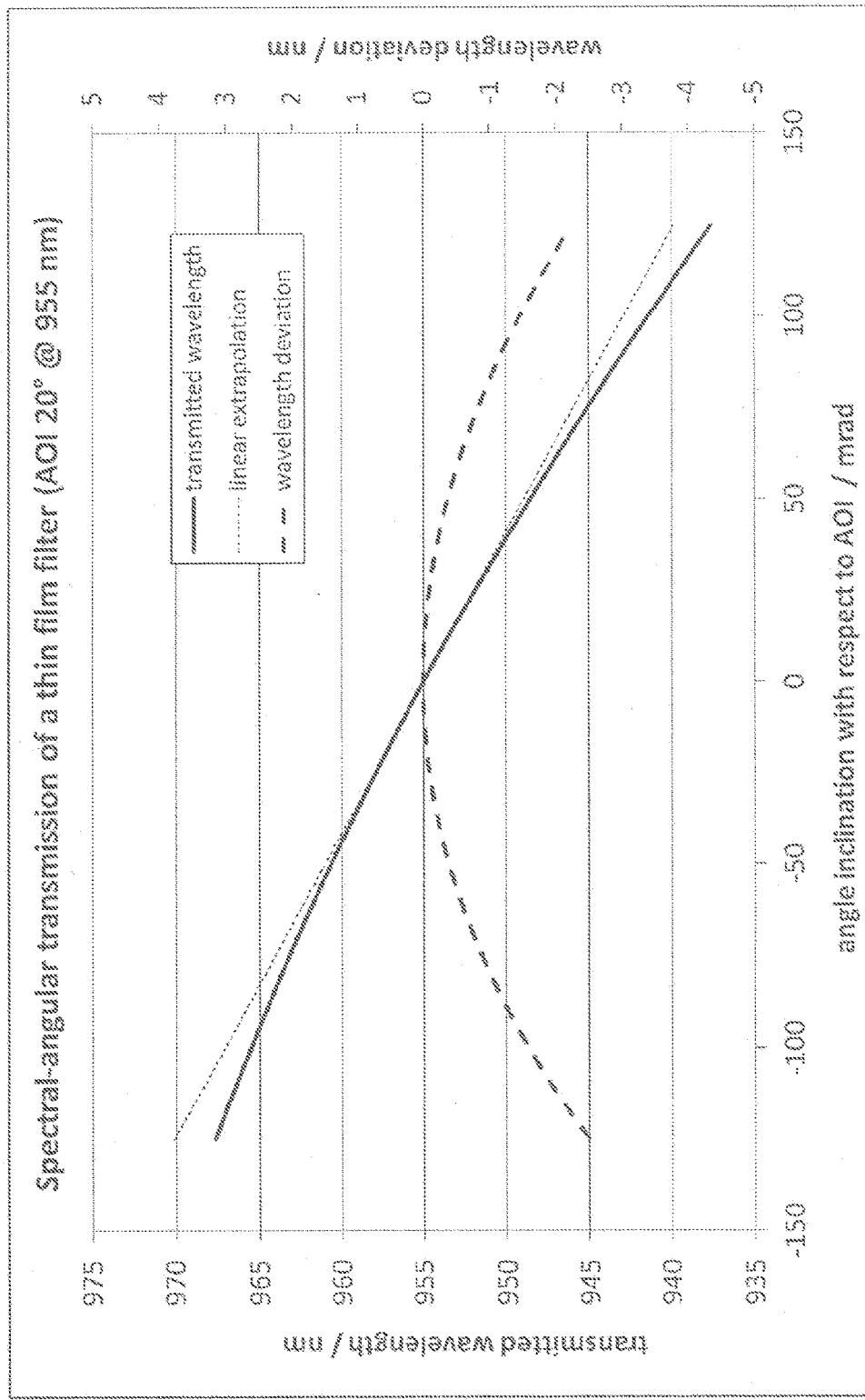
FIG. 33 is a graph depicting an alternative wavelength angle spectrum emerging from a wavelength stabilization system.

FIG. 33 is a graph depicting the wavelength angle spectrum emerging from the wavelength stabilization system 3001 where the thin-film filter is operated such that an angle of incidence spread of the incident beams is centered about an angle of incidence of 20°. As can be seen, the response of the angle of the transmitted wavelength to changes in the angle of incidence is nonlinear throughout the range of angle of incidence. However, the wavelength-angle relationship of the beam combining element 3003 may also exhibit a nonlinear pairing function. Specifically, the beam combining condition determined by the properties of the beam combining element 3003 may require wavelength-angle pairs that exhibit a nonlinear pairing function. The wavelength-angle spectrum emerging from the wavelength stabilization system 3001 can be said to have both linear and non-linear components. The linear components correspond to the linear extrapolation depicted by the dotted line, while the non-linear components can be defined as components that determine the amount from the linear extrapolation that the transmitted wavelength deviates. The nonlinear components therefore correspond to the wavelength deviation depicted by the dashed line.

Figure 34:
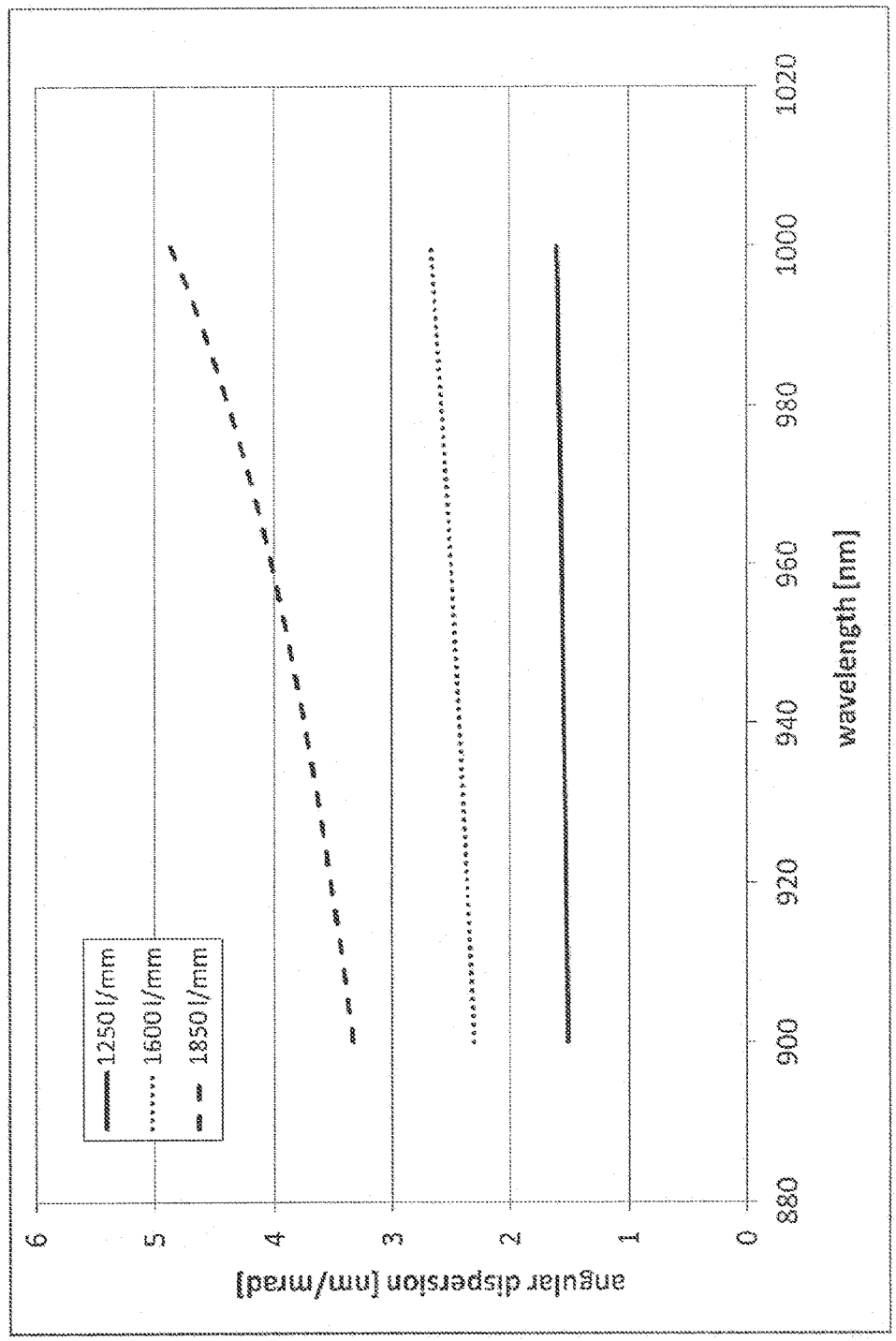
FIG. 34 is a graph depicting the wavelength-angle dispersion of various angular-dispersive elements.

FIG. 34 is a graph depicting the wavelength-angle dispersion, i.e. the change in wavelength corresponding to a change in the angle, as a function of wavelength for various angular-dispersive elements. The angular dispersive elements whose characteristics provide the curves shown in FIG. 34 are diffraction gratings having various numbers of lines per millimeter. As can be seen from the graph, the greater the concentration of lines on the grating, the greater the range of the wavelength-angle dispersion over the range of wavelengths represented. Therefore, the beam combining condition determined by the characteristics of the beam combining element 3003 may require wavelength angle pairs wherein the relationship between the angles and wavelengths of allowed pairs is nonlinear. In particular, a linear curve can be extrapolated for each of the curves depicted in FIG. 34 wherein the extrapolated linear curve defines the linear dispersion of the corresponding grating. The deviations from the linear curve required to produce the curves that correspond to the actual wavelength-angle dispersions represented by the curves in FIG. 34 define the nonlinear components of the wavelength-angle dispersions of each of the gratings.

In reference to FIGS. 32-33, the curves representing the wavelength deviation illustrate a particular wavelength deviation provided by a thin-film filter having particular characteristics for a range of wavelengths. In reference to FIG. 34, the curves representing the angular-dispersion correspond to a particular wavelength deviation required by a beam combining condition determined by a beam combining element having particular characteristics. Thus, the thin-film filter can be tailored to provide a wavelength deviation corresponding to a wavelength-angle relationship of the thin-film filter wherein the provided wavelength deviation matches a wavelength deviation of a beam combining condition determined by an output coupling element. In other words, the thin-film filter can be tailored to produce a wavelength-angle relationship having non-linear components that attenuate the non-linear components of the beam combining element.

Figure 35:
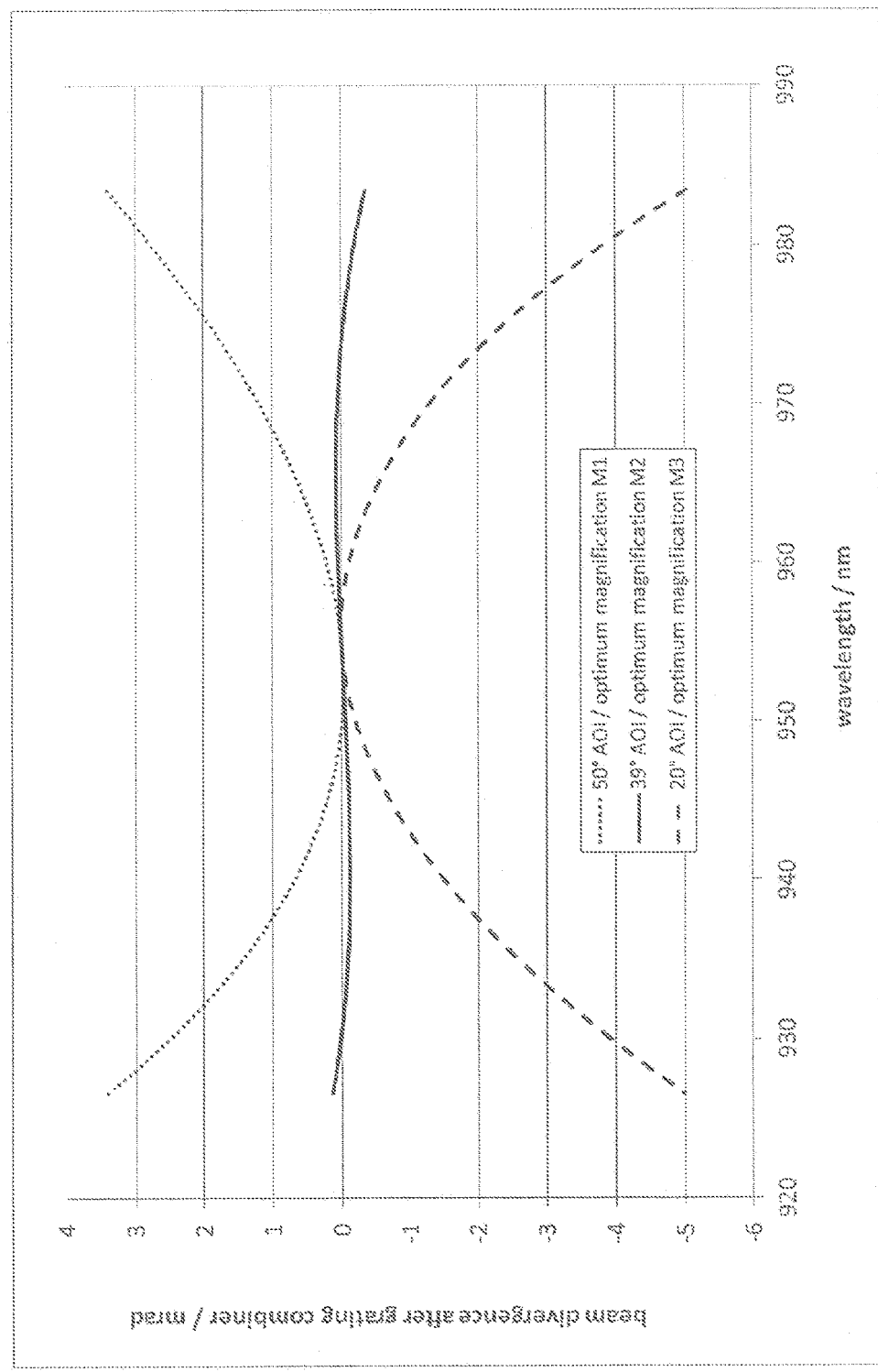
FIG. 35 is a graph depicting beam divergence of a combined beam emerging from a beam combining element after traversing various configurations of wavelength stabilization systems.

FIG. 35 is a graph depicting the beam divergence of a combined beam emerging from the beam combining element 3003 for various configurations of the wavelength stabilization system. In particular, the curves depicted in FIG. 35 correspond to DWBC apparatuses where the optical telescope 3002 is configured to provide the optimum magnification that minimizes the beam divergence. However, as can be seen in FIG. 35, despite the optimum magnification of the optical telescope 3002, the beam divergence of the constituent beams of the combined output beam emerging from the beam combining element 3003 is significant for two of the three thin-film filter configurations. Furthermore, the least residual beam divergence is achieved when the thin-film filter is operated in a regime (corresponding to an angular spectrum centered about 39°) where the wavelength-angle relationship is significantly nonlinear (as opposed to the more linear regime corresponding to an angular spectrum centered about 50°).

As can be seen from FIG. 35, the beam divergence, that is the divergence of the constituent beams of the combined output beam, can be greatly impacted by the characteristics of the thin-film filtering element, and in particular, the dispersion matching of the wavelength selective and beam combining components. In particular, once the angle of incidence is defined, the thickness of the thin-film filter is defined as well. Therefore the thickness of the thin-film filter, or more specifically, the optical thickness of the thin-film filter, $n_{\mathit{eff}}*d$, represents a parameter than can be adjusted to account for the nonlinear dispersion of the beam combining element. In particular, the nonlinearity of the thin-film filter can be tailored through appropriate selection of angle of incidence such that the derivative of the wavelength-angle dispersion of the thin-film filter approximately matches the derivative of the wavelength-angle dispersion of the beam combining element. Specifically, the characteristics of the thin-film filter, or of any other type of thin-film filtering element, can be tailored such that, for a particular range of wavelengths or for a particular angular spectrum, the values of $$\frac{d}{d\theta}\frac{d\theta}{d\lambda}$$

of the wavelength angle relationship defining the wavelength-angle pairs allowed by the thin-film filtering element are positive or negative.

Nevertheless, even if the nonlinearity of the wavelength-angle relationship allowed by the thin-film filtering element matches the nonlinearity of the wavelength-angle relationship required by the output coupling condition determined by the beam combining element, the output beam quality may be suboptimal. The optical telescope 3002 may be utilized to impose a constant, linear change in the angular component of the wavelength-angle pairs of the beams emerging from the wavelength stabilization system 3001 without impacting the wavelength component.

Figure 36:
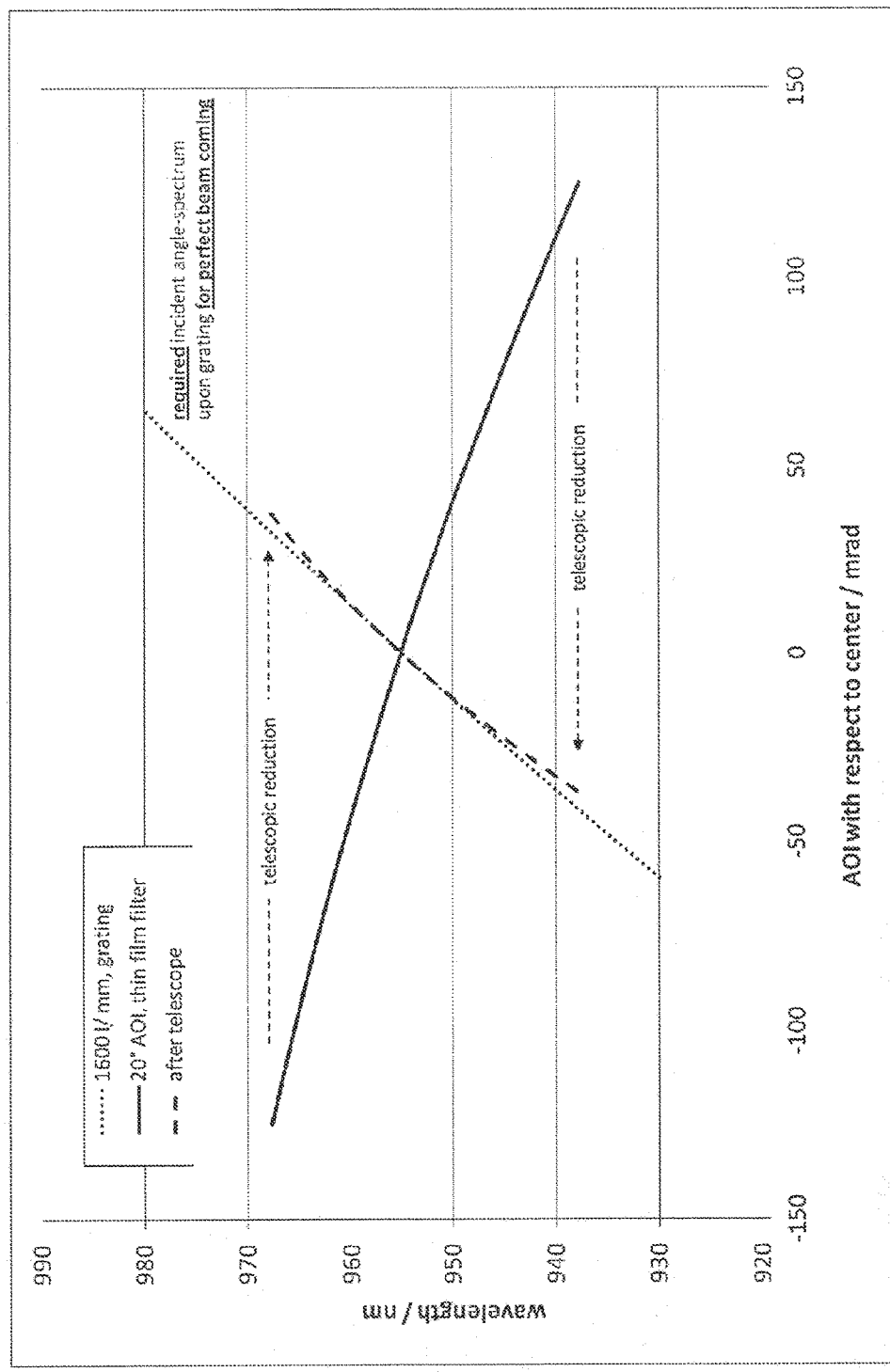
FIG. 36 is a graph depicting the linear adjustment of a wavelength-angle spectrum emerging form a wavelength stabilization system.

FIG. 36 is a graph depicting the linear adjustment of the wavelength-angle spectrum emerging form the wavelength stabilization system 3001. The angular spectrum is compressed and reversed as a result of the interaction of the optical telescope 3002. In that manner, the wavelength-angle spectrum emerging from the thin-film filter can be made to closely match the wavelength-angle spectrum required by the beam combining condition for proper beam combination. However, as a result of the thin-film filter not being optimized for the beam combining element, FIG. 36 demonstrates components of the wavelength-angle spectrum emerging from the telescope that do not match the wavelength-angle spectrum required by the beam combining condition. The non-matching components will not diffract in the same light cone after the grating and will lead to parasitic divergence steepening (as can be seen from the curve corresponding to the angular spectrum centered about 20° in FIG. 35).

FIG. 36 further demonstrates that the optical telescope 3002 can provide a linear transformation of the angular components of a wavelength-angle relationship determined by a thin-film filter element thereby allowing the angular spectrum of the wavelength-angle relationship defined by the thin-film filter to be matched to the angular spectrum required by the beam combining condition determined by the beam combining element 3003. Therefore, the optical telescope 3002 allows the values of $$\frac{d}{d\theta}\frac{d\theta}{d\lambda}$$

of the wavelength-angle relationship that defines the wavelength-angle pairs allowed by the thin-film filter to be matched to the values of $$\frac{d}{d\theta}\frac{d\theta}{d\lambda}$$

of the wavelength-angle relationship defined by the wavelength-angle pairs required by the beam combining condition where the values of $$\frac{d}{d\theta}\frac{d\theta}{d\lambda}$$

of the thin-film filter wavelength-angle relationship are determined after a transformation of the angular spectrum produced by the optical telescope. In other words, the optical telescope enables an angular spectrum transformation of the thin-film filter wavelength-angle relationship to be considered for matching of wavelength-angle relationship nonlinearities.

In summary, the emerging wavelength spectrum deriving from such a cavity might exhibit a nonlinear wavelength-to angle relationship with does not match the beam combining requirements of the subsequent dispersive element. Depending on the dispersion and the spectral bandwidth, the dispersive element itself also might have a nonlinear wavelength-to-angle pairing. Both the wavelength-stabilized cavity and the dispersive element might show different linear and nonlinear angle-to-wavelength relationships. Proper beam combination requires the adjustment of both be means of any kind of transformation. The simplest transformation to manipulate the angle-to-wavelength relationship is to magnify or reduce the emerging angle spectrum leaving the thin-film filter. This allows for adjusting the linear mismatch in wavelength-to-angle relationship between the cavity and the grating. However, one is left with matching the nonlinear terms. One way to manage this task is to lower the dispersion of the grating to obtain less nonlinearity. The drawback of such approach would be a reduced resolution and less dense spectral stacking of the individual beams. Another approach operates the thin-film filter at an angle where it exhibits residual angle-to-wavelength nonlinearity which exactly cancels out the nonlinearity of a highly dispersive element. As the thin-film filter cross-couples linear and nonlinear terms in the wavelength-to-angle relationship, one needs to balance the amount of nonlinear adjustment by readjusting the optical magnification of the telescope in between the filter and the dispersive element.

It will be appreciated that the foregoing descriptions of wavelength-stabilizing external resonators and output coupling systems are merely examples of the inventive principles, and that these illustrate only preferred techniques. It is contemplated that other implementations of the invention may differ in detail from foregoing examples. All references to the invention are intended to reference the particular example of the invention being discussed at that point and are not intended to imply any limitation as to the scope of the invention more generally. All language of distinction and disparagement with respect to certain features is intended to indicate a lack of preference for those features, but not to exclude such from the scope of the invention entirely unless otherwise indicated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A beam wavelength stabilizing system comprising:
    a laser source having a plurality of emitters that each emit a laser beam;
    a reflective element;
    a wavelength filtering element disposed between the laser source and the reflective element; and
    a position-to angle transformation optic disposed between the laser source and the wavelength filtering element;
    wherein each laser beam emitted by the plurality of emitters has a single wavelength,
    wherein the position-to-angle transformation optic imparts, on each laser beam emitted by the plurality of emitters, a position-dependent angle of incidence with respect to the wavelength filtering element,
    wherein the wavelength filtering element is configured to selectively transmit, towards the reflective element, only optical power corresponding to certain wavelength-angle of incidence pairs, and
    wherein the reflective element reflects a portion of the optical power selectively transmitted by the wavelength filtering element back at the wavelength filtering element such that the portion of the optical power selectively transmitted by the wavelength filtering element interacts with the wavelength filtering element and is directed into the laser source as feedback.

2. The beam wavelength stabilization system of claim 1, wherein the wavelength filtering element is a thin-film filtering element.

3. The beam wavelength stabilization system of claim 2, wherein the thin-film filtering element is a thin-film etalon.

4. The beam wavelength stabilization system of claim 3, wherein a thickness of the thin-film etalon is less than four times the wavelength corresponding to the shortest single wavelength emitted by the laser source.

5. The beam wavelength stabilization system of claim 3, wherein the thin-film etalon comprises two parallel, reflective surfaces with reflectivity greater than or equal to 0.99.

6. The beam wavelength stabilization system of claim 3, wherein the thin-film etalon comprises two reflective surfaces, the two surfaces having different values of reflectivity.

7. The beam wavelength stabilization system of claim 3, wherein the thin-film etalon reflects a portion of the optical power corresponding to a wavelength at which the thin-film etalon is partially transmissive.

8. The beam wavelength stabilization system of claim 3, further comprising:

a partially reflective surface positioned on the surface of the thin-film etalon.

9. The beam wavelength stabilization system of claim 3 further comprising:
a first high reflective element; and
a second position-to-angle transformation optic disposed between the thin-film etalon and the first high reflective element;
wherein the thin-film etalon transmits a portion of the optical power emitted by the laser source as a first feedback branch input and directs the first feedback branch input at the first high reflective element; and
wherein the second position-to-angle transformation optic collimates a plurality of component beams of the first feedback branch input.

10. The beam wavelength stabilization system of claim 3, further comprising:
a second high reflective element; and
a position-to-angle transformation optic disposed between the thin-film etalon and the second high reflective element.

11. The beam wavelength stabilization system of claim 10, wherein the thin-film notch filter reflects a portion of the optical power corresponding to a wavelength at which the thin-film notch filter is partially transmissive.

12. The beam wavelength stabilization system of claim 2, wherein the thin-film filtering element is a thin-film notch filter.

13. The beam wavelength stabilization system of claim 12, further comprising:
a first high reflective element
a second position-to-angle transformation optic disposed between the thin-film notch filter and the first high reflective element;
a second high reflective element; and
a third position-to-angle transformation optic disposed between the thin-film notch filter and the second high reflective element;
wherein the thin-film notch filter reflects a portion of the optical power emitted by the laser source as a first feedback branch input and directs the first feedback branch input at the first high reflective element; and
wherein the second position-to-angle transformation optic collimates a plurality of component beams of the first feedback branch input.

14. The beam combining system of claim 1, wherein the thin-film filtering element comprises multiple pairs of reflective surfaces separated by a thickness.

15. A method for stabilizing the wavelengths of each of a plurality of beams, each beam emitted by a single emitter of a laser source comprising a plurality of emitters, the method comprising:
directing each of the plurality of beams at a reflective element through a position-to-angle transformation optic and a wavelength filtering element;
imparting, by the position-to-angle transformation optic on each of the plurality of beams, a position-dependent angle of incidence with respect to the wavelength filtering element;
selectively transmitting, by the wavelength filtering element, only optical power corresponding to certain wavelength-angle of incidence pairs; and
reflecting, by the reflective element, a portion of the optical power selectively transmitted by the wavelength filtering element back at the wavelength filtering element as a feedback component such that the feedback component interacts with the wavelength filtering element and is directed into the laser source as feedback.

16. A method for producing a combined output beam formed of components of a plurality of emitted beams, each emitted beam emitted by a single emitter in a laser source having a plurality of beam emitters, the method comprising:
directing each of the plurality of beams at a reflective element through a position-to-angle transformation optic and a wavelength filtering element;
imparting, by the position-to-angle transformation optic on each of the plurality of beams, a position-dependent angle of incidence with respect to the wavelength filtering element;
selectively transmitting, by the wavelength filtering element, only optical power corresponding to certain wavelength-angle of incidence pairs; and
reflecting, by the reflective element, a portion of the optical power selectively transmitted by the wavelength filtering element back at the wavelength filtering element as a feedback component such that the feedback component interacts with the wavelength filtering element and is directed into the laser source as feedback; and
directing, as an output component, a portion of the optical power of each of the plurality of emitted beams at a beam combining element arranged outside a wavelength stabilization system.

* * * * *